(12) United States Patent
Nakayamada et al.

(10) Patent No.: US 8,178,856 B2
(45) Date of Patent: May 15, 2012

(54) CHARGED PARTICLE BEAM WRITING APPARATUS AND METHOD THEREOF

(75) Inventors: Noriaki Nakayamada, Kanagawa (JP); Seiji Wake, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 93 days.

(21) Appl. No.: 12/843,367

(22) Filed: Jul. 26, 2010

(65) Prior Publication Data

US 2011/0031387 A1 Feb. 10, 2011

(30) Foreign Application Priority Data

Aug. 7, 2009 (JP) ................... 2009-184124

(51) Int. Cl.
*H01J 37/00* (2006.01)
*H01J 37/304* (2006.01)
*H01J 3/14* (2006.01)
*G21K 5/10* (2006.01)

(52) U.S. Cl. ............. 250/492.22; 250/492.2; 250/492.3; 250/491.1; 250/396 R; 250/252.1

(58) Field of Classification Search ............. 250/492.22, 250/492.2, 492.3, 491.1, 396 R, 252.1
See application file for complete search history.

(56) References Cited

U.S. PATENT DOCUMENTS

| | | | |
|---|---|---|---|
| 6,630,681 B1 * | 10/2003 | Kojima | 250/492.22 |
| 7,087,910 B2 | 8/2006 | Schneider et al. | |
| 7,476,879 B2 | 1/2009 | Lozes et al. | |
| 7,652,271 B2 * | 1/2010 | Wake et al. | 250/492.22 |
| 7,705,327 B2 * | 4/2010 | Horiuchi et al. | 250/492.2 |
| 2009/0242787 A1 * | 10/2009 | Nakayamada et al. | 250/396 R |

FOREIGN PATENT DOCUMENTS

| | | |
|---|---|---|
| JP | 2007-324175 | 12/2007 |
| JP | 2009-260250 | 11/2009 |

OTHER PUBLICATIONS

U.S. Appl. No. 13/235,432, filed Sep. 18, 2011, Nakayamada, et al.
M. Bai et al., "Charging and discharging of electron beam resist films", J. Vac. Sci. Technol. B 17(6), Nov./Dec. 1999, 4 pages.

* cited by examiner

*Primary Examiner* — Nikita Wells
(74) *Attorney, Agent, or Firm* — Oblon, Spivak, McClelland, Maier & Neustadt, L.L.P.

(57) ABSTRACT

A charged particle beam writing apparatus includes a charge amount distribution calculation unit configured to calculate a charge amount distribution which is charged by irradiation of a charged particle beam onto a writing region of a target workpiece, by using a charge decay amount and a charge decay time constant both of which depend on a pattern area density, a position displacement amount distribution calculation unit configured to calculate a position displacement amount of each writing position due to charge amounts of the charge amount distribution by performing convolution of each charge amount of the charge amount distribution with a response function, and a writing unit configured to write a pattern on the each writing position where the position displacement amount has been corrected, using a charged particle beam.

10 Claims, 54 Drawing Sheets

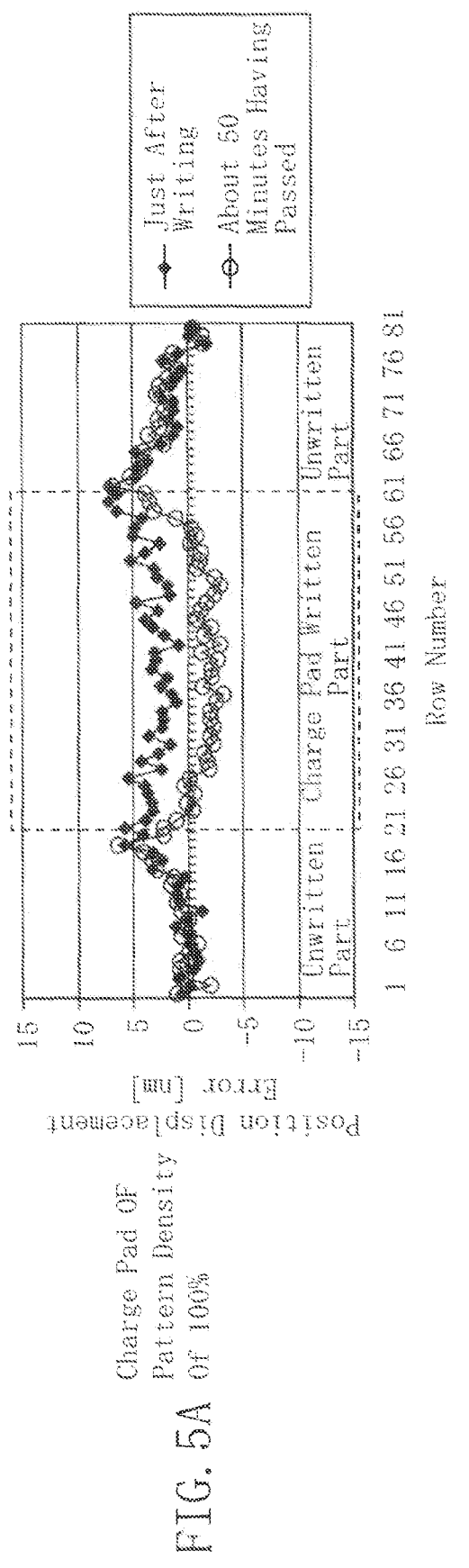
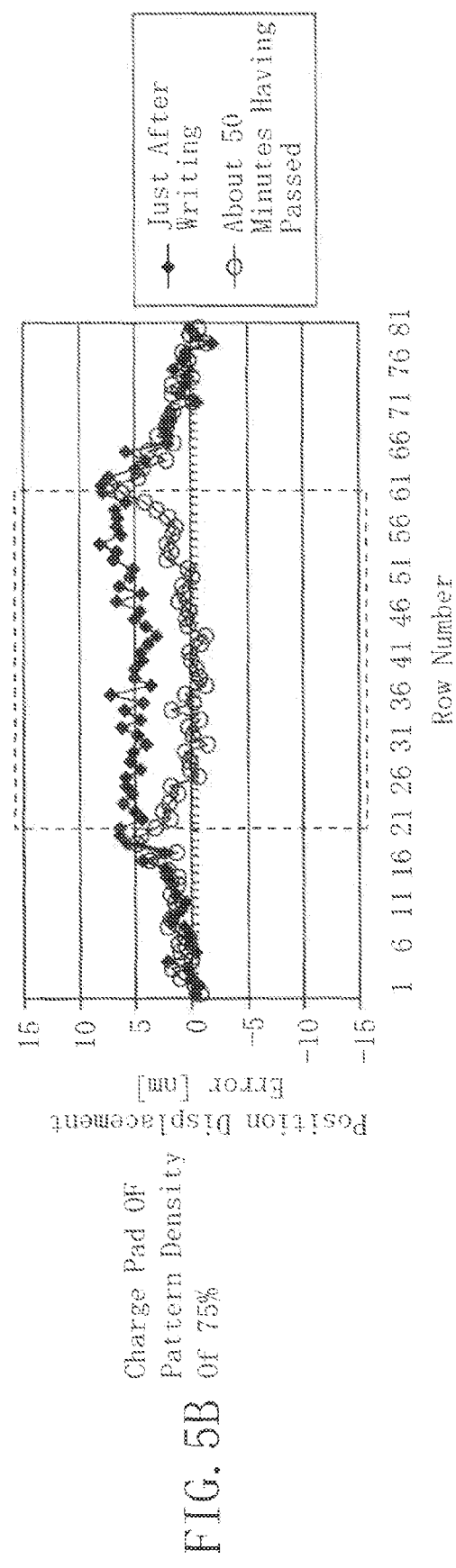

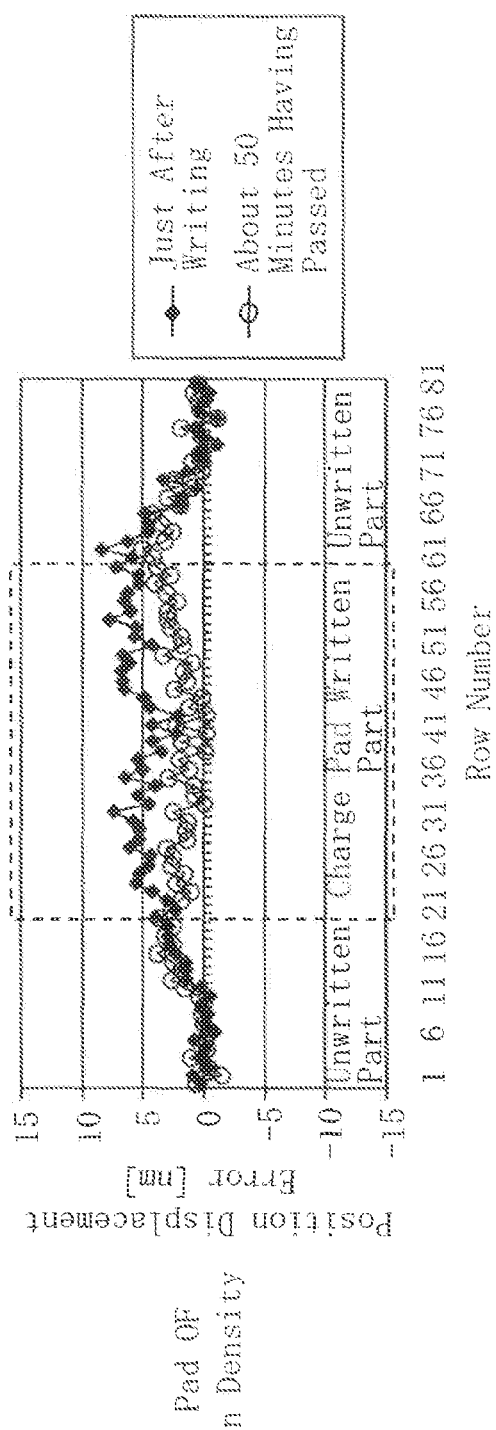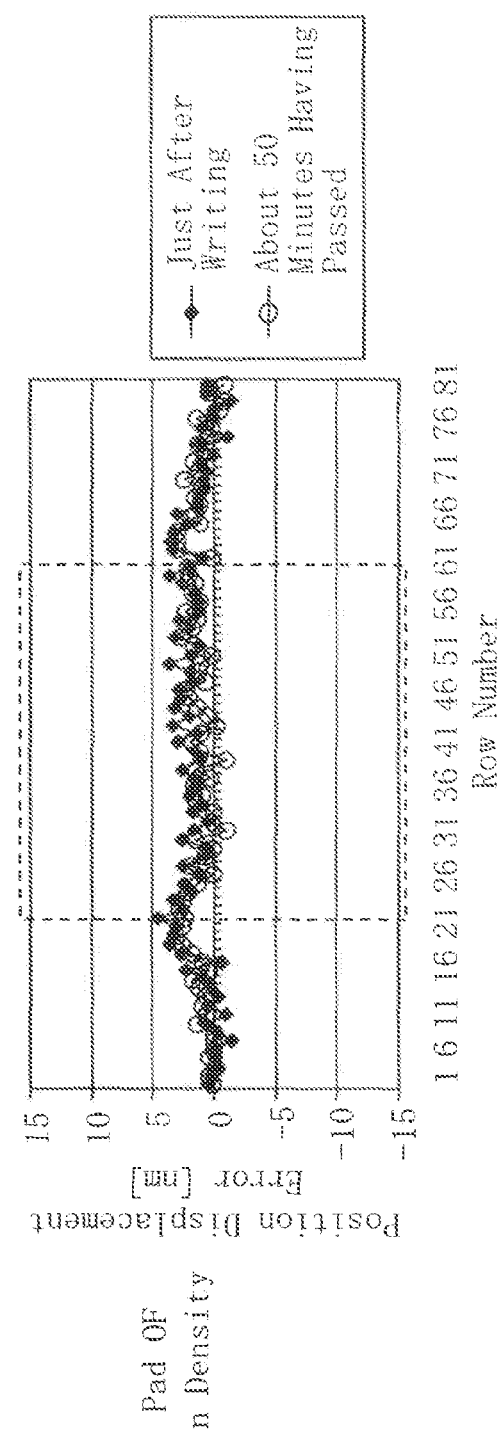

Without Correcting Charge Position Displacement

10nm

With Correcting Charge Position Displacement
/Without Considering Charge Time Decay 10nm With Correcting Charge Position Displacement
/With Considering Charge Time Decay 10nm

| Position Displacement Amount 3 σ [nm] | X | Y |
|---|---|---|
| Without Correcting Charge Position Displacement | 4.5 | 9.7 |
| With Correcting Charge Position Displacement/Without Considering Charge Time Decay | 4.4 | 7.1 |
| With Correcting Charge Position Displacement/With Considering Charge Time Decay | 4.5 | 5.2 |

63A

63B

63C

63D

| Patter Density | $C_0$ | $C_1$ | $\sigma$ [mm] |
|---|---|---|---|
| 25% | $-1.24 \times 10^{-3}$ | $-1.372 \times 10^{-4}$ | 6 |
| 50% | $-1.35 \times 10^{-3}$ | $-2.116 \times 10^{-4}$ | 6 |
| 75% | $-1.27 \times 10^{-3}$ | $-2.472 \times 10^{-4}$ | 7 |
| 100% | $-1.81 \times 10^{-3}$ | $-3.154 \times 10^{-3}$ | 8 |

FIG. 50A

| Patter Density | $C_0$ | $C_1$ | $\sigma$ [mm] |
|---|---|---|---|
| 25% | $-7.16 \times 10^{-4}$ | $-9.41 \times 10^{-5}$ | 7 |
| 50% | $-1.28 \times 10^{-3}$ | $-1.64 \times 10^{-4}$ | 7 |
| 75% | $-1.58 \times 10^{-3}$ | $-2.40 \times 10^{-4}$ | 9 |
| 100% | $-1.66 \times 10^{-3}$ | $-2.44 \times 10^{-4}$ | 9 |

FIG. 50B

| Patter Density | $C_0$ | $C_1$ | $\sigma$ [mm] |
|---|---|---|---|
| 25% | $-6.36 \times 10^{-3}$ | $-1.07 \times 10^{-4}$ | 5 |
| 50% | $-2.03 \times 10^{-3}$ | $-1.83 \times 10^{-4}$ | 6 |
| 75% | $-2.70 \times 10^{-3}$ | $-2.57 \times 10^{-4}$ | 7 |
| 100% | $-2.84 \times 10^{-3}$ | $-3.07 \times 10^{-4}$ | 7 |

FIG. 50C

| Patter Density | $c_0$ | $c_1$ | $\sigma$ [mm] |
|---|---|---|---|
| 25% | $-1.96 \times 10^{-4}$ | $-9.52 \times 10^{-5}$ | 7 |
| 50% | $-3.06 \times 10^{-4}$ | $-1.65 \times 10^{-4}$ | 7 |
| 75% | $-8.09 \times 10^{-4}$ | $-2.31 \times 10^{-4}$ | 8 |
| 100% | $-6.56 \times 10^{-4}$ | $-2.45 \times 10^{-4}$ | 9 |

FIG. 51A

| Patter Density | $c_0$ | $c_1$ | $\sigma$ [mm] |
|---|---|---|---|
| 25% | $-4.26 \times 10^{-4}$ | $-1.090 \times 10^{-4}$ | 5 |
| 50% | $-2.65 \times 10^{-4}$ | $-1.838 \times 10^{-4}$ | 6 |
| 75% | $-1.05 \times 10^{-4}$ | $-2.544 \times 10^{-4}$ | 6 |
| 100% | $-6.25 \times 10^{-5}$ | $-3.038 \times 10^{-4}$ | 7 |

FIG. 51B

| Parameter | Fixed Dose D | | | | Variable Dose D |
| --- | --- | --- | --- | --- | --- |
| | Resist A | Resist B | Resist C | Resist D | Resist A |
| $d_0$ | 0.580 | 0.013 | -0.024 | -0.729 | -0.079 |
| $d_1$ | -0.864 | 0 | 0 | 0 | 0 |
| $d_2$ | -0.128 | 0 | 0 | 0 | 0 |
| $d_3$ | -0.016 | -0.00363 | -0.00731 | -0.165 | -0.079 |
| $e_1$ | 0 | -0.477 | -0.263 | 0 | 0 |
| $e_2$ | 0 | $8.69 \times 10^{-2}$ | $2.93 \times 10^{-2}$ | 0 | 0 |
| $e_3$ | 0 | $-5.36 \times 10^{-3}$ | $-1.36 \times 10^{-3}$ | 0 | 0 |
| $f_1$ | -0.642 | -0.450 | -0.452 | -0.579 | -0.259 |
| $f_2$ | $5.78 \times 10^{-2}$ | $1.70 \times 10^{-2}$ | $1.11 \times 10^{-2}$ | $8.70 \times 10^{-2}$ | -0.103 |
| $f_3$ | $-2.66 \times 10^{-3}$ | $2.95 \times 10^{-4}$ | $3.07 \times 10^{-4}$ | $-1.11 \times 10^{-2}$ | $-5.14 \times 10^{-3}$ |
| $\sigma$ [nm] | 13 | 16 | 13 | 10 | 8 |

FIG. 55

CHARGED PARTICLE BEAM WRITING APPARATUS AND METHOD THEREOF

CROSS-REFERENCE TO RELATED APPLICATION

This application is based upon and claims the benefit of priority from the prior Japanese Patent Application No. 2009-184124 filed on Aug. 7, 2009 in Japan, the entire contents of which are incorporated herein by reference.

BACKGROUND OF THE INVENTION

1. Field of the Invention

The present invention relates to a charged particle beam writing apparatus and a charged particle beam writing method. For example, it relates to an electron beam writing apparatus for writing a pattern onto a target workpiece by using a variable shaped electron beam, and to a method thereof.

2. Description of Related Art

The microlithography technique which advances microminiaturization of semiconductor devices is extremely important as being the unique process whereby patterns are formed in the semiconductor manufacturing. In recent years, with the high integration of LSI, the line width (critical dimension) required for semiconductor device circuits is decreasing year by year. Then, in order to form a desired circuit pattern on such semiconductor devices, a master or "original" pattern (also called a mask or a reticle) of high precision is needed. The electron beam writing technique intrinsically having excellent resolution is used for producing such a highly precise master pattern.

FIG. 58 is a schematic diagram for explaining operations of a conventional variable-shaped electron beam (EB) writing apparatus. As shown in the figure, the variable-shaped electron beam writing apparatus operates as follows: A first aperture plate 410 has a quadrangular such as rectangular opening 411 for shaping an electron beam 330. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. x direction) during writing or "drawing". In other words, a rectangle shaped as a result of passing through both the opening 411 and the variable-shaped opening 421 is written in the writing region of the target workpiece 340 on the stage. This method of forming a given shape by letting beams pass through both the opening 411 of the first aperture plate 410 and the variable-shaped opening 421 of the second aperture plate 420 is referred to as a VSB (Variable Shaped Beam) method.

When a target workpiece, such as a mask, to which a resist film is applied, is irradiated by an electron beam, the irradiated position and its periphery may have been charged with the electron beam previously irradiated. The position displacement caused by this charging phenomenon has not been conventionally regarded as a problem in the variable-shaped type electron beam pattern writing apparatus. However, with the pattern miniaturization as mentioned above, such position displacement due to the charging phenomenon has become a problem. In particular, improvement of the pattern position accuracy of photomasks is required more than ever because of introducing a double patterning technique.

Conventionally, as a method for correcting a position displacement of the position irradiated by the beam, there has been known to form a charge dissipation layer (CDL) on a resist layer in order to prevent charging of the resist surface. However, since the charge dissipation layer basically has acid property, it has a poor affinity for a chemically amplified resist. Further, there is a need to provide new equipment in order to form the charge dissipation layer, thereby increasing the manufacturing cost of a photomask. For this reason, it is desired to perform charging effect correction (CEC) without using the charge dissipation layer.

With regard to a position displacement correction amount caused by charging, there is proposed a writing apparatus which calculates a correction amount of position displacement of a beam irradiation position, based on an electric field strength and applies a beam based on the correction amount (refer to, e.g., Japanese Patent Application Laid-open (JP-A) No. 2007-324175). According to such a writing apparatus, a position displacement amount distribution is calculated from an irradiation amount (exposure) distribution through a linear response function assuming that there exists a linearly proportional relationship between the irradiation amount distribution and a charge amount distribution.

With regard to irradiation position displacement due to the charging phenomenon, it has been found according to the examination carried out by the inventors that there exist position displacement caused by charge which does not change temporally and position displacement caused by charge which decays as time passes. Particularly, when focusing on the latter position displacement resulting from charge which decays with time, a problem inevitably arises in that a processing time equivalent to the decay time is required for the writing operation itself for measuring the charge amount temporal decay as an essential restriction when estimating the charge amount on the resist surface in the pattern writing. Under such a restriction, there are needed a method of measuring the temporal decay more simply and quantifying it and a method of correcting position displacement with using the quantification result. However, conventionally, the method of correcting position displacement resulting from electric charge decay has not been sufficiently established.

BRIEF SUMMARY OF THE INVENTION

The present invention includes an apparatus and method for correcting position displacement of an irradiated position due to charge decay.

In accordance with one aspect of the present invention, a charged particle beam writing apparatus includes a charge amount distribution calculation unit configured to calculate a charge amount distribution which is charged by irradiation of a charged particle beam onto a writing region of a target workpiece, by using a charge decay amount and a charge decay time constant both of which depend on a pattern area density; a position displacement amount distribution calculation unit configured to calculate a position displacement amount of each writing position due to charge amounts of the charge amount distribution by performing convolution of each charge amount of the charge amount distribution with a response function; and a writing unit configured to write a pattern on the each writing position where the position displacement amount has been corrected, using a charged particle beam.

In accordance with another aspect of the present invention, a charged particle beam writing apparatus includes a fogging electron amount distribution calculation unit configured to calculate a fogging electron amount distribution generated by applying a charged particle beam onto a writing region of a target workpiece having an irradiated region which is irradiated by the charged particle beam and a non-irradiated region which is not irradiated by the charged particle beam; a charge amount distribution calculation unit configured to calculate a sum by adding, in the irradiated region, a first charge amount distribution based on a fogging electron amount distribution, a pattern density distribution, a dose distribution, and an irradiation amount distribution, to a second charge amount distribution resulting from a charge decay, and calculate a union of sets of the sum and a third charge amount distribution based on a fogging electron amount distribution in the non-irradiated region, so as to obtain a fourth charge amount distribution; a position displacement amount distribution calculation unit configured to calculate a position displacement amount of each writing position due to charge amounts the fourth charge amount distribution, by performing convolution of each charge amount of the fourth charge amount distribution with a response function; and a writing unit configured to write a pattern on the each writing position where the position displacement amount has been corrected, by using the charged particle beam.

Furthermore, in accordance with another aspect of the present invention, a charged particle beam writing method includes calculating a charge amount distribution which is charged by irradiation of a charged particle beam onto a writing region of a target workpiece, by using a charge decay amount and a charge decay time constant both of which depend on a pattern area density; calculating a position displacement amount of each writing position due to charge amounts of the charge amount distribution, by performing convolution of each charge amount of the charge amount distribution with a response function; and writing a pattern on the each writing position where the position displacement amount has been corrected, using a charged particle beam.

BRIEF DESCRIPTION OF THE DRAWINGS

FIGS. 5A and 5B are graphs showing writing results in the case of pattern area densities of 100% and 75% in the charge patterns according to Embodiment 1;

FIGS. 6A and 6B are graphs showing writing results in the case of pattern area densities of 50% and 25% in the charge patterns according to Embodiment 1;

FIG. 50A shows an optimal combination of parameters $c_0$, $c_1$, and $\sigma$ with respect to the resist A;

FIG. 50B shows an optimal combination of parameters $c_0$, $c_1$, and $\sigma$ with respect to the resist B;

FIG. 50C shows an optimal combination of parameters $c_0$, $c_1$, and $\sigma$ with respect to the resist C;

FIG. 51A shows a combination of parameters $C_0$, $C_1$, and $\sigma$ obtained by using a corrected model with respect to the resist B;

FIG. 51B shows a combination of parameters $C_0$, $C_1$, and $\sigma$ obtained by using a corrected model with respect to the resist C;

FIG. 55 shows an optimal combination of parameters $d_0$, $d_1$, $d_2$, $d_3$, $e_1$, $e_2$, $e_3$, $f_1$, $f_2$, $f_3$, and $\sigma$;

DETAILED DESCRIPTION OF THE INVENTION

In the following Embodiments, there is described a structure using an electron beam as an example of a charged particle beam. However, the charged particle beam is not limited to the electron beam. Other charged particle beam, such as an ion beam, may also be used.

Embodiment 1

Figure 1:
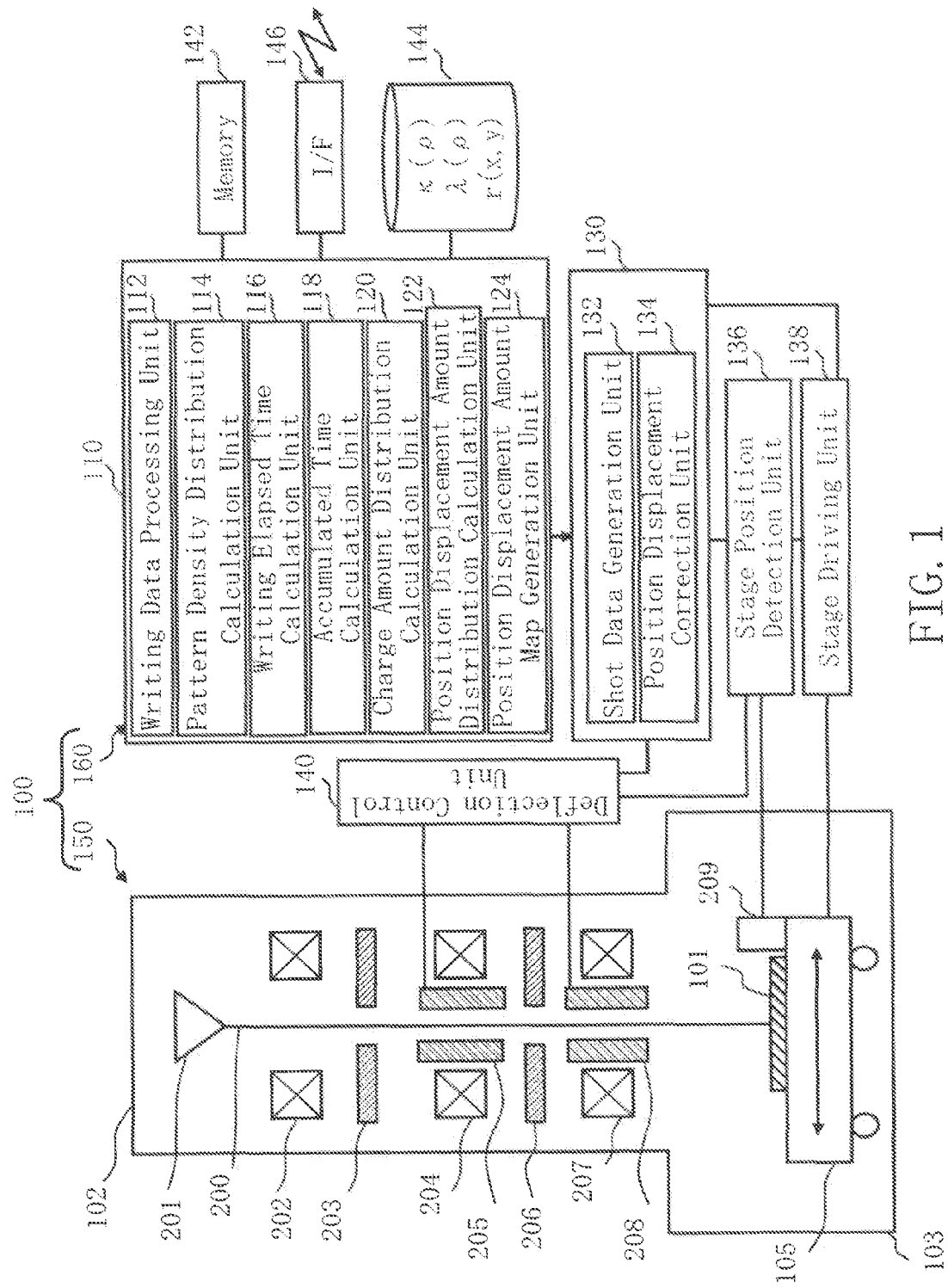
FIG. 1 is a schematic diagram showing an example of the main structure of a writing apparatus according to Embodiment 1.

FIG. 1 is a schematic diagram showing an example of the main structure of a writing apparatus according to Embodiment 1. In FIG. 1, a writing apparatus 100 includes a writing unit 150 and a control unit 160. The writing apparatus 100 is an example of a charged particle beam writing apparatus. The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is arranged an XY stage 105, on which a target workpiece 101 serving as a writing object is placed. The target workpiece 101 is, for example, a photomask used for exposure in semiconductor manufacturing and a wafer for forming a semiconductor device. The photomask may be a mask blank where no patterns are formed. It should be understood that a resist film being photosensitive to an electron beam has been formed on the target workpiece when patterns are written. On the XY stage 105, a mirror 209 for measuring a stage position is placed at a different position from the position where the target workpiece 101 is arranged.

The control unit 160 includes control computers 110 and 130, a stage position detection unit 136, a stage driving unit 138, a deflection control circuit 140, a memory 142, a storage device 144 such as a magnetic disk device, and an external interface (I/F) circuit 146. The control computers 110 and 130, the stage position detection unit 136, the stage driving unit 138, the deflection control circuit 140, the memory 142, the storage device 144 such as a magnetic disk device, and the external I/F circuit 146 are connected with each other by a bus (not shown). The deflection control circuit 140 is connected to deflectors 205 and 208.

In the control computer 110, there are provided functions, such as a writing data processing unit 112, a pattern area density distribution calculation unit 114, a writing elapsed time calculation unit 116, an accumulated time calculation unit 118, a charge amount distribution calculation unit 120, a position displacement amount distribution calculation unit 122, and a position displacement amount map generation unit 124. They may be configured by hardware such as an electric circuit. Alternatively, processing contents of each function of them may be configured by a program (software) implementable by a computer. Alternatively, they may be configured by a combination of hardware and software, or a combination of hardware and firmware. Data to be input into the control computer 110 or data being processed or having been processed is stored in the memory 142 each time.

In the control computer 130, there are provided functions, such as a shot data generation unit 132 and a position displacement correction unit 134. They may be configured by hardware such as an electric circuit. Alternatively, processing contents of each function of them may be configured by a program (software) implementable by a computer. Alternatively, they may be configured by a combination of hardware and software, or a combination of hardware and firmware.

While only the structure elements necessary for explaining Embodiment 1 are shown in FIG. 1, it should be understood that other structure elements generally necessary for the writing apparatus 100 may also be included.

An electron beam 200 emitted from the electron gun assembly 201 irradiates the entire first aperture plate 203 having a quadrangular, such as a rectangular opening, by the illumination lens 202. At this point, the electron beam 200 is shaped to be a quadrangle such as a rectangle. Then, after having passed through the first aperture plate 203, the electron beam 200 of a first aperture image is projected onto the second aperture plate 206 by the projection lens 204. The position of the first aperture image on the second aperture plate 206 is deflection-controlled by the deflector 205 which is controlled by the deflection control circuit 140, so as to change the shape and size of the beam. After having passed through the second aperture plate 206, the electron beam 200 of a second aperture image is focused by the objective lens 207 and deflected by the deflector 208 which is, for example, an electrostatic type deflector controlled by the deflection control circuit 140, and reaches a desired position on the target workpiece 101 on the XY stage 105 movably arranged. The driving of the XY stage 105 is controlled by the stage driving unit 138. The position of the XY stage 105 is detected by the stage position detection unit 136. The stage position detection unit 136 includes, for example, a laser measuring device which applies a laser to the mirror 209 and measures a position based on a reflected light.

Figure 2:
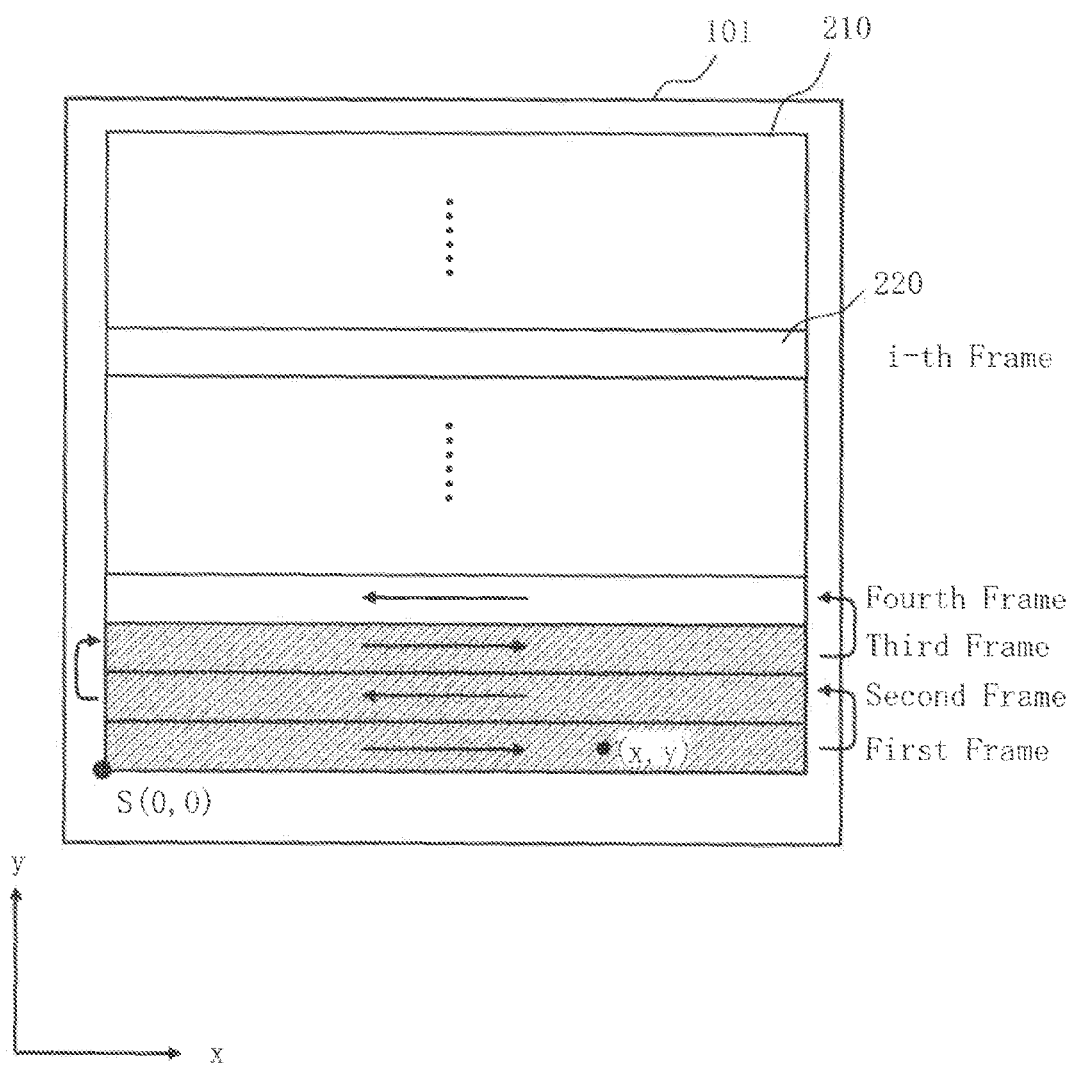
FIG. 2 illustrates a state of a stage movement described in Embodiment 1.

FIG. 2 illustrates a state of a stage movement described in Embodiment 1. When writing on the target workpiece 101, the electron beam 200 irradiates one stripe region of the target workpiece 101, which is made by virtually dividing the writing (exposure) surface into a plurality of deflectable strip-like stripes, while the XY stage 105 is continuously moving in the x direction, for example. The movement of the XY stage 105 in the X direction is a continuous movement, for example, and simultaneously, the shot position of the electron beam 200 is made to follow the movement of the stage. Writing time can be shortened by performing the continuous movement. After writing one stripe region, the XY stage 105 is moved in the Y direction by a step feed. Then, the writing operation of the next stripe region is performed in the X direction (reverse direction). By performing the writing operation of each stripe region in a zigzag manner, the movement time of the XY stage 105 can be shortened. Moreover, in the pattern writing apparatus 100, when processing layout data (writing data), a writing region 210 is virtually divided into a plurality of strip-like frame regions 220, and data processing is performed for each frame region 220. For example, when not performing multiple exposure, the frame region 220 and the stripe region mentioned above are usually the same region. When performing multiple exposure, the frame region 220 and the stripe region become displaced from each other according to multiplicity. Alternatively, the writing region 210 is virtually divided into a plurality of frame regions 220 which are the same regions as the stripe regions according to the multiplicity, and data processing is performed for each frame region 220. Thus, the writing region 210 of the target workpiece 101 is virtually divided into frame regions 220 (stripe region) used as a plurality of writing sectional unit regions, and the writing unit 150 writes each frame region 220 (stripe region).

Figure 3:
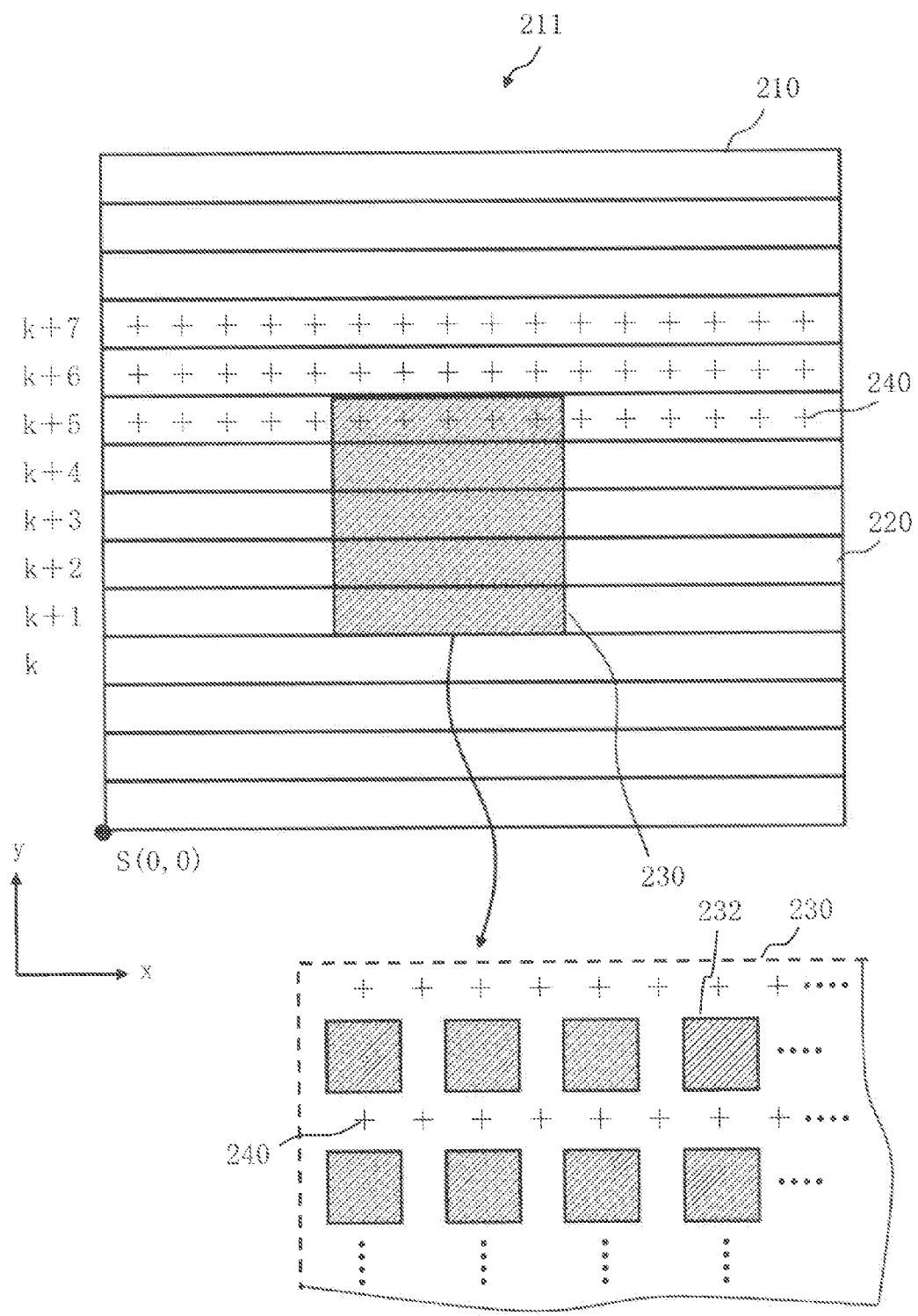
FIG. 3 shows an example of an evaluation pattern which is first written for measuring position displacement due to charge decay according to Embodiment 1.

FIG. 3 shows an example of an evaluation pattern which is first written for measuring position displacement due to charge decay according to Embodiment 1.

Figure 4:
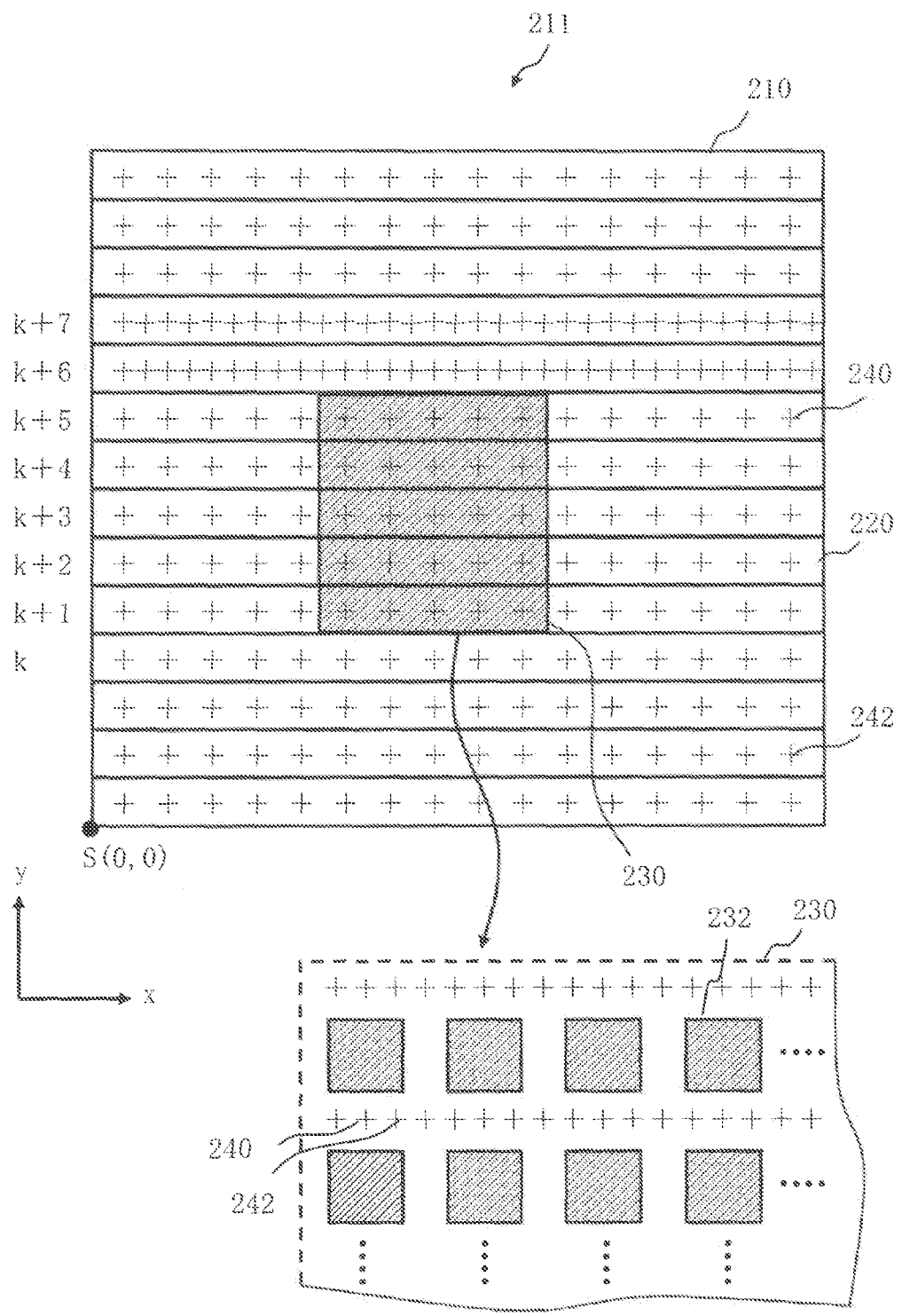
FIG. 4 shows an example of a state in which a measurement pattern is written after a predetermined time period having passed since the evaluation pattern of FIG. 3 was formed.

FIG. 4 shows an example of a state in which a measurement pattern is written after a predetermined time period having passed since the evaluation pattern of FIG. 3 was formed.

In FIG. 3, the evaluation pattern 211 includes a charge pattern 230 (or called a charge pad) which extends over two or more frame regions 220 in the plurality of frame regions 220. In the example of FIG. 3, the charge pattern 230, whose irradiation area of the electron beam 200 is sufficiently larger than that of the measurement pattern 240, is written at the central part of the writing region 210 of the target workpiece 101, on the evaluation substrate applied with resist. The charge pattern 230 is formed of a plurality of quadrangular patterns 232 which are almost equally arranged. For example, a plurality of quadrangular patterns 232 each being 980 μm square are almost equally arranged with a predetermined space therebetween. When forming the charge pattern 230 of 100% pattern area density, for example, a plurality of quadrangular patterns 232 each being 980 μm square are almost equally arranged with a 20 μm space therebetween, for example. By making the arrangement number variable, the charge pattern 230 of a desired pattern area density can be written. What is necessary for the measurement pattern 240 is to just be a pattern whose position can be measured. For example, a cross pattern is preferable. For example, it may be structured by a pattern of about 1 μm width. Then, a plurality of measurement patterns 240 are arranged in an array.

In writing the evaluation pattern 211, the charge pattern 230 and the measurement pattern 240 are merged, and then to be written as one writing data by the writing unit 150. That is, the writing operation is started from the writing starting position S(0,0) (layout head or head frame) of the writing region 210. Writing is performed for each frame region 220 (stripe region), and advances in the y direction sequentially from the first frame. In the example of FIG. 3, since no pattern exists up to the position where the charge pattern 230 is arranged, writing is started sequentially from the (k+1)th frame region 220 where the charge pattern 230 is arranged. In this case, for example, the measurement patterns 240 are also written in the several frame regions after the (k+5)th frame region 220 which is the last frame region where the charge pattern 230 is arranged, for example. A large number of measurement patterns 240 are equally arranged so that each position in the frame region 220 can be measured. For example, it is preferable to arrange the measurement patterns 240 at several tens or several hundreds of positions in each frame region 220. In the (k+5)th frame region 220 where the charge pattern 230 is arranged, the measurement patterns 240 may just be written at the spaces between the quadrangular patterns 232. Moreover, as the frame region 220 where the measurement patterns 240 are to be written, it is preferable to specify a plurality of frame regions 220 located within the region of charge influence of the charge pattern 230 which causes position displacement. It is assumed that the influence of such charging (the range of the electric field) spreads up to about 5 mm in diameter whose center is the irradiation position. Then, as mentioned above, the writing apparatus 100 performs data processing for performing writing each frame virtually divided like a strip. In this data processing, if the width (in the y direction) of each frame is 1 mm, for example, when a certain position in a certain frame region 220 is irradiated by the electron beam 200, the charge influence of the irradiation affects the area in two or three frame regions 220 which are going to be written. With miniaturization of patterns, the smaller the width of each frame becomes, the larger the number of affected frames becomes.

After writing the evaluation pattern 211 of FIG. 3 as described above, a measurement pattern 242 of FIG. 4 will be written. The measurement patterns 242 are arranged in each frame region 220 starting from the first frame region 220. Thus, by writing the array of the measurement patterns 242 in each frame region 220, it is possible to make a sufficient time pass for obtaining a result which shows that temporal charge decay occurs by the time of reaching the frame region 220 where the measurement pattern shown in FIG. 3 is arranged. For example, it passes about 50 minutes by the time the measurement pattern 242 is written in the (k+5)th frame region 220 where the charge pattern 230 of FIG. 4 is lastly arranged. In the (k+1)th to (k+5)th frame regions 220 where the charge pattern 230 is arranged, the measurement patterns 242 may just be written at the spaces between the quadrangular patterns 232, in a manner that they may not overlap with the measurement pattern 240.

Such writing using the evaluation pattern 211 needs to be performed in advance before writing the target workpiece 101 which serves as an actual product. The positions of the measurement patterns 240 and 242 written in the evaluation substrate are measured. Since what is necessary is just to estimate position displacement between the measurement patterns 240 and 242, measurement is performed for the frame region 220 where both of them are written. A similar estimation experiment needs to be conducted for an evaluation pattern including each of a plurality of charge patterns 230 having different pattern area densities.

FIGS. 5A and 5B are graphs showing writing results in the case of pattern area densities of 100% and 75% in the charge patterns according to Embodiment 1.

FIGS. 6A and 6B are graphs showing writing results in the case of pattern area densities of 50% and 25% in the charge patterns according to Embodiment 1.

In FIGS. 5A, and 5B and FIGS. 6A, and 6B, the region where the charge pattern 230 is arranged is specified as an irradiated region (charge pad written part), and the other region is specified as a non-irradiated region (unwritten part). According to the result of 100% of the pattern area density shown in FIG. 5A, the difference between the position displacement amounts (position displacement error) caused by the elapsed time is notably generated in the irradiated region, whereas the difference between the position displacement amounts (position displacement error) is not generated in the non-irradiated region. According to the result of 75% of the pattern area density shown in FIG. 5B, the same tendency as the case of 100% of the pattern area density and the larger difference as strength can be seen. According to the result of 50% of the pattern area density shown in FIG. 6A, the same tendency, though not so large a difference as the case of 75% of the pattern area density, can be obtained. According to the result of 25% of the pattern area density shown in FIG. 6B, no difference is generated between the position displacement amounts (position displacement error) in both the irradiated region and the non-irradiated region. These results show that the difference between the position displacement amounts (position displacement error) caused by the elapsed time becomes smaller as the pattern area density becomes smaller.

Figure 7B:
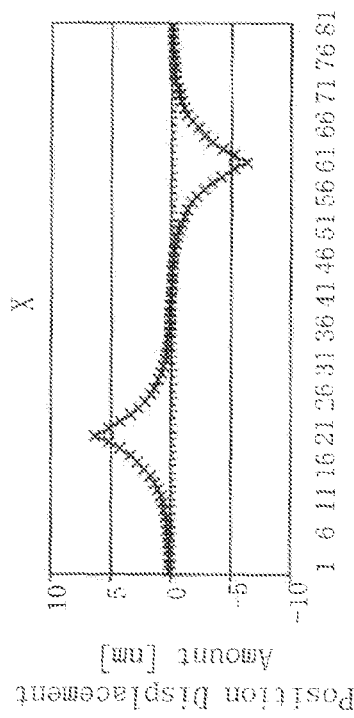
FIGS. 7A to 7D are graphs each showing a difference between the position displacement amounts (position displacement error) caused by elapsed time in the case of pattern area density of 100% of the charge pattern according to Embodiment 1.
Figure 7D:
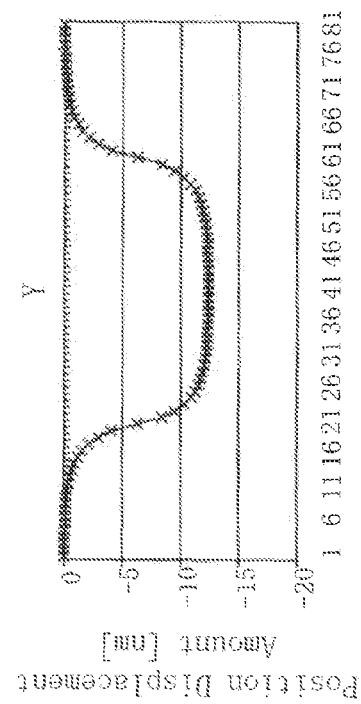
Figure 7A:
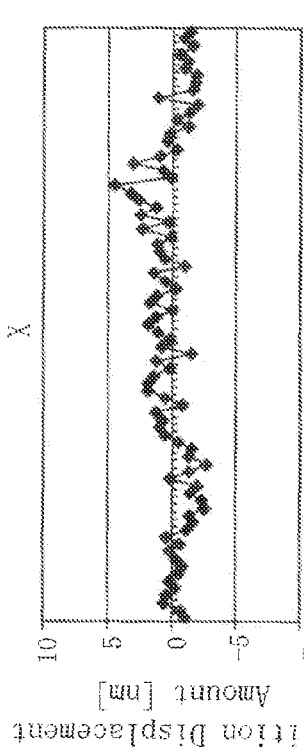
Figure 7C:
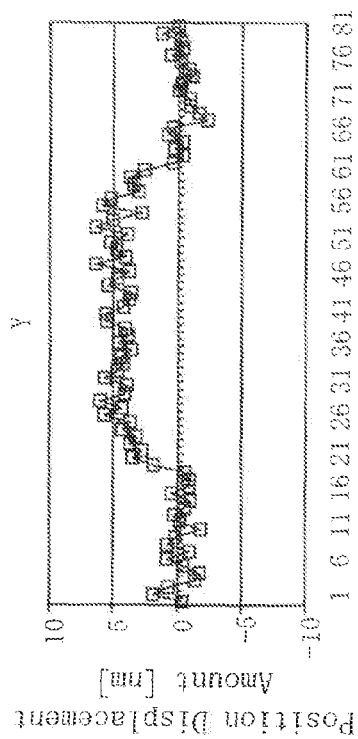

FIGS. 7A to 7D are graphs each showing a difference between the position displacement amounts (position displacement error) caused by elapsed time in the case of pattern area density of 100% of the charge pattern according to Embodiment 1. FIG. 7A shows a difference between position displacement amounts (position displacement error) obtained from the experimental result as to the x direction. FIG. 7B shows a difference, as to the x direction, between position displacement amounts calculated when assuming that a distribution in which +1 $nC/cm^2$ is uniformly charged exists in the irradiated region (charge pad written part). FIG. 7C shows a difference between position displacement amounts (position displacement error) obtained from the experimental result as to the y direction. FIG. 7D shows a difference, as to the y direction, between position displacement amounts calculated when assuming that a distribution in which +1 $nC/cm^2$ is uniformly charged exists in the irradiated region (charge pad written part).

Figure 8:
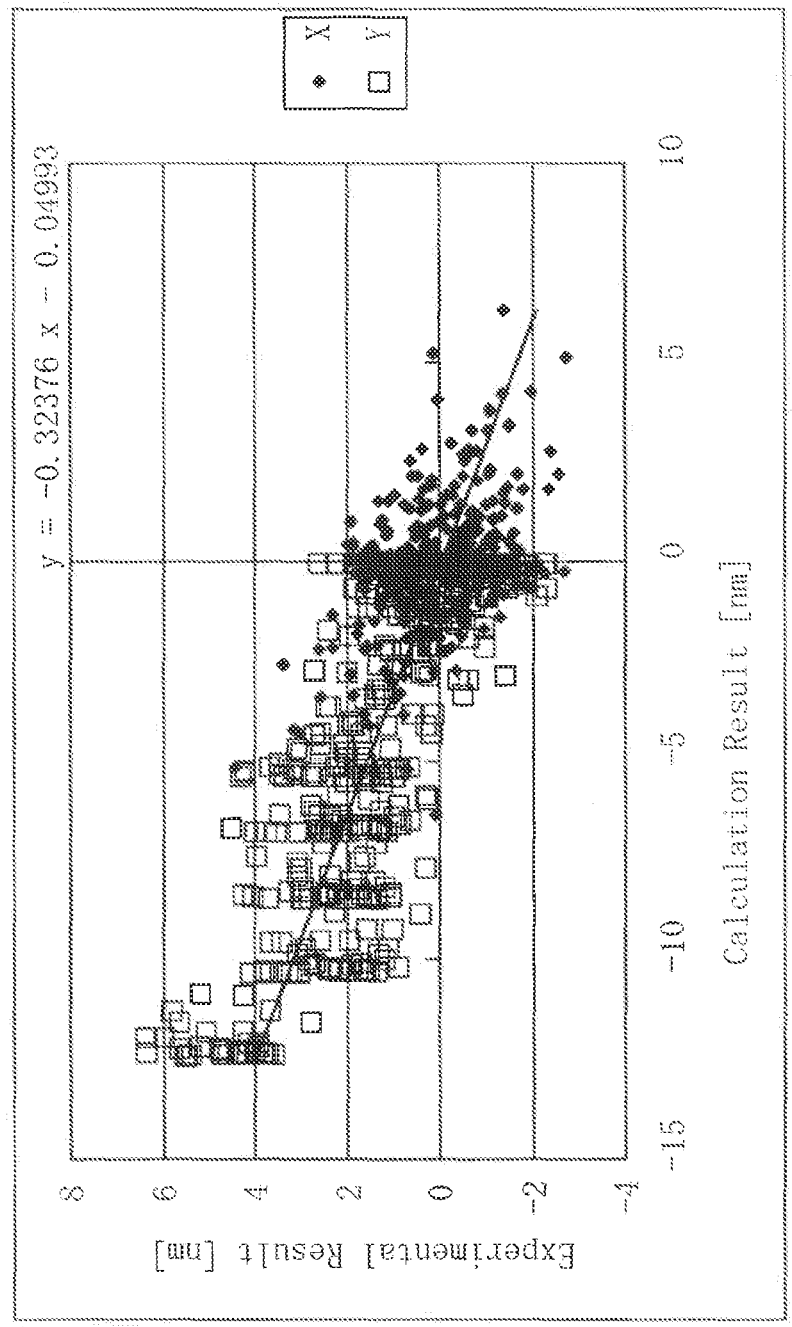
FIG. 8 is a graph showing a relation between an experimental result and a calculation result of FIGS. 7A to 7D.

FIG. 8 is a graph showing a relation between an experimental result and a calculation result of FIGS. 7A to 7D. In FIG. 8, the vertical axis shows an experimental result and the horizontal axis shows a calculation result. By performing fitting to approximate this result, the amount of charge decay in the case of the pattern area density 100% of the charge pattern can be obtained. FIG. 8 shows the case of the approximation by a linear function, for example, and of course, the approximation may be performed by other function. In the example of FIG. 8, it is possible to estimate a charge decay amount κ (100%) in the case of the pattern area density of 100% to be −0.3238 nC/cm².

Figure 9:
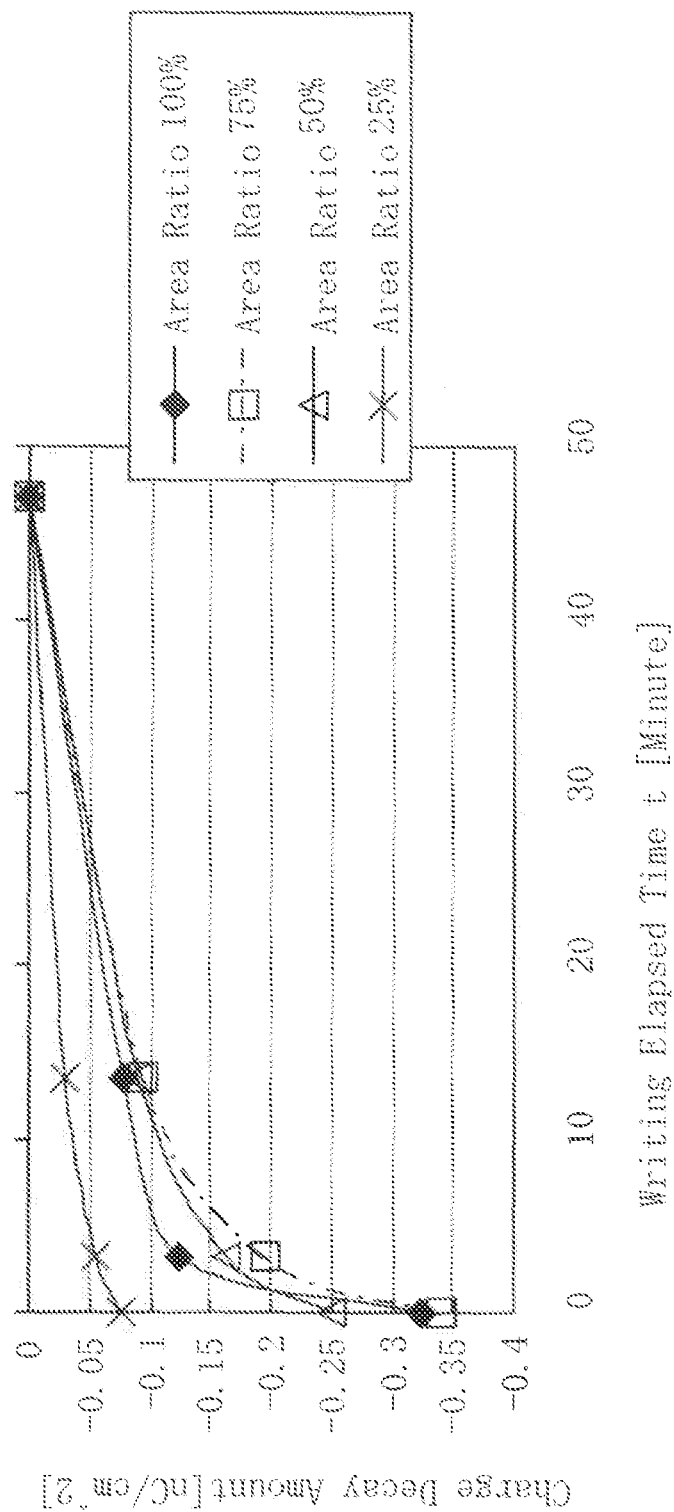
FIG. 9 shows an example of the relation between the amount of charge decay and the writing elapsed time according to Embodiment 1.

FIG. 9 shows an example of the relation between the amount of charge decay and the writing elapsed time according to Embodiment 1. In FIG. 9, the case is shown where the charge decay amount κ is estimated with respect to each of the conditions of just after (0 minutes) writing, 3 minutes after writing, 15 minutes after writing, and 50 minutes after writing the charge pattern 230. In FIG. 9, the charge decay amount κ is estimated with respect to each of the conditions where 50 minutes after writing the charge pattern 230 is determined to be the reference value 0. Here, the decay curve of a charge amount C of each pattern area density ρ can be approximated by the following equation (1-1) which is expressed by exponential functions, using the charge decay amount κ, the charge decay time constant λ, and the writing elapsed time t.

$$C = \kappa \cdot \exp(-t/\lambda) \quad (1\text{-}1)$$

Figure 10:
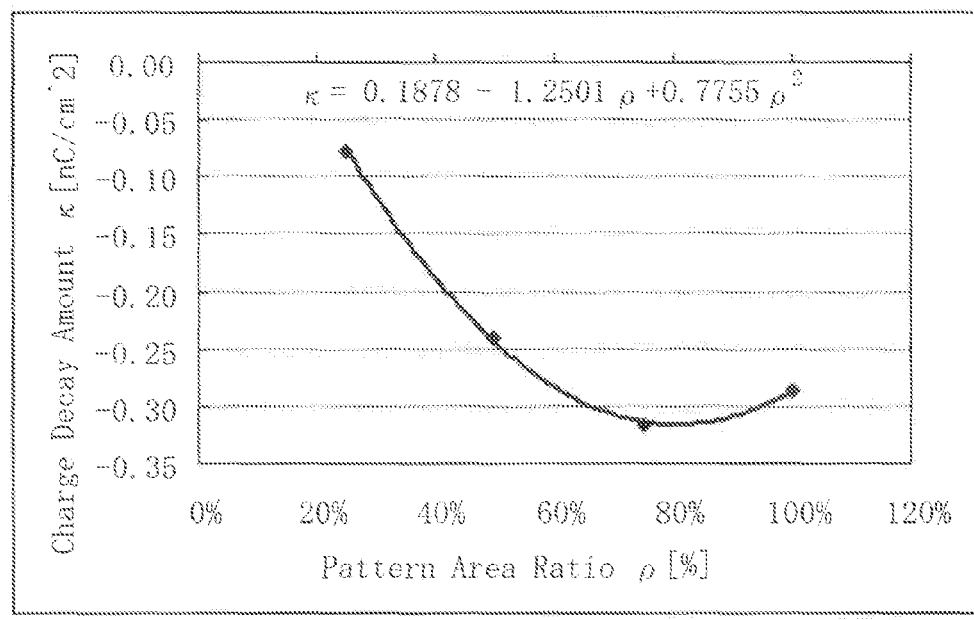
FIG. 10 shows an example of the relation between the charge decay amount and the pattern area density $\rho$ according to the result of FIG. 9.

FIG. 10 shows an example of the relation between the charge decay amount and the pattern area density ρ according to the result of FIG. 9. FIG. 10 shows a plotted graph of a charge decay amount κ just after writing (0 minutes) in the case of 50 minutes after writing the charge pattern 230 being the reference value 0, with respect to each of the cases of the pattern area density ρ (the pattern area ratio ρ) of 25%, 50%, 75%, and 100%. By fitting the measured values, a charge decay amount κ(ρ) depending on the pattern area density ρ can be obtained. The charge decay amount κ(ρ) can be approximated by the following equation (1-2), for example.

$$\kappa(\rho) = \kappa_0 + \kappa_1 \rho + \kappa_2 \rho^2 \quad (1\text{-}2)$$

$\kappa_0$, $\kappa_1$ and $\kappa_2$ are coefficients. Although the equation (1-2) is a quadratic function in this case, it is not restricted thereto, and a higher order function or a lower order function may also be used.

Figure 11:
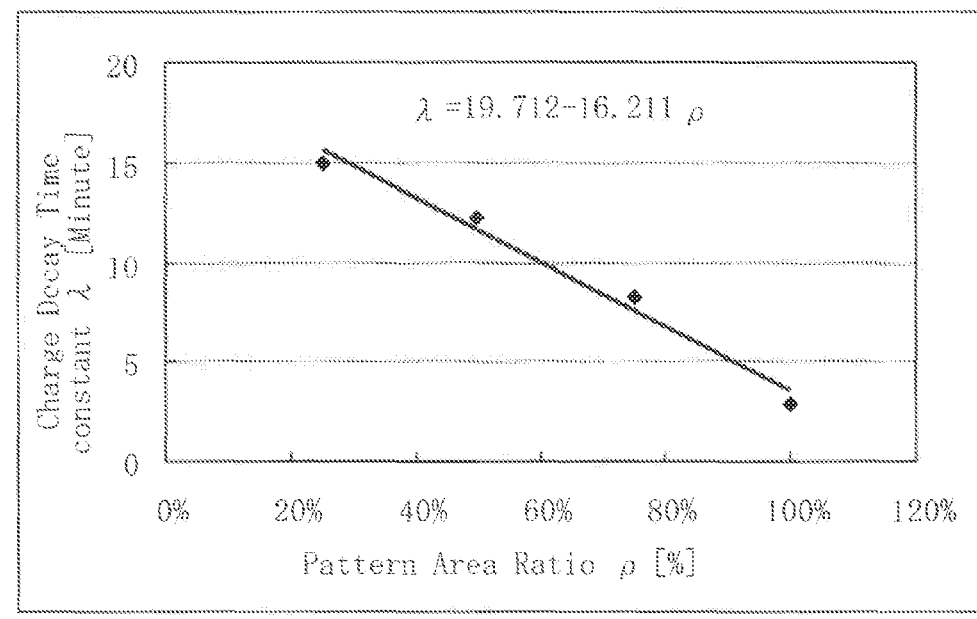
FIG. 11 shows an example of the relation between the charge decay time constant and the pattern area density $\rho$ according to the result of FIG. 9.

FIG. 11 shows an example of the relation between the charge decay time constant and the pattern area density ρ according to the result of FIG. 9. FIG. 11 shows a plotted graph of the charge decay time constant λ just after writing (0 minutes) in the case of 50 minutes after writing the charge pattern 230 being the reference value 0, with respect to each of the cases of the pattern area density ρ (the pattern area ratio ρ) of 25%, 50%, 75%, and 100%. By fitting the measured values, a charge decay time constant λ(ρ) depending on the pattern area density ρ can be obtained. The charge decay time constant λ(ρ) can be approximated by the following equation (1-3), for example.

$$\lambda(\rho) = \lambda_0 + \lambda_1 \rho + \lambda_2 \rho^2 \quad (1\text{-}3)$$

$\lambda_0$, $\lambda_1$, and $\lambda_2$ are coefficients. Although the equation (1-3) is a quadratic function in this case, it is not restricted thereto, and a higher order function or a lower order function may also be used.

Based on the above results, a charge amount C(x,y) at each position (coordinate amount (x,y)) of the irradiated region where the charge pattern 230 is written can be approximated by the following equation (1-4).

$$C(x,y) = \kappa(\rho) \cdot \exp(-t/\lambda(\rho)) \quad (1\text{-}4)$$

As mentioned above, it is preferable that the charge decay amount κ(ρ) and the charge decay time constant λ(ρ) can be respectively calculated by fitting a position displacement error of a measurement pattern, which is obtained by previously writing a plurality of evaluation patterns, each including the measurement pattern 240 and the charge pattern 230, of different pattern area densities ρ of the charge pattern 230.

Figure 12:
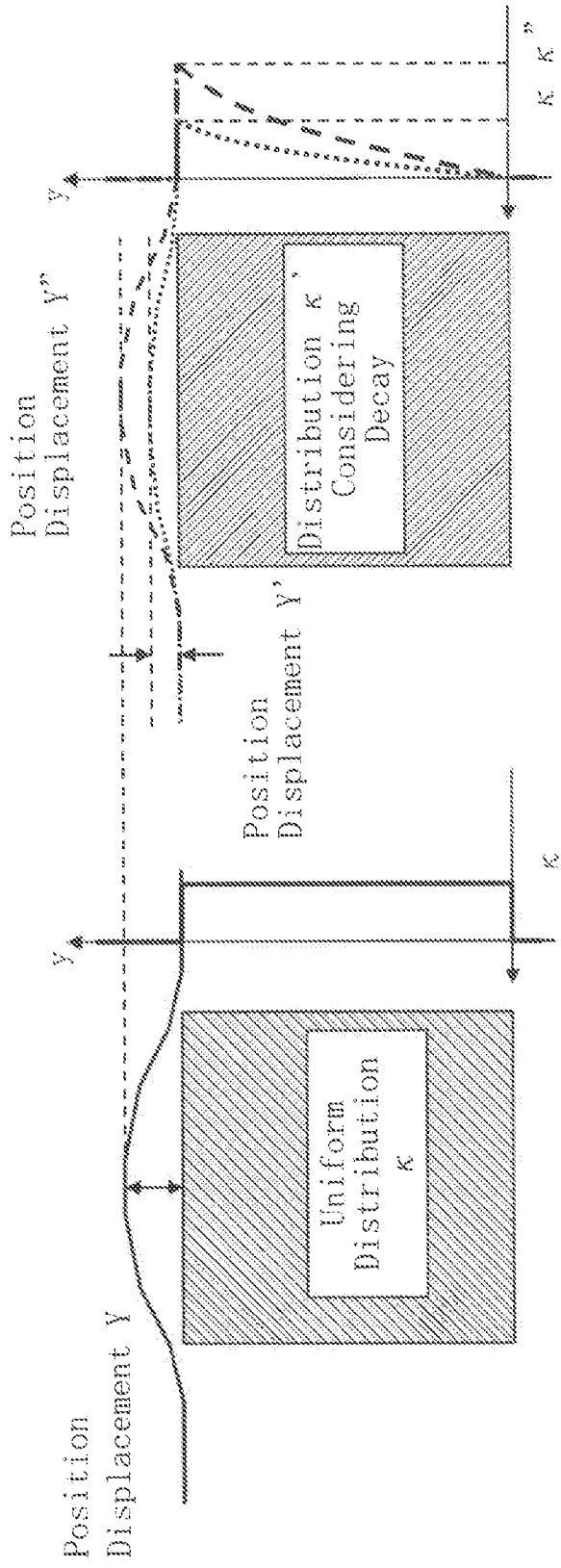
FIG. 12 is a schematic diagram for explaining a method of correcting a charge decay amount $\kappa(\rho)$ according to Embodiment 1.

FIG. 12 is a schematic diagram for explaining a method of correcting a charge decay amount κ(ρ) according to Embodiment 1. The example of FIG. 10 shows the result that the charge decay amount κ(ρ) becomes smaller in accordance with the pattern area densities of 25%, 50%, and 75% in order, but it increases again at 100%. This is because, as shown in the left of FIG. 12, the estimation is performed under the assumption that the charge decay amount κ(ρ) is uniform at all the positions in the charge pattern 230. Actually, as shown in the right of FIG. 12, when writing the charge pattern 230 of a predetermined size extending over a plurality of frame regions 220, a considerable time has passed between the part written firstly and the part written lastly. When a position displacement amount Y″ is calculated from a charge decay amount κ″(ρ) after the correction, which is set by applying the charge decay time constant λ for decaying the charge, with respect to the charge decay amount κ(ρ) obtained from a measured position displacement amount Y under the assumption of uniform distribution, the position displacement amount Y″ is smaller than Y as shown in FIG. 12. Then, the charge decay amount κ(ρ) is corrected using a correction equation κ″=F(λ) κ that lets the position displacement amount Y″ be equal to the position displacement amount Y.

Figure 13:
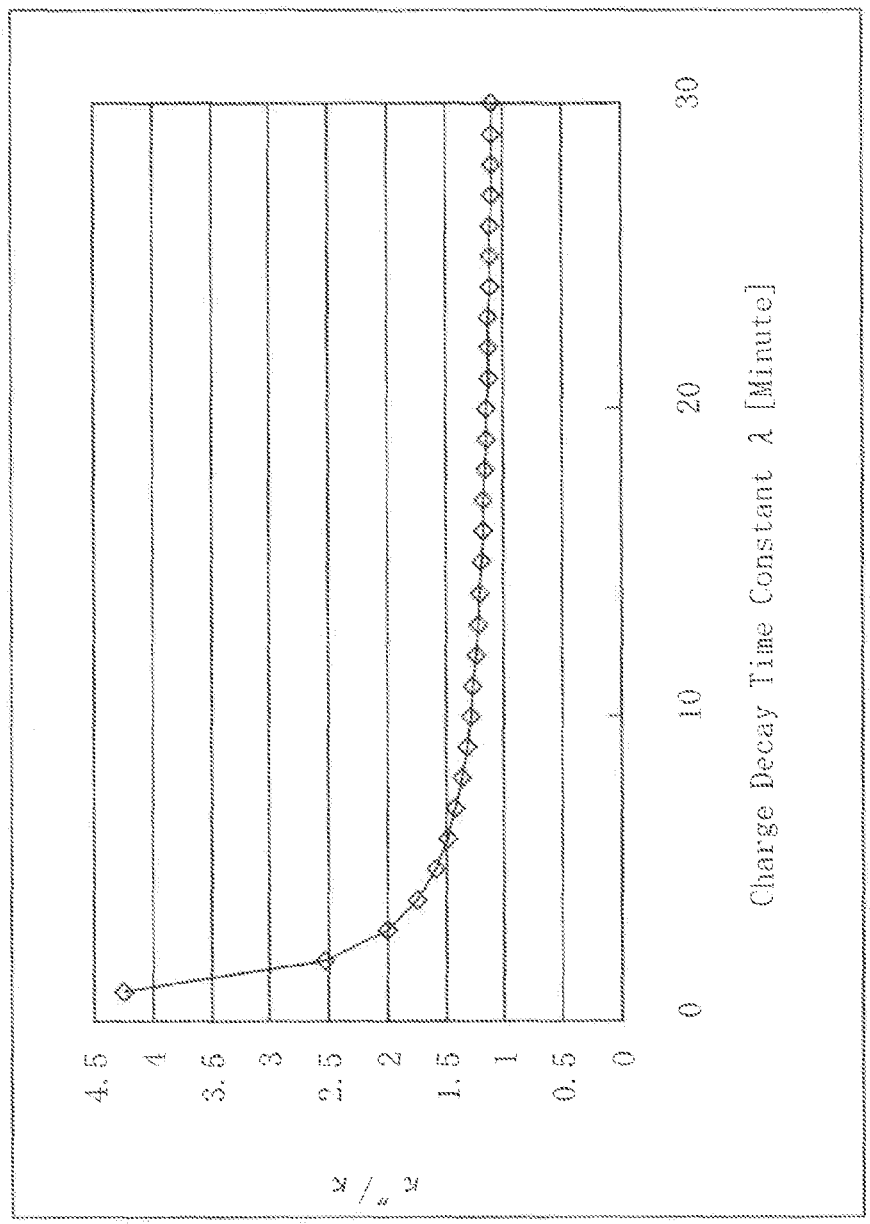
FIG. 13 shows an example of the relation between $\kappa''/\kappa$ and the charge decay time constant $\lambda$ according to Embodiment 1.

FIG. 13 shows an example of the relation between κ″/κ and the charge decay time constant λ according to Embodiment 1. In FIG. 13, using a plurality of charge decay time constants λ, the result of plotting κ″/κ at each charge decay time constant λ is shown. By performing fitting of the measurement result, the correction equation κ″=F(λ)·κ can be obtained. In this case, for example, $\kappa'' = (1 + 3.1082 \cdot \lambda^{-1.0312}) \cdot \kappa$ can be obtained.

As described above, the charge decay amount κ(ρ) is calculated from the result of previously writing the evaluation pattern which includes the charge pattern 230 extending over two or more writing sectional unit regions in a plurality of them. Then, it is preferable to configure so that the charge decay amount κ(ρ) may be obtained from a function wherein displacement of a charge decay amount, generated in accordance with the position of the charge pattern, has been corrected using the charge decay time constant λ.

Figure 14:
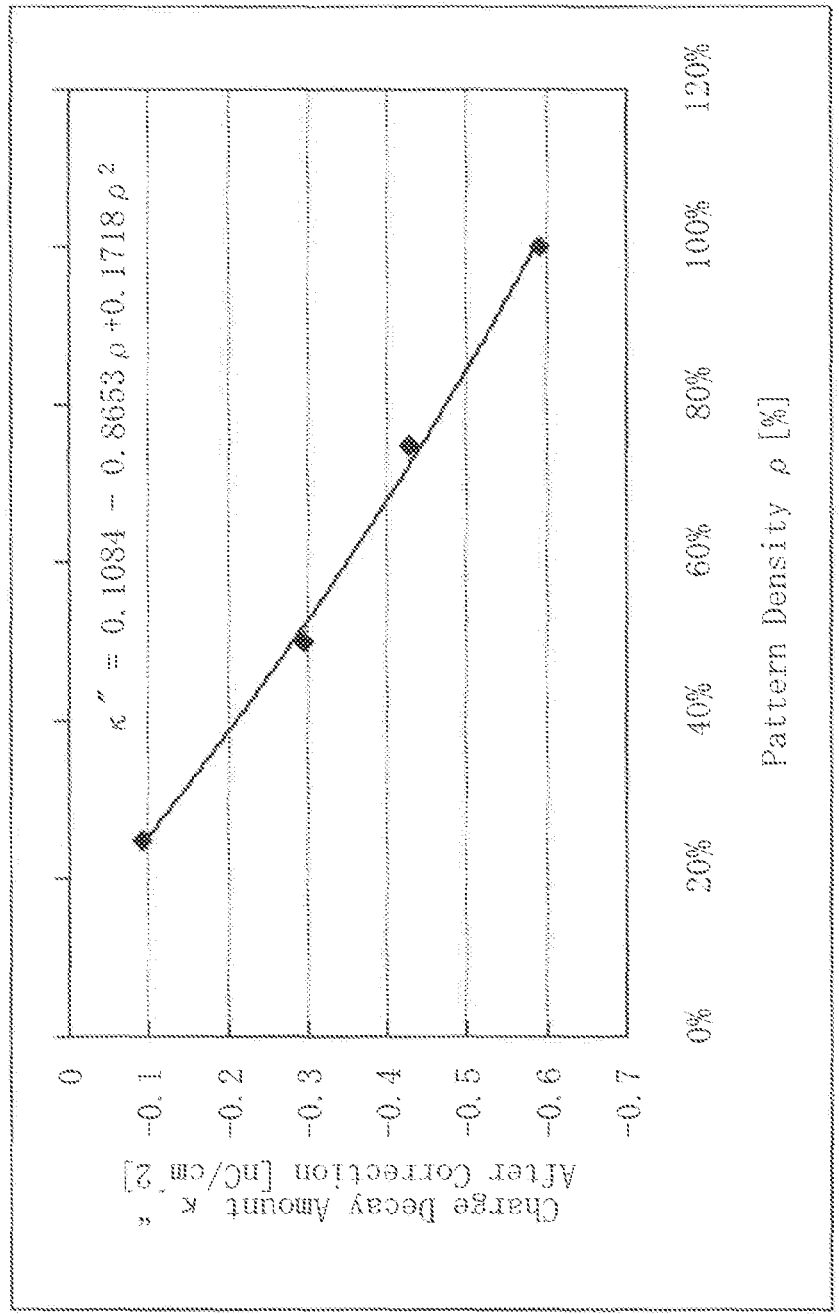
FIG. 14 shows an example of the relation between the charge decay amount after correcting and the pattern area density $\rho$ according to Embodiment 1.

FIG. 14 shows an example of the relation between the charge decay amount after correcting and the pattern area density ρ according to Embodiment 1. Although, in FIG. 10, the result of the charge decay amounts at the pattern area densities ρ of 75% and 100% is inverted, such an inversion phenomenon is removed by correcting, and a charge decay amount κ″(ρ) after correction becomes smaller in accordance with the pattern area densities ρ of 25%, 50%, 75%, and 100% in order. Thus, it becomes closer to a linear relation.

Figure 15:
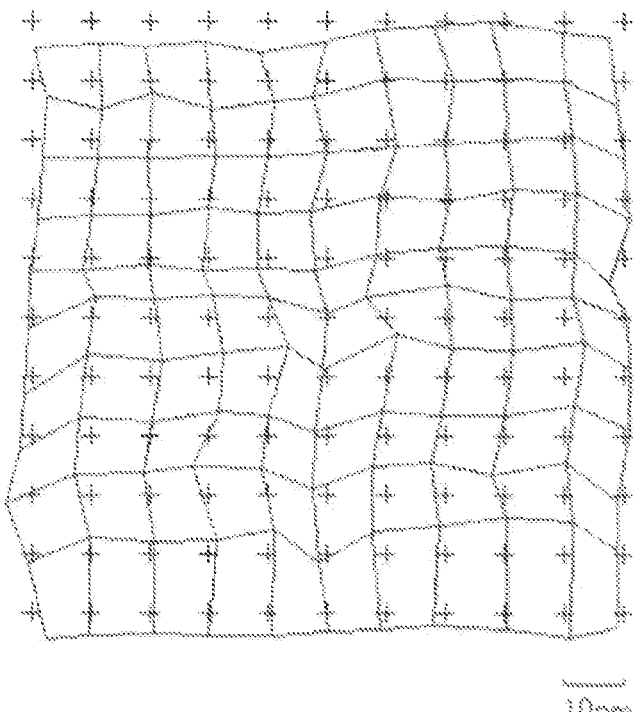
FIG. 15 shows an example of position displacement in the case of writing without correcting the position displacement resulting from charging.
Figure 16:
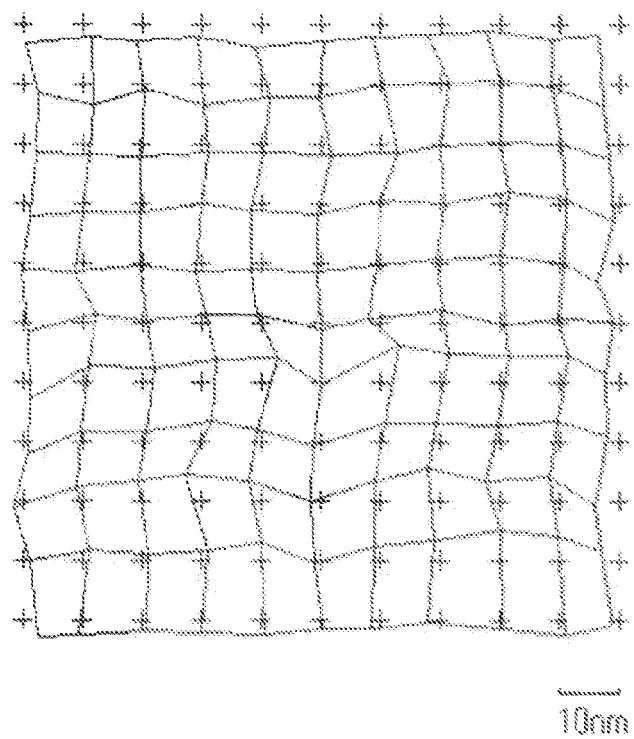
FIG. 16 shows an example of position displacement in the case of writing with correcting the position displacement resulting from the charge amount obtained in a predetermined model without considering charge decay according to Embodiment 1.
Figures 17, 18:
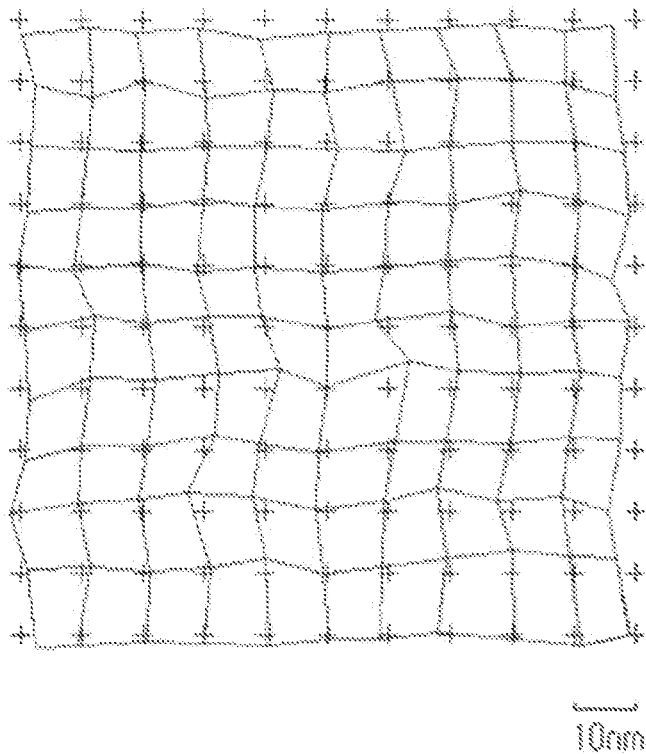
FIG. 17 shows an example of position displacement in the case of writing with correcting the position displacement resulting from the charge amount considering charge decay according to Embodiment 1.
FIG. 18 shows examples of position displacement amount in the cases of not correcting the position displacement resulting from the charging, of correcting the position displacement resulting from the charge amount obtained in a predetermined model without considering charge decay, and of correcting the position displacement resulting from the charge amount considering a charge decay, according to Embodiment 1.

FIG. 15 shows an example of position displacement in the case of writing without correcting the position displacement resulting from charging. FIG. 16 shows an example of position displacement in the case of writing with correcting the position displacement resulting from the charge amount obtained in a predetermined model without considering charge decay according to Embodiment 1. FIG. 17 shows an example of position displacement in the case of writing with correcting the position displacement resulting from the charge amount considering charge decay according to Embodiment 1. FIG. 18 shows examples of position displacement amount in the cases of not correcting the position displacement resulting from the charging, of correcting the position displacement resulting from the charge amount obtained in a predetermined model without considering charge decay, and of correcting the position displacement resulting from the charge amount considering a charge decay.

It turns out that the position displacement amount shown in FIG. 16 is smaller than that shown in FIG. 15, and the position displacement amount shown in FIG. 17 is smaller than that shown in FIG. 16. Moreover, as shown in FIG. 18, when measuring using 3σ, regarding position displacement in the Y direction, the position displacement is 9.7 nm in the case of not correcting the position displacement resulting from charging, whereas it decreases to 7.1 nm in the case of correcting position displacement resulting from the charge amount obtained in a predetermined model without considering charge decay, and further it decreases to 5.2 nm in the case of correcting position displacement resulting from the charge amount considering charge decay. As can be understood from the results, it is possible to decrease the position displacement amount after written, by correcting position displacement resulting from temporal charge decay.

Then, in Embodiment 1, position displacement due to a temporal charge decay is corrected to perform writing. The writing method of performing such correction will be described below.

Figure 19:
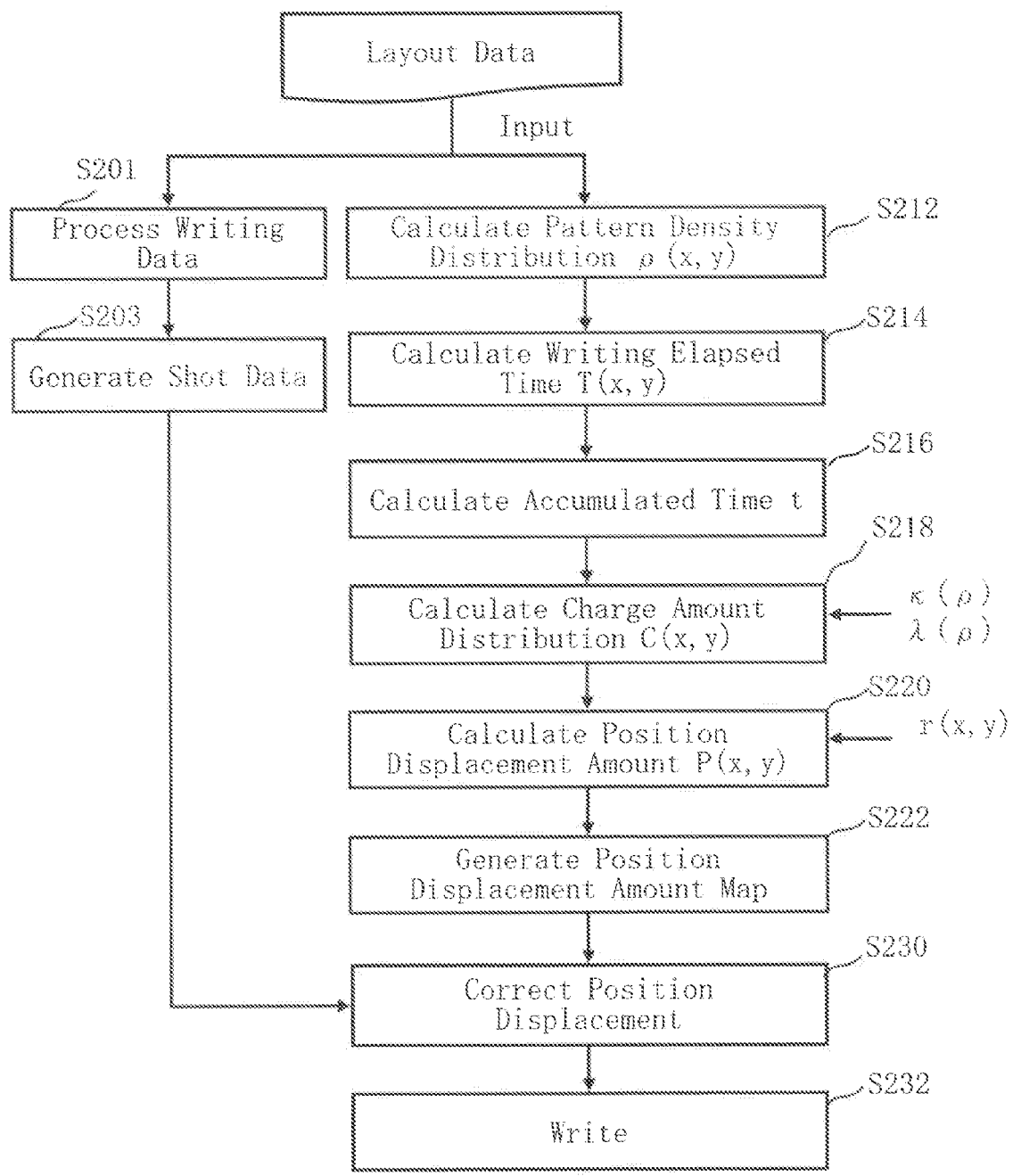
FIG. 19 is a flowchart showing the main steps of the writing method according to Embodiment 1.

FIG. 19 is a flowchart showing the main steps of the writing method according to Embodiment 1. In FIG. 19, the writing method of Embodiment 1 executes a series of steps: a writing data processing step (S201), a shot data generation step (S203), a pattern density distribution ρ(x,y) calculation step (S212), a writing elapsed time T(x,y) calculation step (S214), an accumulated time t calculation step (S216), a charge amount distribution C(x,y) calculation step (S218), a position displacement amount P(x,y) calculation step (S220), a position displacement amount map generation step (S222), a position displacement correction step (S230), and a writing step (S232).

First, layout data (writing data) is input into the control computer 110 through the external I/F circuit 146 from the outside of the apparatus, and is stored in the storage device 144. With regard to the layout data, for example, a file is created for each frame region 220. Of course, data of a plurality of or all of frame regions 220 may form one file. As mentioned above, the charge decay amount κ(ρ) and the charge decay time constant λ(ρ), each of which includes the measurement patterns 240 and 242 and the charge pattern 230 and can be calculated by fitting a position displacement error of the measurement patterns 240 and 242 obtained by previously writing a plurality of evaluation patterns 211 having different pattern area densities ρ of the charge pattern 230, are input into the control computer 110 through the external I/F circuit 146, and are stored in storage device 144. It is still more preferable to use the above-mentioned charge decay amount κ"(ρ) after the correction, instead of the charge decay amount κ(ρ). Moreover, a response function r(x,y) which converts a charge amount into a position displacement amount is input into the control computer 110 through the external I/F circuit 146, and is stored in the storage device 144.

In the writing data processing step (S201), the writing data processing unit 112 reads layout data currently concerned from the storage device 144, for each frame region 220, and performs a plurality of steps of data processing. For example, since a pattern of a plurality of chips is usually written on one mask, the writing data processing unit 112, first, performs merging of the plurality of chips. Then, data conversion is executed for the merged data in order to generate prescribed middle data. The middle data is output to the control computer 130 from the control computer 110 or the storage device 144 in addition to being stored in the storage device 144.

In the shot data generation step (S203), the shot data generation unit 132 further performs data conversion processing for the middle data mentioned above in order to generates shot data of a format peculiar to the pattern writing apparatus.

In the pattern density distribution ρ(x,y) calculation step (S212), the pattern area density distribution calculation unit 114 reads layout data currently concerned from the storage device 144 for each frame region 220, and further virtually divides the frame region 220 into a plurality of small regions (x,y) in order to calculate a pattern area density ρ of each small region. By performing this calculation for all of the frame regions 220, a pattern area density distribution ρ(x,y) of each frame region 220 can be calculated.

In the writing elapsed time T(x,y) calculation step (S214), the writing elapsed time calculation unit 116 calculates an elapsed time T(x,y) from the starting time of writing (time when writing of a layout head or a head frame is started) to the time of actually writing each position on the target workpiece 101. For example, in the case of the currently concerned frame region 220 being the i-th frame region, calculation is performed while treating an expected time period from the writing start time, namely the time of starting writing a writing start position S(0,0), to the time of writing each position (x,y) up to the (i−1)th frame region which is just one frame before the i-th frame region, as an elapsed time T(x,y).

In the accumulated time t calculation step (S216), the accumulated time calculation unit 118 calculates an accumulated time t, which is obtained by accumulating a writing time spent in writing, for example, the frame region 220 serving as a writing sectional unit region having been written. For example, if the frame region 220 currently concerned is the i-th frame region, an additional value is calculated by an accumulated addition of time t(1) for writing the first frame region, time t(2) for writing the second frame region, . . . , and time t(i) for writing the i-th frame region. Thereby, the accumulated time t up to the currently concerned frame region can be obtained.

Then, when actually writing the inside of the currently concerned frame region which is now being processed, since the writing has already been completed up to the frame region just before the currently concerned one, the portion irradiated by the electron beam 200 in the regions of up to the frame region just before the currently concerned becomes a charged portion. Therefore, a difference value (t−T) obtained by subtracting a writing elapsed time T(x,y) with respect to each position (x,y) in the regions up to the frame region just before the currently concerned, where the charged portion exists, from the accumulated time t of the currently concerned frame region is the elapsed time after writing the charged portion.

Therefore, the charge amount C(x,y) of each position (x,y) in the regions up to the frame region just before the currently concerned one to be written can be calculated by the following equation (1-5) transformed from the equation (1-4) mentioned above.

$$C(x,y) = \kappa(\rho) \cdot \exp\{-(t-T)/\lambda(\rho)\} \qquad (1\text{-}5)$$

However, when calculating the charge amount, only the portion where a pattern exists, in each position (x,y) in the regions up to the frame region just before the currently concerned is calculated. That is, since the portion where the pattern area density ρ is 0% in the small region (x,y) is a non-irradiated portion, no substantial charge decay has occurred as mentioned above, thereby no calculation is performed, or alternatively it may be defined as C(x,y)=0.

In the charge amount distribution C(x,y) calculation step (S218), the charge amount distribution calculation unit 120 calculates a charge amount distribution C(x,y) which is charged by irradiation of the electron beam 200 onto the writing region 210 of the target workpiece 101, by using the charge decay amount κ(ρ) and the charge decay time constant λ(ρ) which are dependent on the pattern area density ρ as mentioned above. Specifically, the charge amount C(x,y) of each position (x,y) in the regions up to the frame region just before the frame region currently concerned to be written can be obtained by calculating the equation (1-5). Thus, it is preferable for the charge amount distribution calculation unit 120 to calculate a charge amount distribution by using a difference between the accumulated time and the elapsed time.

Here it should be understood that, for example, there is a case of values of the charge amount C even at the same position being different when comparing the charge amount C of each position (x,y) in the regions up to the (i−1)th frame region in the case that the frame region 220 being currently calculated is the i-th frame region, with the charge amount C of each position (x,y) in the regions up to the i-th frame region in the case that the frame region 220 being currently calculated is the (i+1)th frame region. That is because there has occurred a temporal decay of the charged portion irradiated by the electron beam 200.

In the position displacement calculation step (S220), the position displacement amount distribution calculation unit 122 calculates a position displacement amount P of each writing position (x,y) due to the charge amounts of the charge amount distribution C(x,y) by performing convolution of a response function r(x,y) with each charge amount C of the charge amount distribution C(x,y). The response function r(x,y) which converts this charge amount distribution C(x,y) into the position displacement amount distribution P(x,y) is assumed. Here, a charged position indicated by each position in the charge amount distribution C(x,y) is expressed by (x',y'), and a beam irradiation position of a frame region concerned (for example, the i-th frame region) which is being data processed is expressed by (x,y). Here, since a beam position displacement can be expressed as a function of a distance from a beam irradiation position (x,y) to a charged position (x',y'), it is possible to express a response function as r(x-x',y-y'). The response function r(x-x',y-y') may be obtained in advance from an experiment. In the following description in Embodiment 1, (x,y) indicates a beam irradiation position of the frame region being currently data processed.

In the position displacement amount map generation step (S222), the position displacement amount map generation unit 124 generates a position displacement amount distribution Pi(x,y) (or called a position displacement amount map Pi(x,y)) based on a position displacement amount P of each position (x,y) to be written in the frame region just being data processed, which was obtained in the previous step (S220). The calculated position displacement amount map Pi(x,y) is output to the control computer 130 from the control computer 110 or the storage device 144 in addition to being stored in the storage device 144.

In the position displacement correction step (S230), the position displacement correction unit 134 corrects shot data of each position. Specifically, a correction value for correcting a position displacement amount shown in the position displacement amount map Pi(x,y) is added to each position (x,y) of the shot data. For example, it is preferable to use, as the correction value, a value obtained by reversing the signs of positive and negative of the position displacement amount shown in the position displacement amount map Pi(x,y).

In the writing step (S232), the shot data in which the position has been corrected is output to the deflection control circuit 140, and then, based on the output from the deflection control circuit 140, the writing unit 150 writes a pattern onto a position where a position displacement amount has been corrected, for each frame region of the target workpiece 101, using the electron beam 200.

As described above, position displacement of an irradiation position due to a charge decay can be corrected by obtaining a position displacement amount distribution from a charge amount distribution depending upon a charge decay. Accordingly, it is possible to write a pattern at a corrected position of high precision, thereby obtaining pattern dimensions of high accuracy.

Embodiment 2

As described in Embodiment 1, there exist position displacement caused by charge which does not change temporally and position displacement caused by temporal charge decay, and a configuration for correcting the position displacement due to temporal charge decay has been explained. In Embodiment 2, there will be described another configuration capable of further correcting position displacement due to charge which does not change temporally by using a predetermined model. Hereafter, the contents that are not especially explained are the same as those in Embodiment 1.

According to the writing apparatus described in the Patent Literature 1 mentioned above, assuming that there exists a linearly proportional relationship between an irradiation amount distribution and a charge amount distribution, a position displacement amount distribution is calculated from the irradiation amount distribution through a linear response function.

However, according to examination performed by the present inventor, it was found that a position displacement amount distribution cannot be accurately calculated when it is assumed that there exists a linearly proportional relationship between the irradiation amount distribution and the position displacement distribution. Then, there has arisen a necessity of establishing a new model for highly accurately obtaining a position displacement amount distribution without using the linearly proportional relationship.

Figure 20:
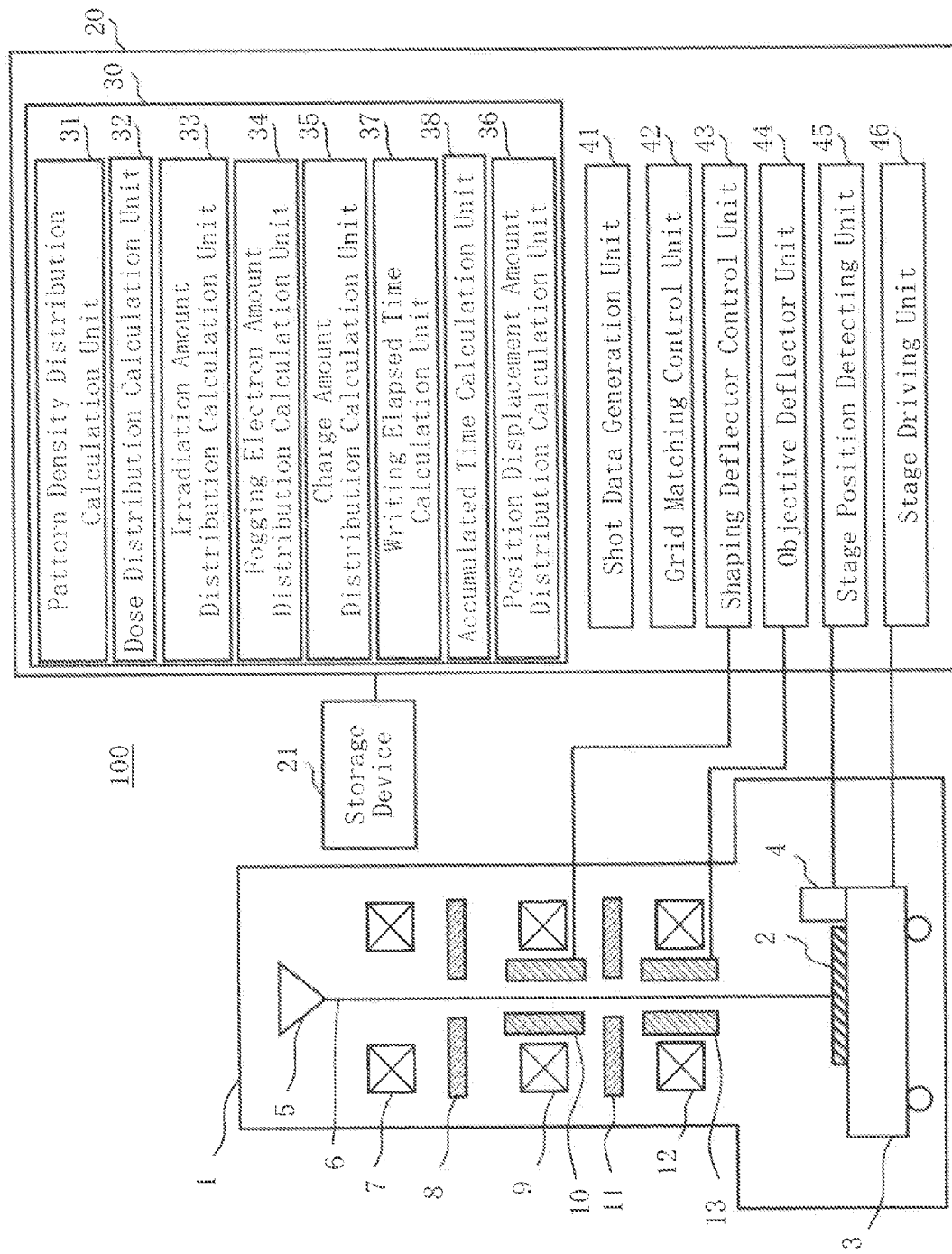
FIG. 20 shows a schematic configuration of the electron beam writing apparatus 100 according to Embodiment 2.

FIG. 20 shows a schematic configuration of the electron beam writing apparatus 100 according to Embodiment 2. The electron beam pattern writing apparatus 100 of a variable-shaped beam system shown in FIG. 20 includes a writing unit 1. In the writing unit 1, an XY stage 3 for holding a mask being a target workpiece 2 is accommodated. The mask being a target workpiece 2 is made by laminating a chromic oxide film and a resist layer one by one on a glass substrate. The XY stage 3 is configured to be movable in the directions X and Y by a stage driving unit 46 described later. The movement position of the XY stage 3 is detected by a stage position detecting unit 45 described later, based on the output of a laser interferometer 4.

In the above of the XY stage 3, there is provided an electron gun assembly 5 which is the source of an electron beam 6. Between the electron gun assembly 5 and the XY stage 3, there are arranged an illumination lens 7, an S1 aperture (first aperture plate) 8, a projection lens 9, a shaping deflector 10, an S2 aperture (second aperture plate) 11, an objective lens 12, and an objective deflector 13.

Moreover, the electron beam writing apparatus 100 includes a control unit 20 and a storage device 21 connected to the control unit 20. The storage device 21 stores layout data, a position displacement amount distribution (also called a position displacement amount map), an optical system error distribution (also called an optical system error map), etc. to be described later. The storage device is, for example, a magnetic disk device, a magnetic tape device, an FD, or a semiconductor memory.

The control unit 20 includes a preprocessing calculation unit 30 having a pattern density distribution calculation unit 31, a dose distribution calculation unit 32, an irradiation amount distribution calculation unit 33, a fogging electron amount distribution calculation unit 34, a charge amount distribution calculation unit 35, a writing elapsed time calculation unit 37, an accumulated time calculation unit 38, and a position displacement amount distribution calculation unit 36.

The pattern density distribution calculation unit 31 calculates a distribution of a pattern density of each mesh region in a respective frame which has been virtually divided into mesh-like regions of a predetermined size, based on graphic data included in the layout data read from the storage device 21. The dose distribution calculating means 32 calculates a distribution of a dose by using a proximity effect correction equation of backscattered electrons to be described later. The irradiation amount distribution calculation unit 33 calculates a distribution of an irradiation amount of an electron beam projected onto the target workpiece, based on the pattern density distribution and the dose distribution. The fogging electron amount distribution calculation unit 34 calculates a distribution of a fogging electron amount, based on the irradiation amount distribution and a function describing a fogging electron spread. The charge amount distribution calculation unit 35 calculates a distribution of a charge amount of an irradiated region which is irradiated by electron beams, and a distribution of a charge amount of a non-irradiated region which is not irradiated by electron beams, by using a method described later. The position displacement amount distribution calculation unit 36 calculates a distribution of a position displacement amount of an electron beam on the target workpiece, based on the charge amount distribution calculated by the charge amount distribution calculation unit 35.

The control unit 20 includes a shot data generation unit 41, a grid matching control unit 42, a shaping deflector control unit 43, an objective deflector control unit 44, the above-described stage position detecting unit 45 and stage driving unit 46, in addition to the preprocessing calculation unit 30.

The shot data generation unit 41 generates writing data based on the layout data read from the storage device 21, and shot data based on the writing data. The grid matching control unit 42 controls the objective deflector control unit 44, based on the position displacement amount distribution calculated by the position displacement amount distribution calculation unit 36. The shaping deflector control unit 43 controls the position of the shaping deflector 10 so that an S2 aperture image of desired dimensions and shape (quadrangle or triangle) may be obtained. The objective deflector control unit 44 controls the position of the objective deflector 13 so that the electron beam 6 may irradiate a desired position on the target workpiece 2.

Next, a general writing operation of the electron beam writing apparatus 100 will be described.

The electron beam 6 emitted from the electron gun assembly 5 irradiates the whole of the S1 aperture 8 having a quadrangular opening, such as rectangular opening, by the illumination lens 7. Then, after passing through the S1 aperture 8, the electron beam 6 of an S1 aperture image is projected onto the S2 aperture 11 having a key shape opening, by the projection lens 9. The position of the first aperture image on the S2 aperture 11 is deflected by the shaping deflector 10, and thereby a desired beam shape and dimensions can be obtained. After passing through the S2 aperture 11, the electron beam 6 of an S2 aperture image is focused by the objective lens 12 and deflected by the objective deflector 13, to irradiate a desired position of the target workpiece 2 placed on the XY stage 3.

Figure 21:
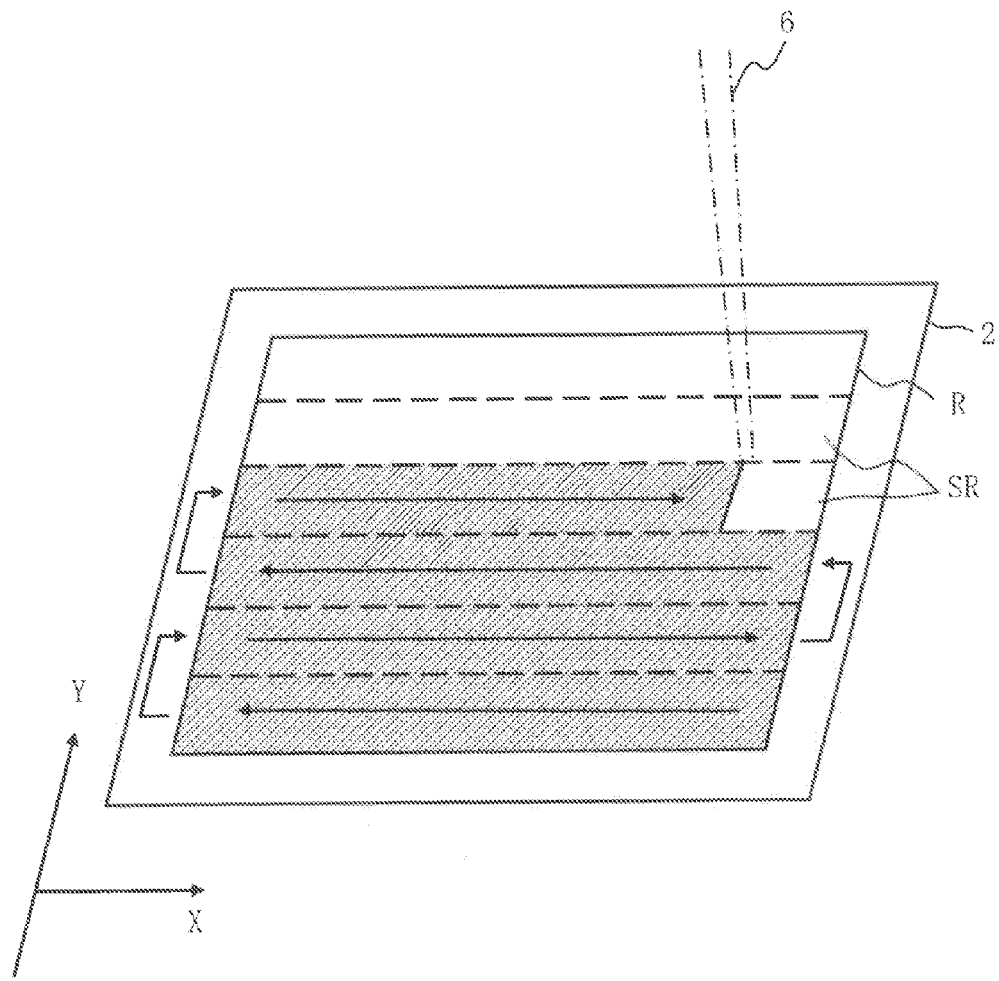
FIG. 21 shows a movement direction of the target workpiece 2 at the time of pattern writing.

In the pattern writing, the target workpiece 2 is moved as shown in FIG. 21 because the XY stage 3 moves continuously. FIG. 21 shows a movement direction of the target workpiece 2 at the time of pattern writing. A writing region R of the target workpiece 2 is virtually divided into a plurality of strip-like stripe regions SR. The electron beam 6 irradiates one stripe region SR in the X direction. That is, while the XY stage 3 continuously moves in the X direction, the shot position (irradiated region) of the electron beam 6 also follows the movement of the stage. After finishing writing one stripe region, the XY stage 3 is step fed in the Y direction. Then, the electron beam 6 irradiates the next stripe region in the X direction, and at this time the XY stage 3 is continuously moved in the reverse X direction.

As mentioned above, when an electron beam is projected onto the resist layer of the target workpiece 2, the position of beam irradiation is displaced due to a resist charging effect.

Figure 22:
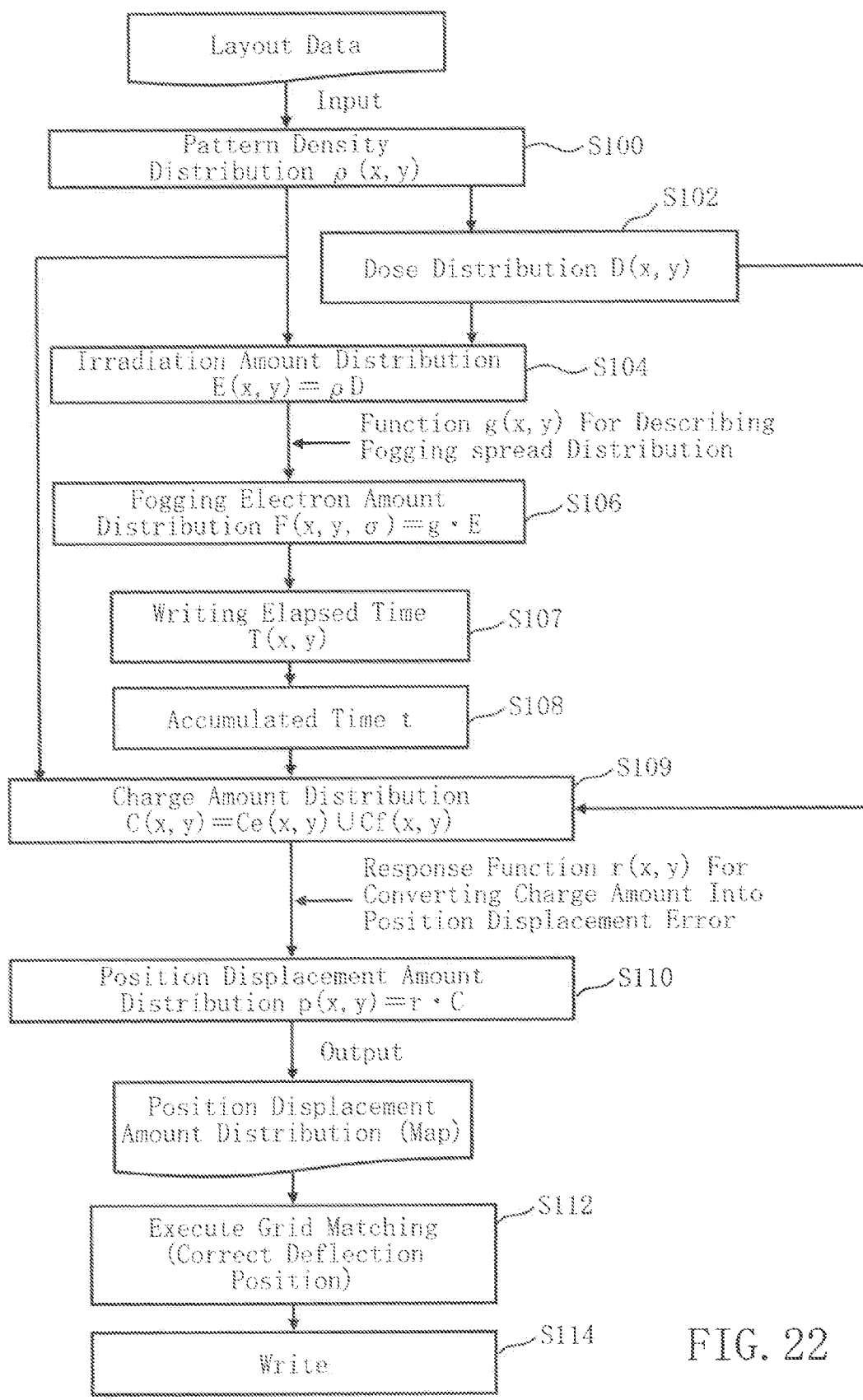
FIG. 22 is a flowchart illustrating a writing method described in Embodiment 2.

Then, in Embodiment 2, the pattern writing is performed, according to the flow shown in FIG. 22, considering a position displacement amount in the electron beam pattern writing apparatus 100. FIG. 22 is a flowchart illustrating a writing method described in Embodiment 2.

With reference to the flow shown in FIG. 22, the layout data stored in the storage device 21 is first read by the pattern density distribution calculation unit 31, and then, based on graphic data included in this layout data, a pattern density is calculated for each frame (henceforth called a mesh region) which is virtually divided into mesh-like regions of predetermined dimensions (grid dimensions) (Step S100). In this step S100, a distribution $\rho(x,y)$ of the pattern density of each mesh region is calculated.

Next, using the pattern density distribution $\rho(x,y)$ calculated in the step S100, a distribution $D(x,y)$ of the dose of each mesh region is calculated (Step S102). In this step S102, the dose distribution $D(x,y)$ is calculated according to the following proximity effect correction equation (2-1) of backscattered electrons.

$$D=D_0\times\{1+2\times\eta)/(1+2\times\eta\times\rho)\} \quad (2\text{-}1)$$

(where $D_0$ indicates a reference dose and $\eta$ indicates a backscattering ratio.)

The reference dose $D_0$ and the backscattering ratio $\eta$ are set by the user of the charged particle beam writing apparatus 100. The backscattering ratio $\eta$ can be set in consideration of an acceleration voltage of the electron beam 6, a resist film thickness of the target workpiece 2 and the type of the underlying substrate thereof, and process conditions (e.g., PEB conditions and development conditions), etc.

Next, by multiplying the pattern density distribution $\rho(x,y)$ calculated in the step S100 and the dose distribution $D(x,y)$ calculated in the step S102, an irradiation amount distribution $E(x,y)$ (also called an irradiation intensity distribution) of each mesh region is calculated (Step S104).

Then, a fogging electron amount distribution $F(x,y,\sigma)$ is calculated according to the method described later (Step S106). A charge amount distribution $C(x,y)$ is calculated by the charge amount distribution calculation unit 35, according to the method described later (Step S109).

In addition, it is also preferable to previously calculate the pattern density distribution ρ(x,y), the dose distribution D(x,y), the irradiation amount distribution E(x,y), the fogging electron amount distribution F(x,y,σ), and the charge amount distribution C(x,y), store them in the storage device 21, and read them from it in each step.

Next, based on the charge amount distribution C(x,y) calculated in the step S109, a position displacement amount distribution p(x,y) is calculated by the position displacement amount distribution calculation unit 36 (Step S110). In this step S110, the position displacement amount distribution p(x,y) is calculated by performing convolution of the charge amount distribution C(x,y) with the response function r(x,y) which converts the charge amount into a position displacement error.

Then, based on the position displacement amount distribution p(x,y) calculated in the step S110, grid matching is performed (Step S112). After controlling the objective deflector 13 as described later in this step S112, the electron beam 6 is projected onto the target workpiece 2 to write a pattern (Step S114).

Figure 23:
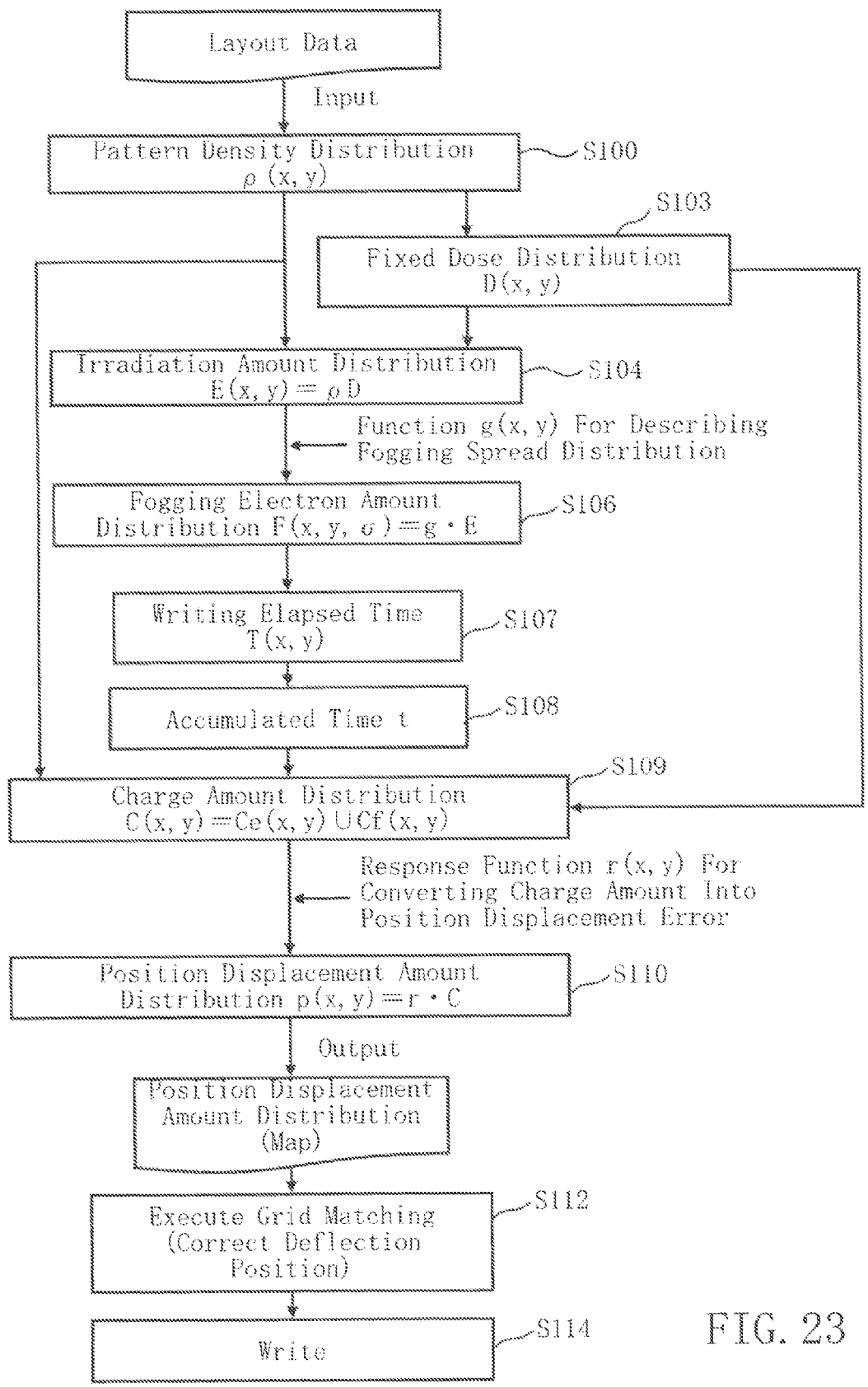
FIG. 23 is a flowchart illustrating a writing method described in Embodiment 2.

Moreover, the flow shown in FIG. 23 may be used for performing writing instead of the flow shown in FIG. 22. With reference to FIGS. 22 and 23, there is a difference between the step S102 and the step 103, and other steps are identical with each other. Although the dose distribution D(x,y) is calculated based on the pattern density distribution ρ(x,y) in the step S102 of FIG. 22, a fixed dose distribution D(x,y) is obtained without reference to the pattern density distribution ρ(x,y) in the step S103 of FIG. 23. Then, in the step S104 of FIG. 23, an irradiation amount distribution E(x,y) is calculated by multiplying the fixed dose distribution D(x,y) acquired in the step S103 and the pattern density distribution ρ(x,y) calculated in the step S100.

Figure 24:
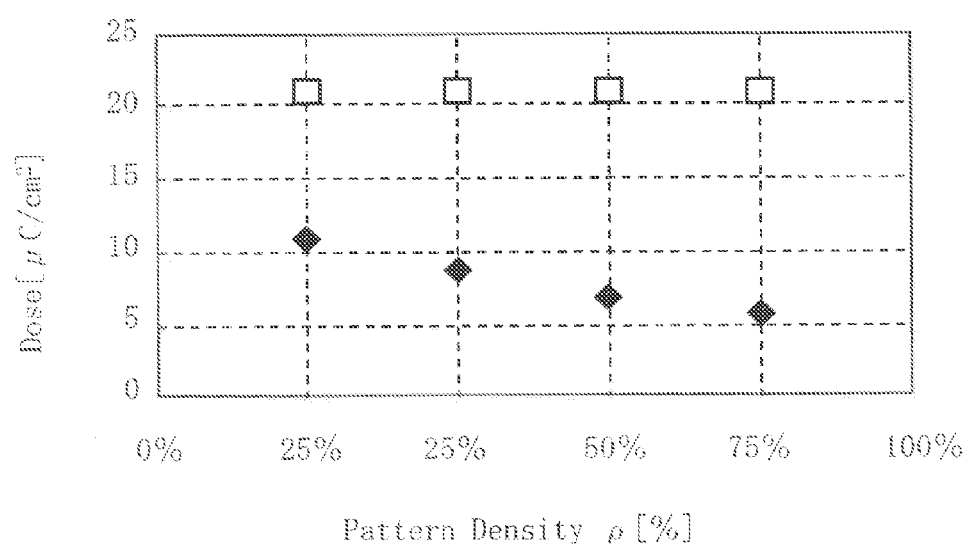
FIG. 24 shows the case where a dose is changed according to pattern density and the case where a dose is fixed regardless of pattern density.

Thus, the irradiation amount distribution E(x,y) may be calculated using the fixed dose distribution D(x,y) without depending upon the pattern density distribution ρ(x,y). In FIG. 24, ♦ indicates a dose which changes according to the pattern density ρ, and □ indicates a dose (21 μC/cm$^2$) which is fixed irrespective of the pattern density.

Next, with reference to FIG. 25, the flow of grid matching performed in the step S112 will now be explained.

Figure 25:
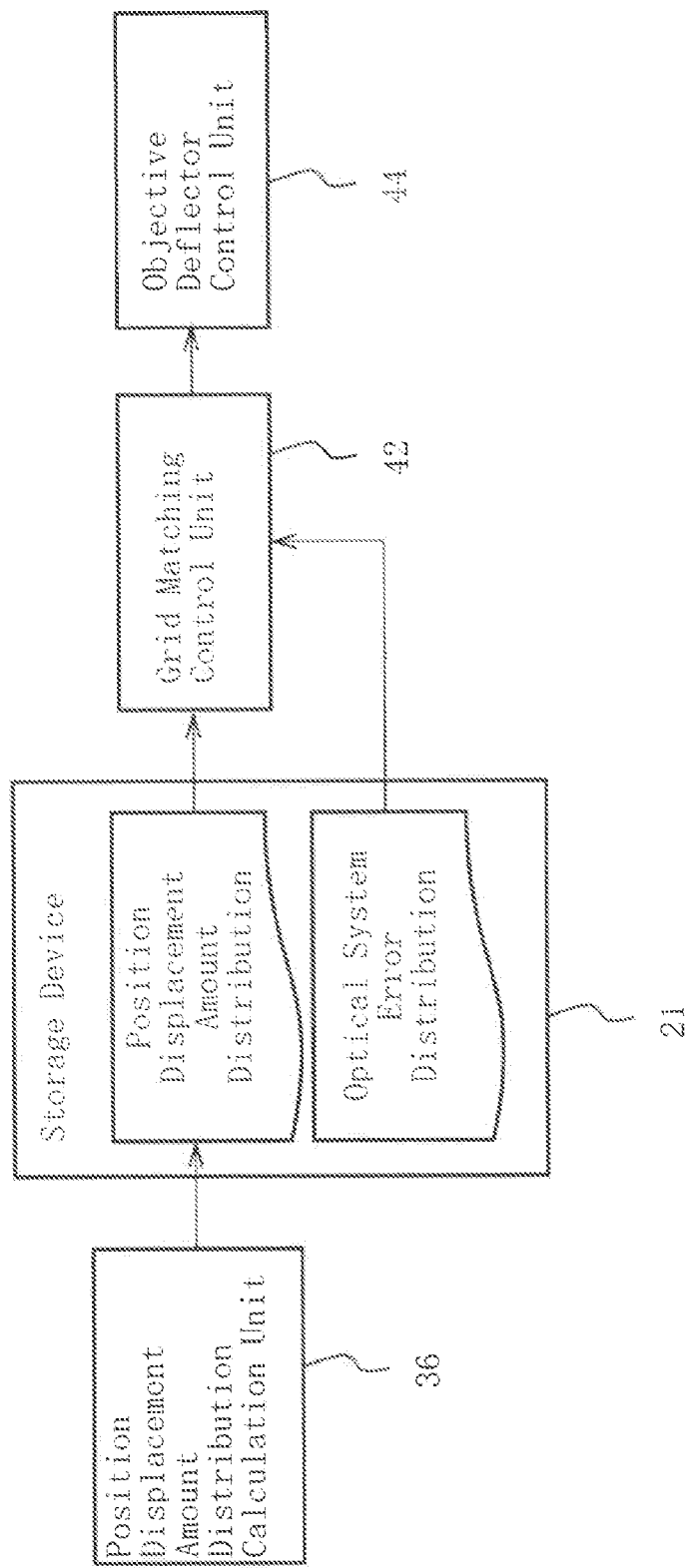
FIG. 25 is a schematic diagram for explaining a flow of grid matching.

As shown in FIG. 25, the position displacement amount distribution calculated by the position displacement amount distribution calculation unit 36 is stored in the storage device 21. Then, the position displacement amount distribution stored in the storage device 21 and an optical system error distribution which has already been created in advance and stored in the storage device 21 are read by the grid matching control unit 42. The grid matching control unit 42 synthesizes each data of each mesh of the position displacement amount distribution and each data of each mesh of the optical system error distribution, and outputs the synthesized data to the objective deflector control unit 44, the objective deflector control unit 44 controls the position of deflection of the electron beam 6, based on the input data. That is, the position of the objective deflector 13 is controlled to a correction position where the position displacement amount distribution and the optical system error distribution are considered.

In order to enhance the arrangement precision of patterns on the target workpiece, it is needed to perform grid matching sufficiently precisely. Accordingly, it is required to calculate a position displacement amount distribution p(x,y) (or called a position displacement amount distribution) highly accurately.

Then, a method for calculating the position displacement amount distribution p(x,y) will now be explained.

First, with reference to FIG. 26, a calculation method of the position displacement amount distribution will be described using a comparative example of Embodiment 2.

Figure 27:
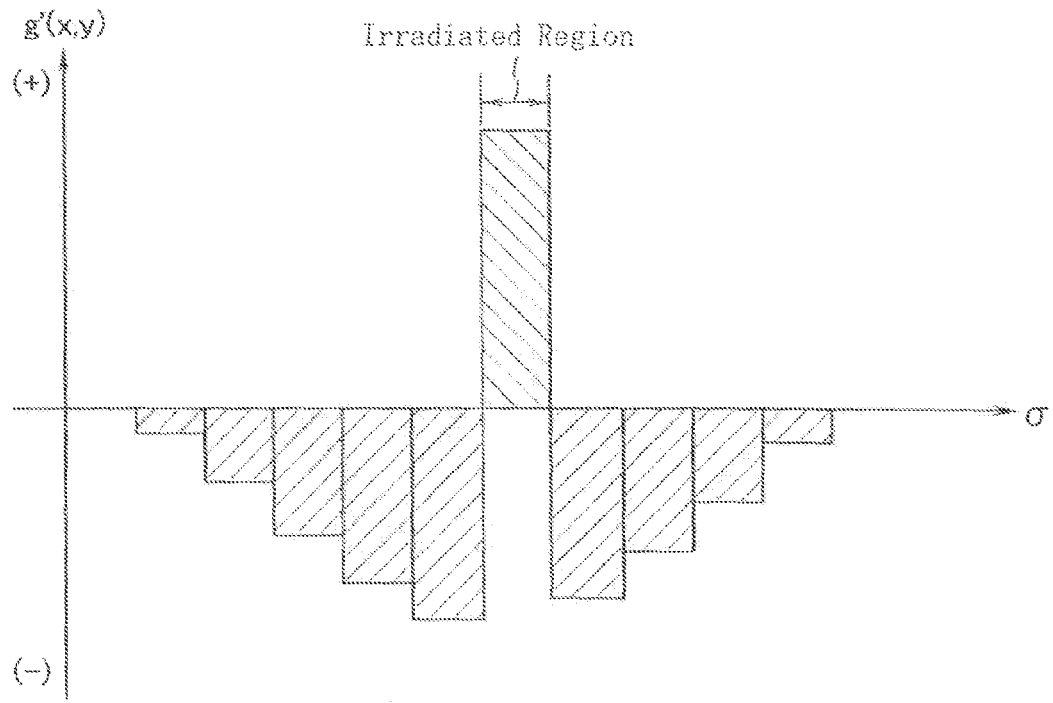
FIG. 27 shows a function $g'(x,y)$ which describes a spread distribution.

In the comparative example, it is assumed that there is a function g'(x,y) which describes a spread distribution of electrons (charge amount) for a certain irradiation amount distribution E(x,y). As this function g'(x,y), for example, a model of the Gaussian distribution can be used which is positively charged in the electron beam irradiated region and negatively charged in the non-irradiated region as shown in FIG. 27. Then, by performing convolution of the irradiation amount distribution E(x,y) with the spread distribution function g'(x,y), it is possible to obtain a charge amount distribution C(x,y).

Next, there will be assumed a response function r(x,y) which converts the charge amount distribution C(x,y) into the position displacement amount distribution p(x,y). Here, since the position displacement of a beam can be expressed as a function of the distance from a beam irradiation position (x,y) to a charged position (x',y'), the response function can be described as r(x-x',y-y').

Figure 28:
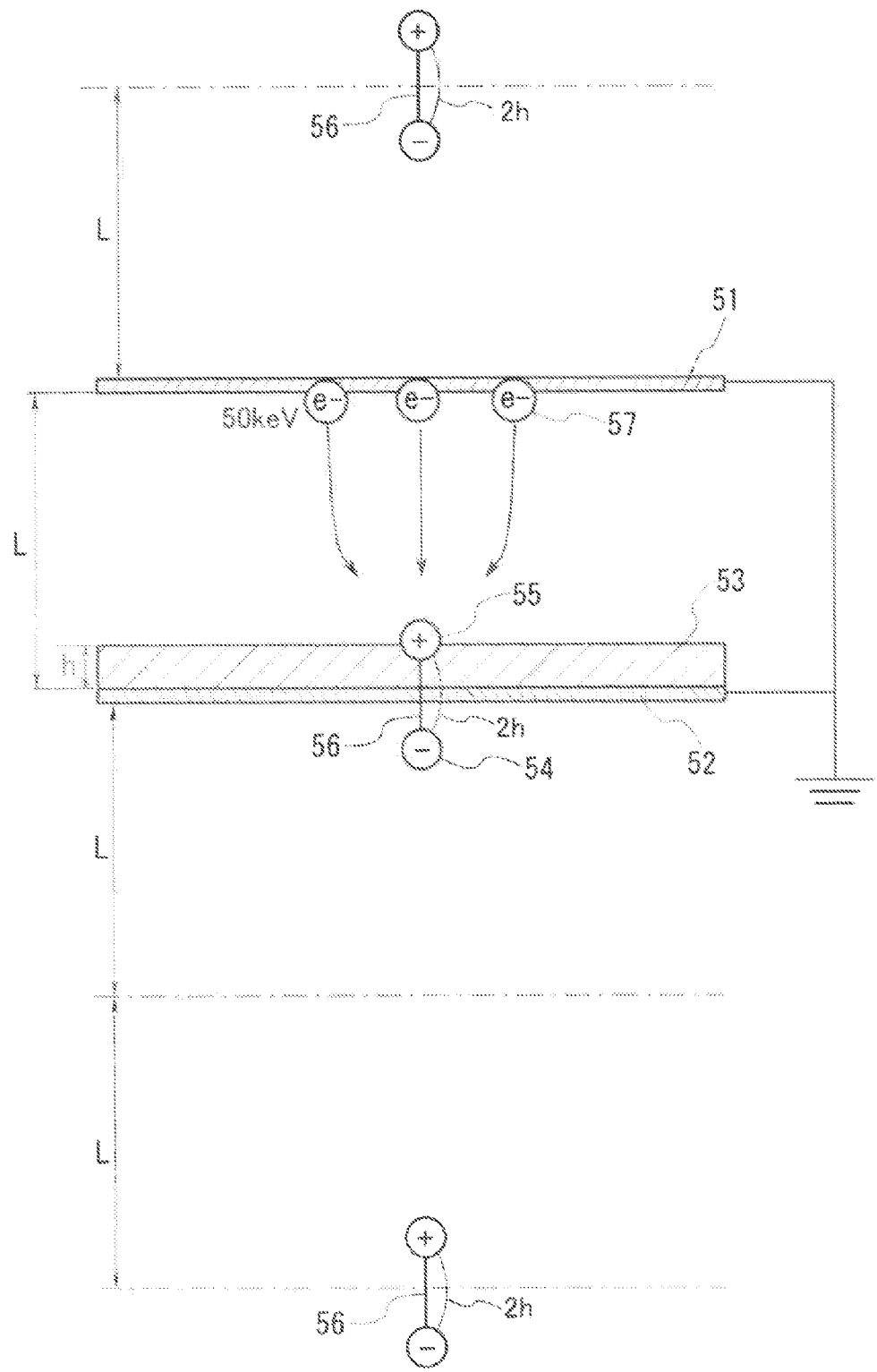
FIG. 28 shows a model assumed in order to calculate a response function.

FIG. 28 shows a model assumed in order to calculate the response function r(x,y). As shown in FIG. 28, two parallel plates 51 and 52 both of which are grounded to 0 V are arranged with having a distance L in between. The upper plate 51 corresponds to a wall of the writing unit 1, concretely a block of the objective lens 12, and the lower plate 52 corresponds to a chromium layer of the photomask. The two plates 51 and 52 are considered to be perfect conductors. A point charge source 55 is located on the surface of a resist 53 having a film thickness h. Since the conductive chromium layer 52 can be regarded as a mirror in the static potential calculation, a mirror image charge 54 is located below the chromium layer 52 by an equal distance –h. Charge of the point charge source 55 and mirror charge of the mirror image charge 54 actually operate in a pair as a dipole 56. Since the conductive upper plate 51 can also be regarded as a mirror, one pair of the dipole 56 of an infinite number is arranged at a pitch of 2 L. In an actual calculation, the number of the dipoles 56 is cut off to a certain practical limit. The orbit of the electron 57 accelerated at 50 keV is calculated by solving a motion equation, and a final displacement of the position of an electron at the time of reaching the resist 53 surface can be obtained as a beam position error with respect to a given incident position.

According to this assumption, the position displacement amount distribution p(x,y) can be calculated by performing convolution of the response function r(x,y) with the charge amount distribution C(x,y). That is, the position displacement amount distribution p(x,y) can be obtained by performing convolution of the response function r(x,y), the charge distribution function g'(x,y) and the irradiation amount distribution E(x,y).

Figure 26:
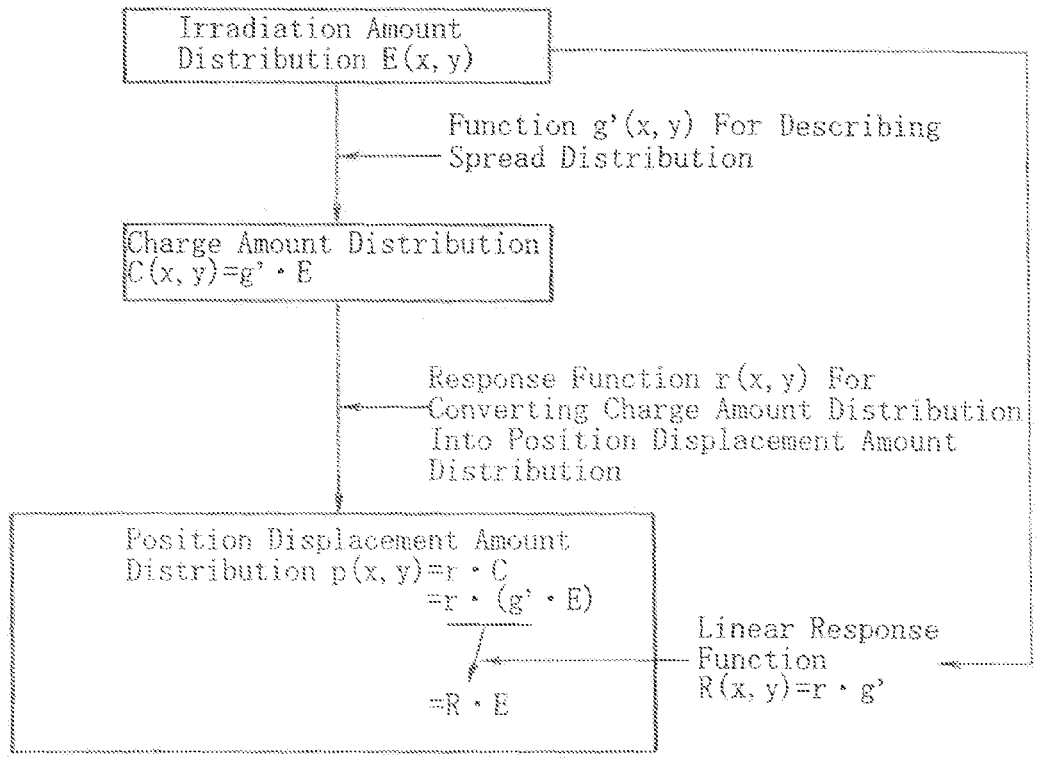
FIG. 26 shows a calculation method of a position displacement amount distribution, using a comparative example of the Embodiment.

Now, if it is assumed that there is a linearly proportional relationship between the irradiation amount distribution E(x,y) and the position displacement amount distribution p(x,y), the position displacement amount distribution p(x,y) can be obtained by performing convolution of the linear response function R(x,y) with the irradiation amount distribution E(x,y) as shown in FIG. 26. That is, according to the comparative example, since the position displacement amount distribution p(x,y) is directly led from the irradiation amount distribution E(x,y) through the linear response function R(x,y), calculating the charge amount distribution C(x,y) can be skipped.

However, according to examinations of the inventors of the present invention, it has turned out that the position displacement amount distribution p(x,y) obtained by the above-mentioned comparative example differs from the result of the experiment.

Figure 29A:
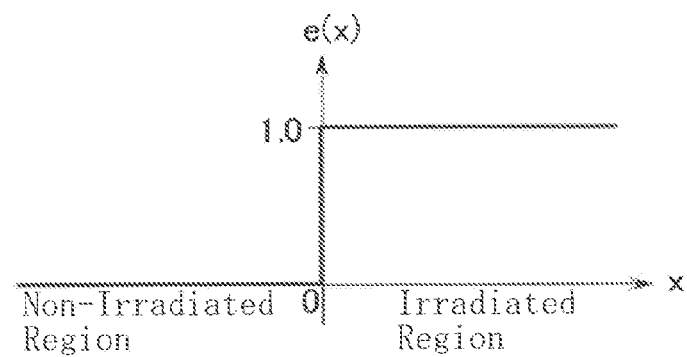
FIG. 29A shows a first-order step function given at the time of examination of a comparative example.
Figure 29B:
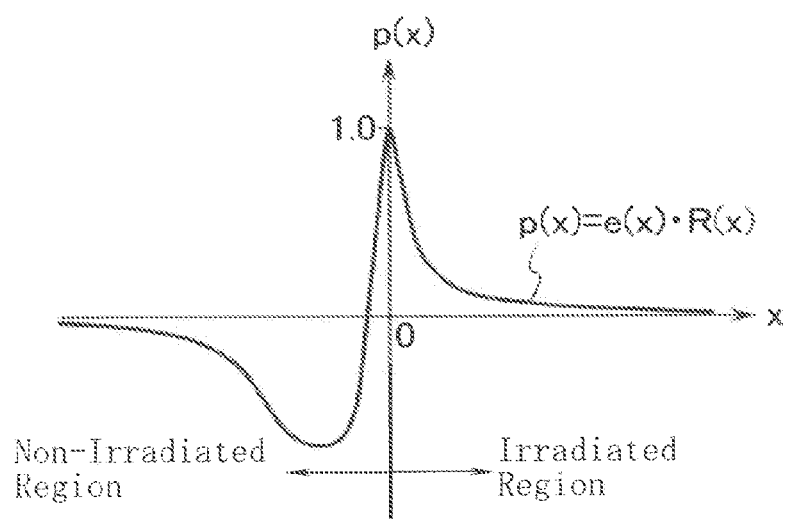
FIG. 29B shows a position displacement amount distribution $p(x)$ calculated by using a comparative example.
Figure 30:
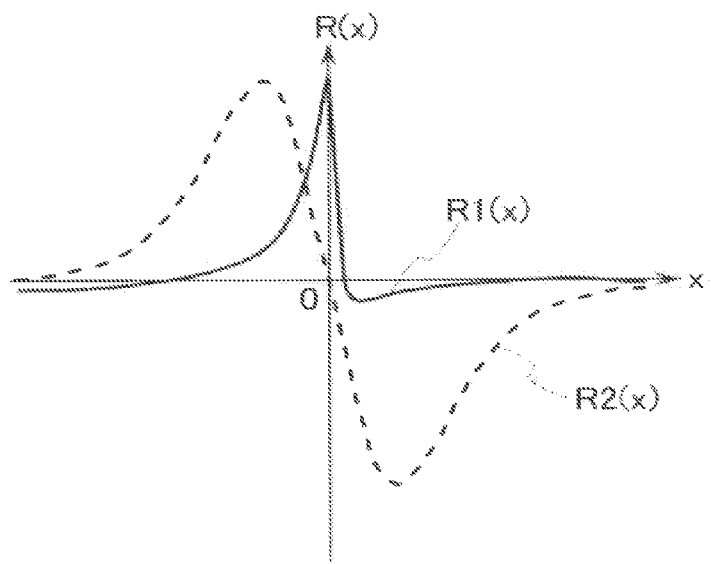
FIG. 30 shows a linear response function $R1(x)$ calculated at the time of examination of a comparative example.

With reference to FIGS. 29A, 29B, and 30, the method for calculating a position displacement amount distribution according to the above comparative example will now be verified.

In verifying the calculation method of a position displacement amount distribution based on the above comparative example, first, a first-order step function is given as an irradiation amount distribution e(x) as shown in FIG. 29A. According to this function, the amount of irradiation in an irradiated region is 1 and the amount of irradiation in a non-irradiated region is 0.

In the comparative example, as shown in FIG. 29B, a position displacement amount distribution p(x) is calculated by performing convolution of this irradiation amount distribution e(x) with a linear response function R(x). Therefore, the linear response function R(x) can be obtained by differentiating the position displacement amount distribution p(x). As shown in FIG. 30, it is found out that a linear response function $R1(x)$ calculated by differentiating the position displacement amount distribution p(x) is different from a desired response function $R2(x)$, and is rotationally asymmetric at the boundary between the irradiated region and the non-irradiated region. Thus, it has turned out that the assumption of the linearly proportional relationship in the above comparative example is not established.

Then, the present inventor has found out a new model for calculating a position displacement amount distribution without using the linear response function R(x).

Figure 31A:
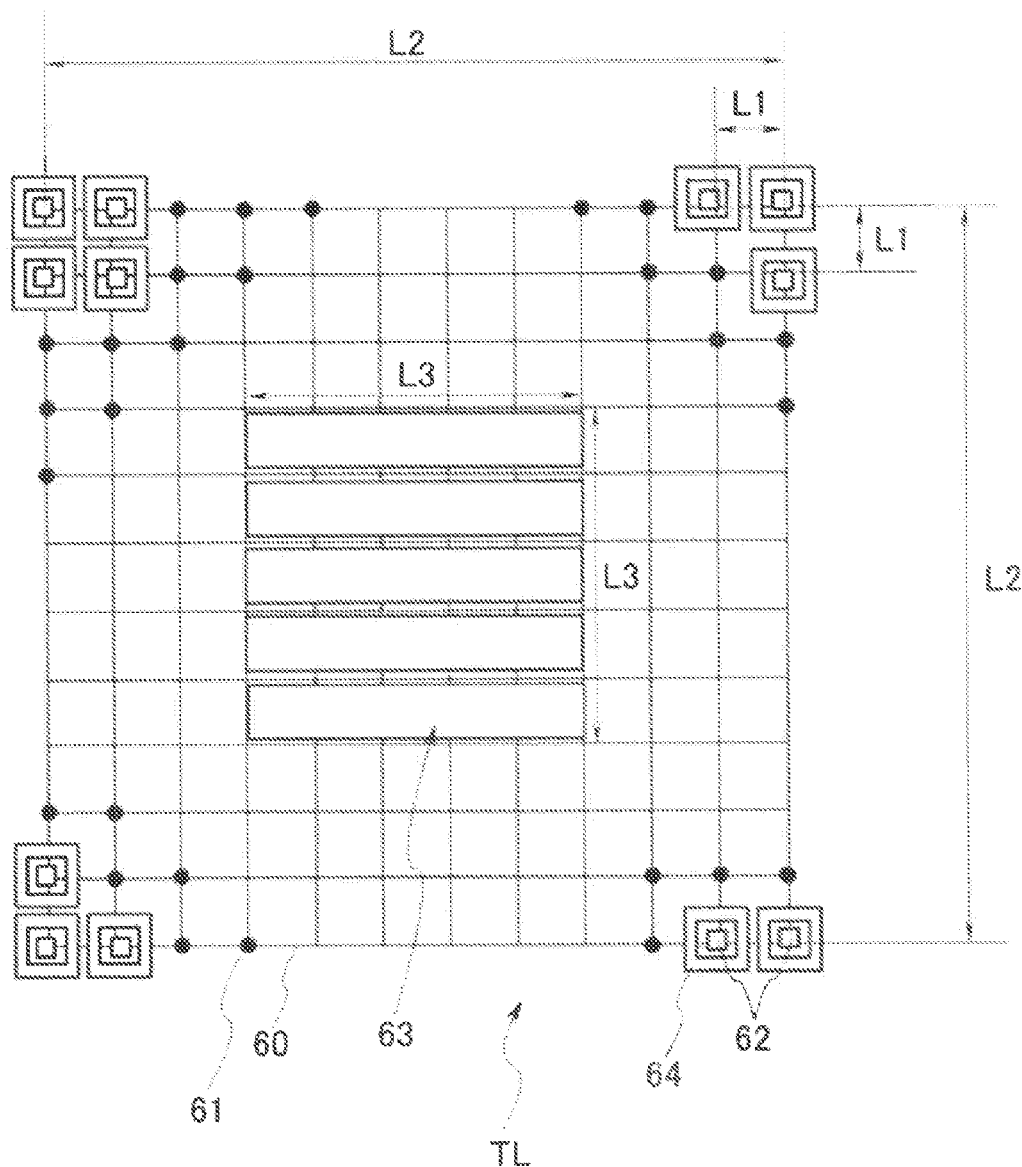
FIG. 31A shows a test layout for measuring a resist charging effect.
Figure 31B:
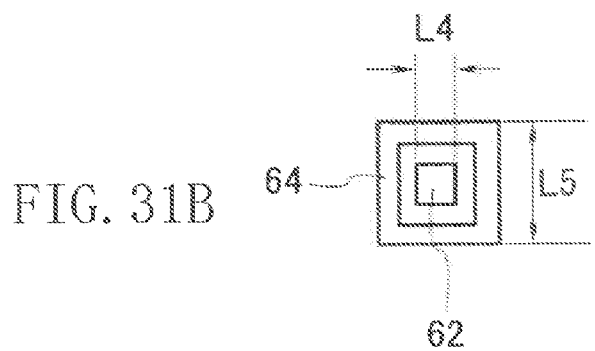
FIG. 31B shows enlarged first and second box arrays.

First, the present inventor measured a resist charging effect. FIGS. 31A and 31B show test layouts used for measuring the resist charging effect. In FIGS. 31A and 31B, different scale sizes are used for making the contents of each part more understandable.

A test layout TL shown in FIG. 31A can be acquired by writing a first box array 62 with an irradiation amount of 12 $\mu C/cm^2$, on a grid (81×81 grids) 60 whose pitch L1 is 1 mm and whose total length L2 is 80 mm, then writing an irradiation pad 63, whose side length L3 is 40 mm and pattern density is 100%, with an irradiation amount of 21 $\mu C/cm^2$ in the center of the layout TL, and further writing a second box array 64 with an irradiation amount of 12 $\mu C/cm^2$ on the same grid 60 as that of the first box array 62.

As an enlarged one is shown in FIG. 31B, the first box array 62 is, for example, a pattern of a square whose length L4 is 4 $\mu m$. The second box array 64 is, for example, a pattern of a frame type whose length L5 is 14 $\mu m$ and which has an opening larger than the first box array 62 therein.

Now, the test layout TL is formed changing the pattern density of the irradiation pad 63 to be 100%, 75%, 50%, and 25%, respectively. FIGS. 32A, 32B, 33A and 33B show irradiation pads 63A, 63B, 63C, and 63D whose pattern densities are 100%, 75%, 50%, and 25%, respectively.

Figure 32A:
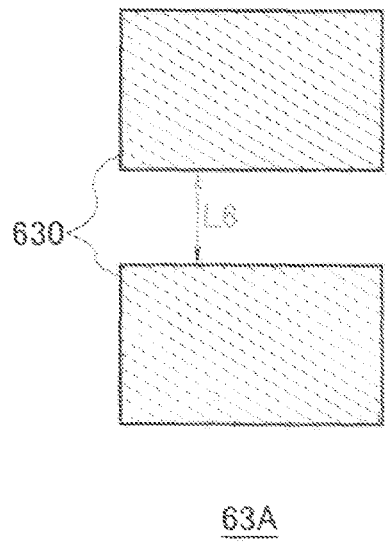
FIG. 32A shows an irradiation pad whose pattern density is 100%.
Figure 32B:
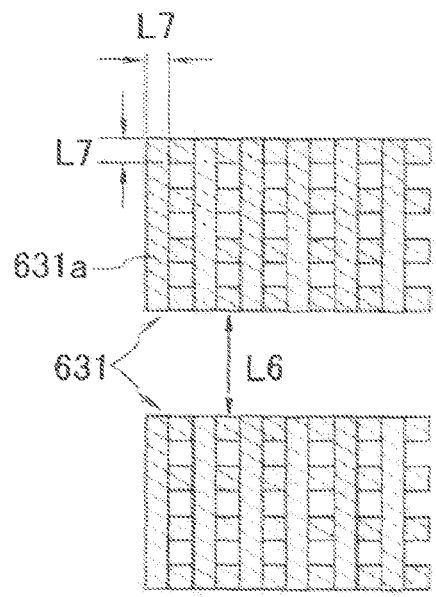
FIG. 32B shows an irradiation pad whose pattern density is 75%.
Figure 33A:
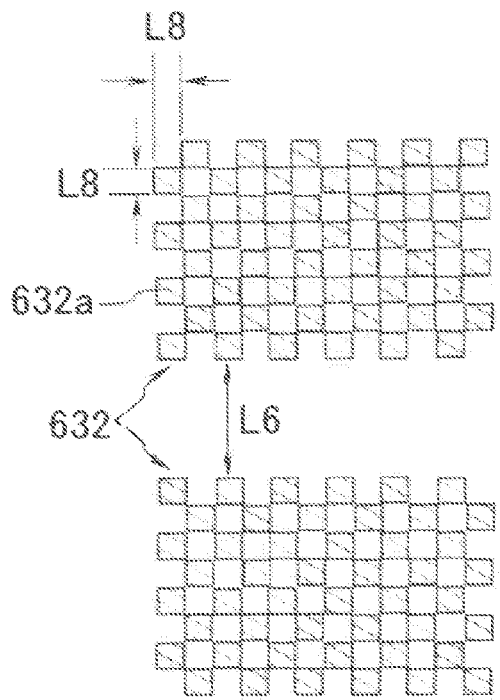
FIG. 33A shows an irradiation pad whose pattern density is 50%.
Figure 33B:
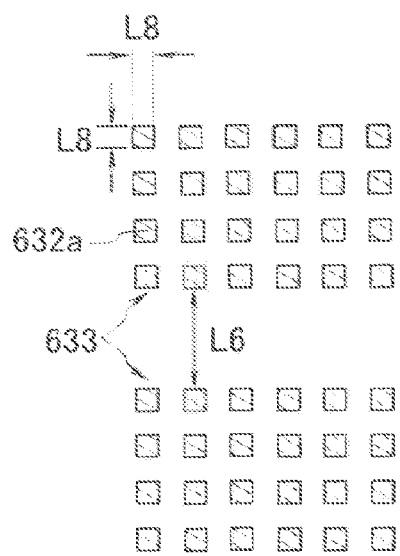
FIG. 33B shows an irradiation pad whose pattern density is 25%.

The irradiation pad 63A shown in FIG. 32A is composed of a plurality of quadrangular patterns 630 having a distance L6 in between each other. This distance L6 is 20 $\mu m$, for example. The irradiation pad 63B shown in FIG. 32B is composed of a plurality of patterns 631 having the distance L6 in between each other. Each pattern 631 is formed by crossing a plurality of line patterns 631a each having a short side length L7 of 4 $\mu m$, for example. The irradiation pad 63C shown in FIG. 33A is composed of a plurality of patterns 632 having the distance L6 in between each other. Each pattern 632 has a plurality of square patterns 632a each having a side length L8 of 4 $\mu m$, for example. The irradiation pad 63D shown in FIG. 33B is composed of a plurality of patterns 633 having the distance L6 in between each other. Each pattern 633 is composed of a plurality of patterns 632a whose number is half the number of the patterns 632a composing the pattern 632.

A position displacement of the irradiation pad 63 caused by charging effect can be measured by measuring the positions of the first and second box arrays 62 and 64 written above, using a resist image measurement method, and subtracting the position of the first box array 62 from the position of the second box array 64. In Embodiment 2, in order to shorten the measuring time, the position displacement of the two box arrays 62 and 64 written on a 41×41 grid of 2 mm pitch of the 81×81 grid shown in FIGS. 31A and 31B.

As shown in FIG. 24, in Embodiment 2, test layouts TL are formed changing the pattern density of the irradiation pad 63 to be 100%, 75%, 50%, and 25%, respectively, for four chemically amplified resists A to D with respect to the cases of fixing a dose D to be 21 $\mu C/cm^2$ regardless of a pattern density $\rho$, and of changing the dose D according to the pattern density $\rho$. Then, each position displacement is measured for each of the test layouts TL.

Figure 34A:
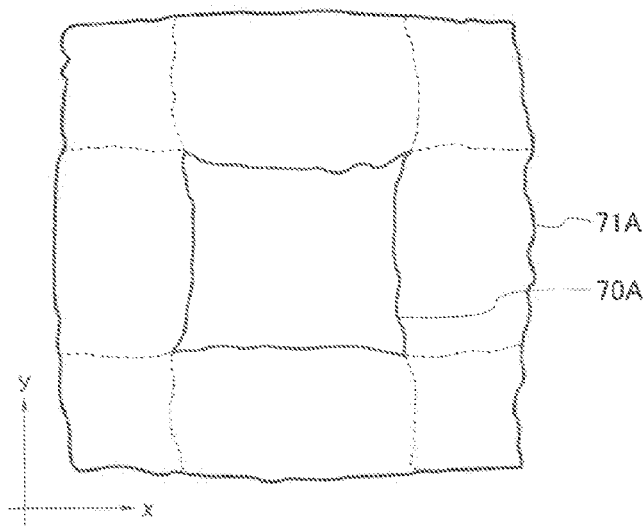
FIG. 34A is a schematic diagram showing a measurement result of a position displacement with respect to a chemically amplified resist A.
Figure 34B:
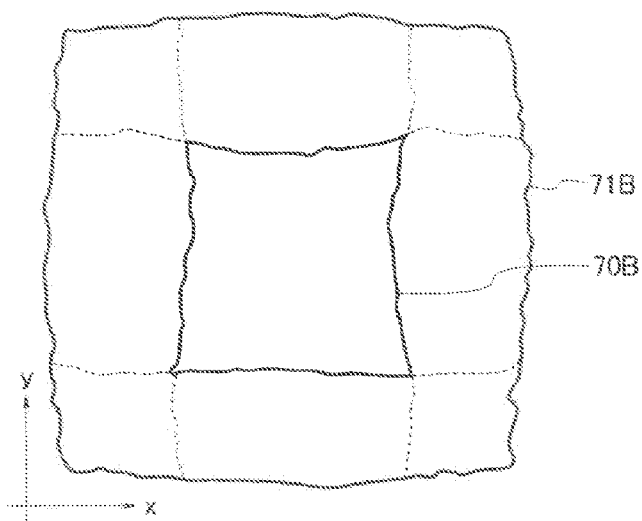
FIG. 34B is a schematic diagram showing a measurement result of a position displacement with respect to a chemically amplified resist B.
Figure 34C:
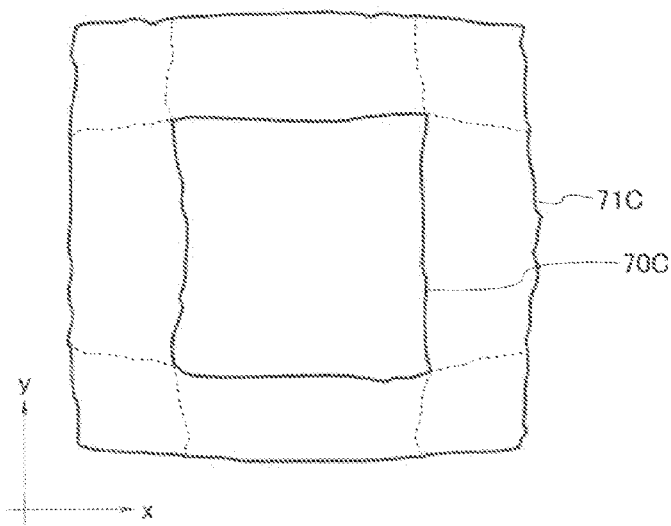
FIG. 34C is a schematic diagram showing a measurement result of a position displacement with respect to a chemically amplified resist C.

The measurement results of the position displacement caused by charging effect are shown in FIGS. 34A to 34C. Schematically, FIGS. 34A to 34C show position displacement with respect to resists A, B, and C of three types when the dose D is fixed in the case of the vicinity of the boundary between an irradiated region and a non-irradiated region and in the case of the periphery of a non-irradiated region.

As shown in FIGS. 34A to 34C, there occurred position displacements 71A, 71B, and 71C, which look as if they were expanding outside, in the periphery of the non-irradiated region of each of the resists A, B, and C of three types.

On the other hand, as shown in FIGS. 34A and 34B, there occurred position displacements 70A and 70B, which are in the direction of the inside of the irradiated regions, in the vicinity of the boundary between the irradiated region and the non-irradiated region of the resists A and B. The position displacements 70A and 70B differ from each other in that the position displacement 70A of the resist A is almost symmetrical both vertically and horizontally, whereas the position displacement 70B of the resist B is vertically asymmetrical. Moreover, unlike the cases of the resists A and B, as shown in FIG. 34C, the position displacement 70C of the resist C has almost no position displacement in the direction of the inside of the irradiated region.

Figure 35A:
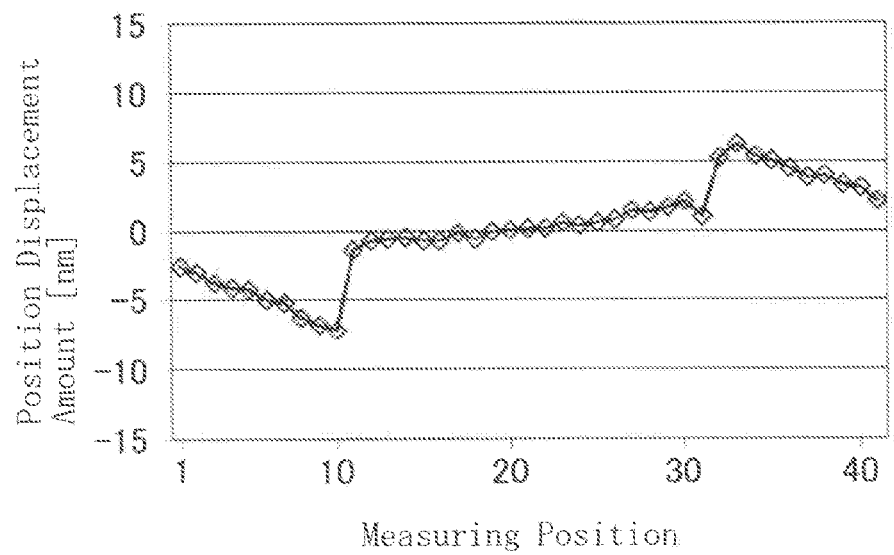
FIG. 35A shows a plotted graph of position displacement in the X direction in the case of pattern density 25% of the resist A.
Figure 35B:
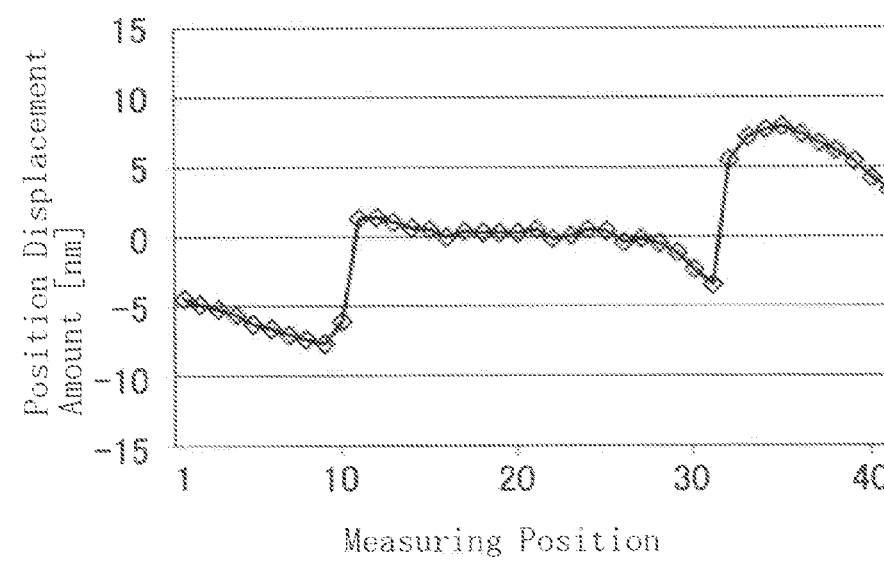
FIG. 35B shows a plotted graph of position displacement in the X direction in the case of pattern density 50% of the resist A.
Figure 36A:
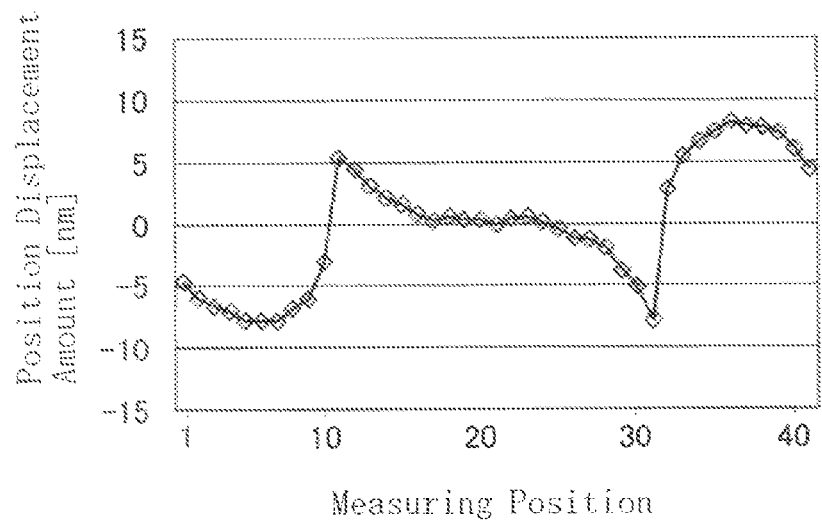
FIG. 36A shows a plotted graph of position displacement in the X direction in the case of pattern density 75% of the resist A.
Figure 36B:
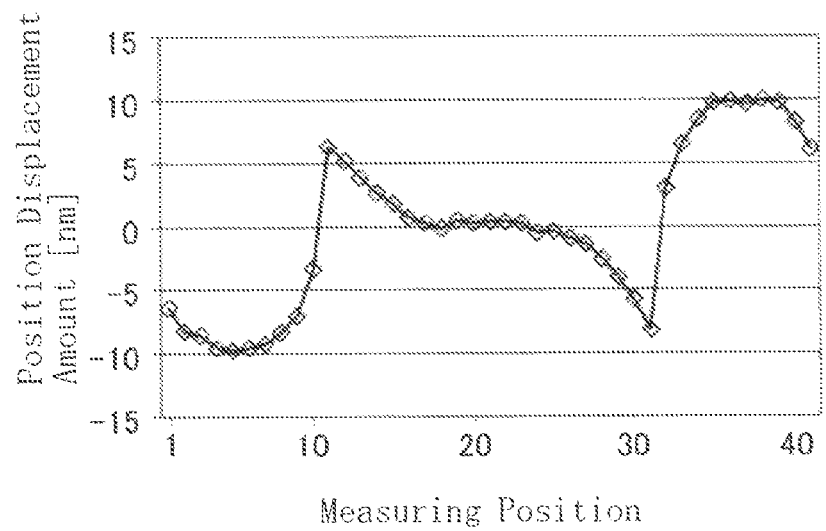
FIG. 36B shows a plotted graph of position displacement in the X direction in the case of pattern density 100% of the resist A.
Figure 37A:
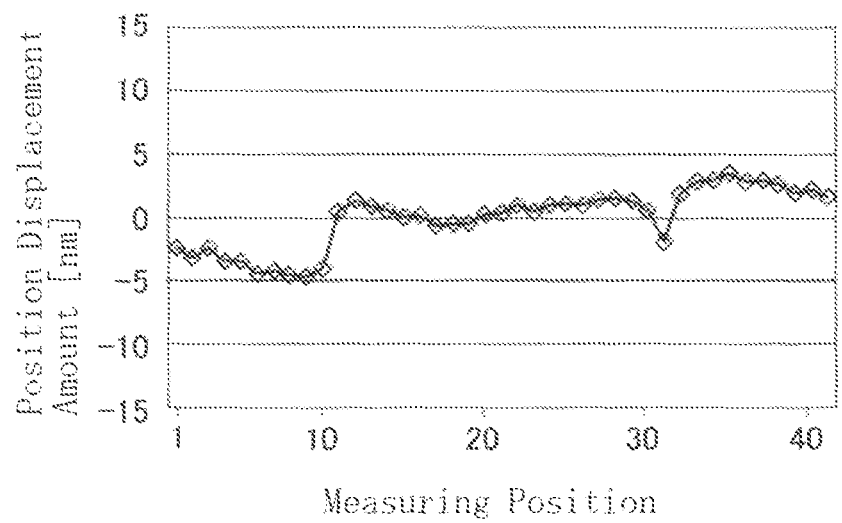
FIG. 37A shows a plotted graph of position displacement in the X direction in the case of pattern density 25% of the resist B.
Figure 37B:
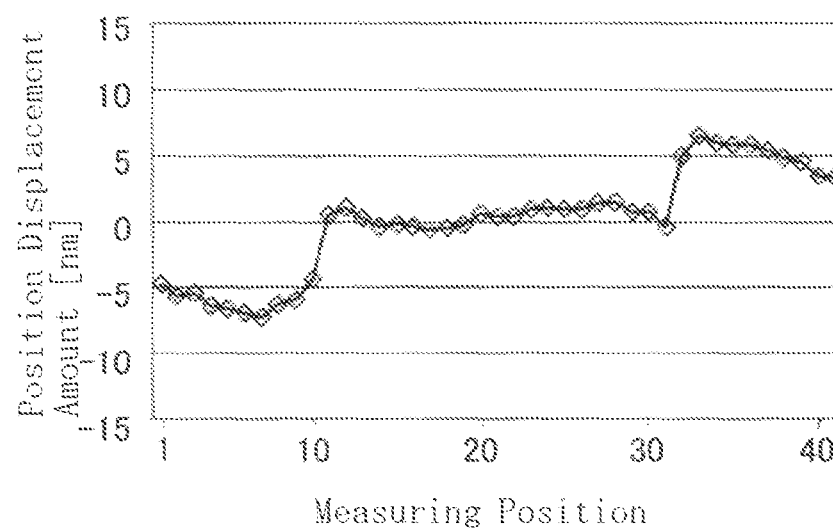
FIG. 37B shows a plotted graph of position displacement in the X direction in the case of pattern density 50% of the resist B.
Figure 38A:
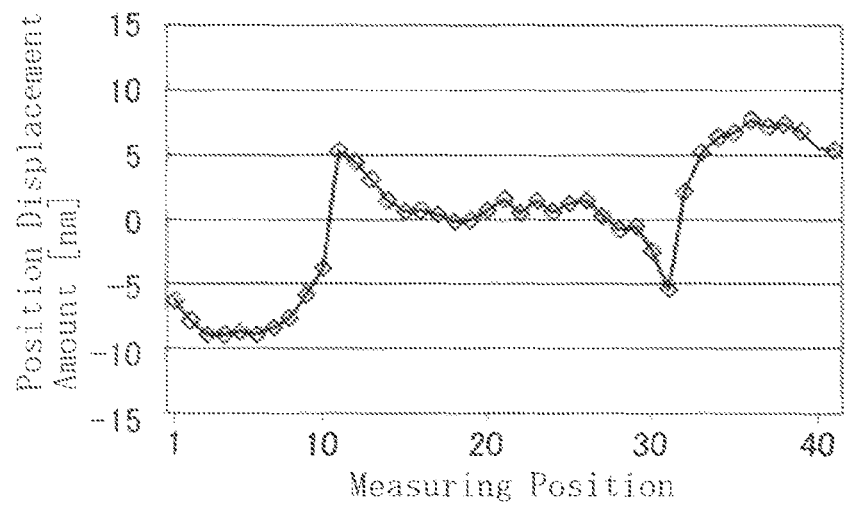
FIG. 38A shows a plotted graph of position displacement in the X direction in the case of pattern density 75% of the resist B.
Figure 38B:
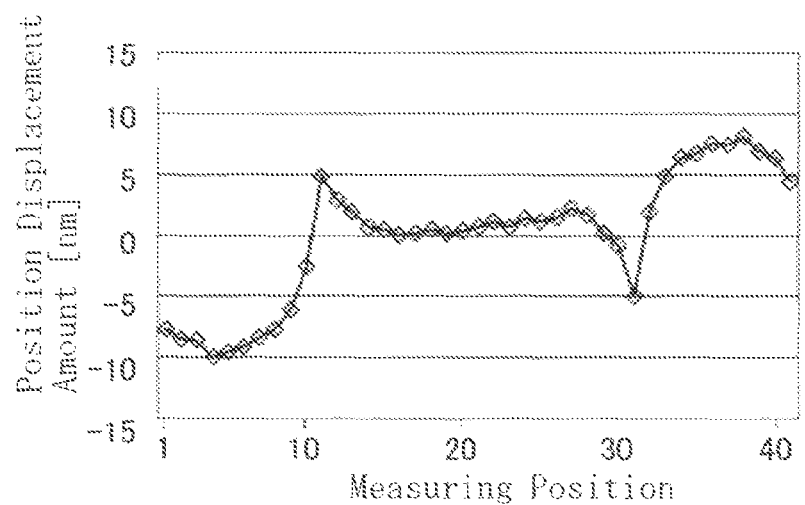
FIG. 38B shows a plotted graph of position displacement in the X direction in the case of pattern density 100% of the resist B.
Figure 39A:
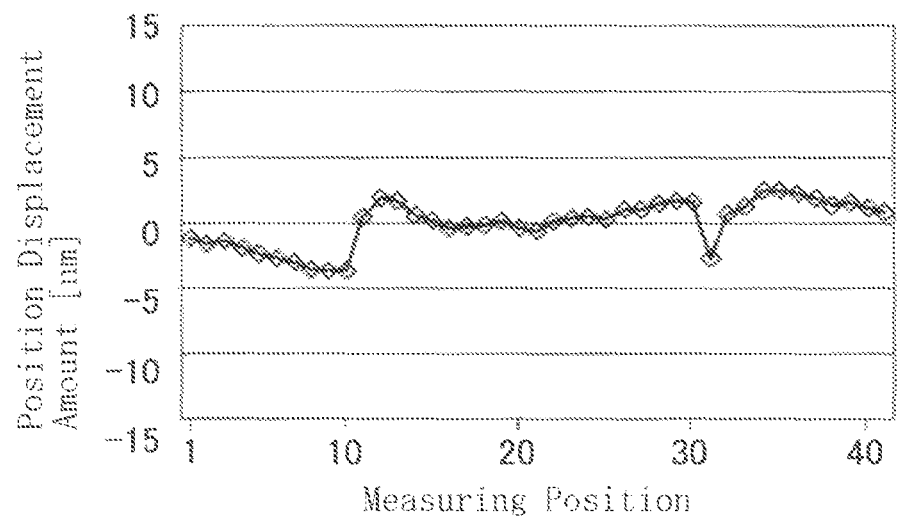
FIG. 39A shows a plotted graph of position displacement in the X direction in the case of pattern density 25% of the resist C.
Figure 39B:
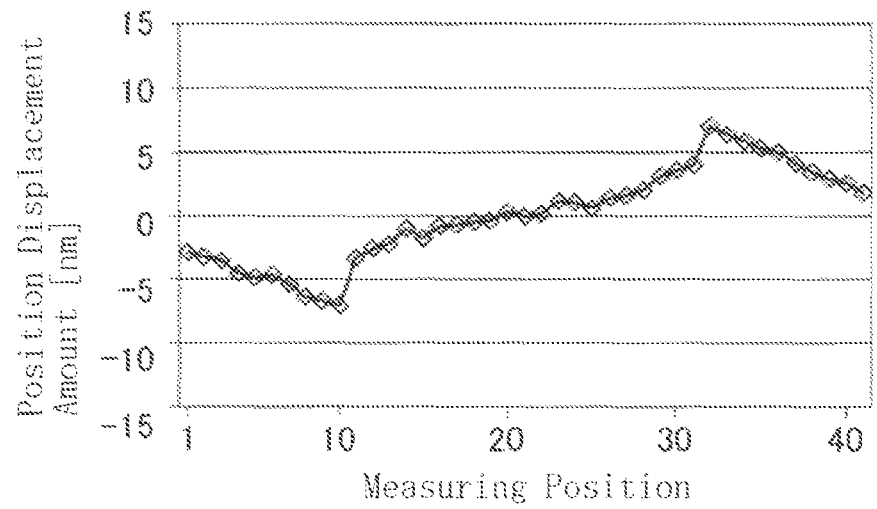
FIG. 39B shows a plotted graph of position displacement in the X direction in the case of pattern density 50% of the resist C.
Figure 40A:
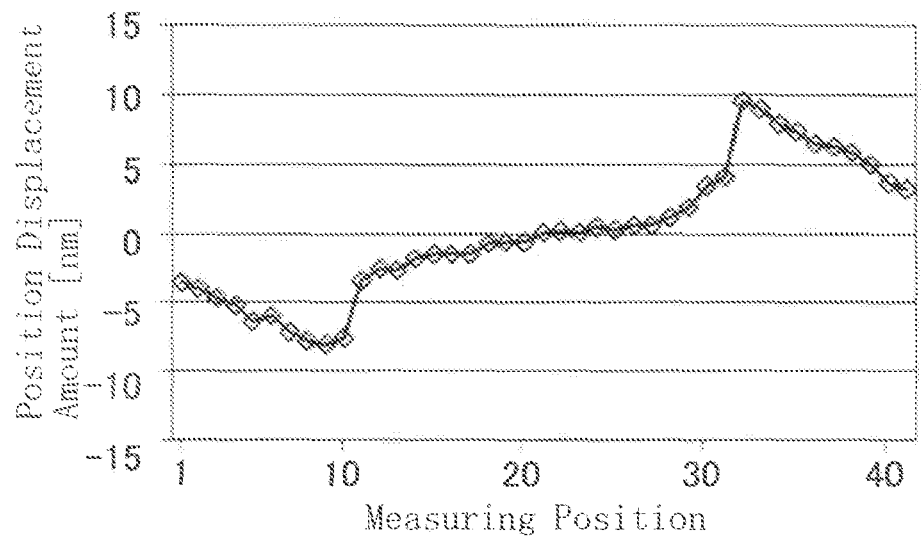
FIG. 40A shows a plotted graph of position displacement in the X direction in the case of pattern density 75% of the resist C.
Figure 40B:
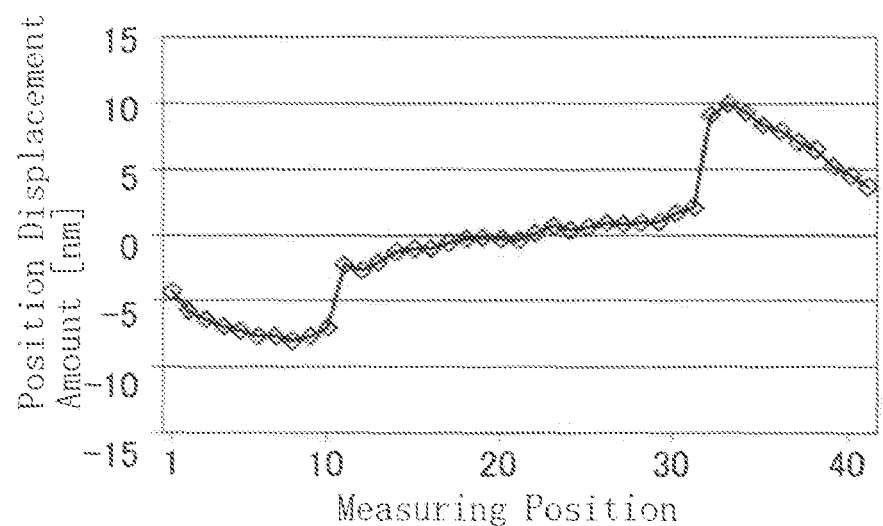
FIG. 40B shows a plotted graph of position displacement in the X direction in the case of pattern density 100% of the resist C.

FIGS. 35A to 35B, 36A to 36B, 37A to 37B, 38A to 38B, 39A to 39B, and 40A to 40B respectively show position displacements in the X direction obtained from the average of eleven rows, with respect to the resists A, B, and C of three types, in the case of the dose being constant (21 $\mu C/cm^2$) regardless of the pattern density. FIGS. 35A to 35B and 40A to 40B respectively show plotted graphs of position displacements in the X direction obtained from the average of eleven rows of the 31st row, the 33rd row, ..., the 49th row, and the 51st row of the 81×81 grid. FIGS. 35A, 37A, and 39A show position displacements in the case of the pattern density of the irradiation pad 63 being 25%, and FIGS. 35B, 37B, and 39B show position displacements in the case of the pattern density of the irradiation pad 63 being 50%. FIGS. 36A, 38A, and 40A show position displacements in the case of the pattern density of the irradiation pad 63 being 75%, and FIGS. 36B, 38B, and 40B show position displacements in the case of the pattern density of the irradiation pad 63 being 100%.

According to the results shown in FIGS. 35A to 35B and 40A to 40B, it has turned out that the higher the pattern density shown in FIG. 27 and can be expressed by the following equation (2-2).

$$g(x,y)=(1/\pi\sigma^2)\times\exp\{-(x^2+y^2)/\sigma^2\} \quad (2\text{-}2)$$

Then, as expressed in the following equation (2-3), a fogging electron amount distribution (also called a fogging electron amount intensity) $F(x,y,\sigma)$ can be calculated by performing convolution of the spread distribution function $g(x,y)$ with the irradiation amount distribution $E(x,y)$.

$$F(x,y,\sigma)=\iint g(x-x'',y-y'')E(x'',y'')dx''dy'' \quad (2\text{-}3)$$

Then, there will be explained a calculation of the elapsed time $T(x,y)$ after writing which is performed in the step S107 shown in FIGS. 22 and 23. The calculation of the elapsed time $T(x,y)$ after writing is the same as the elapsed time $T(x,y)$ after writing calculation step (S214) in Embodiment 1 when reading the writing elapsed time calculation unit 116 as the writing elapsed time calculation unit 37.

Next, there will be explained a calculation of the accumulated time t which is performed in the step S108 shown in FIGS. 22 and 23. The calculation of the accumulated time t is the same the accumulated time t calculation step (S216) in Embodiment 1 when reading the accumulated time calculation unit 118 as the accumulated time calculation unit 38.

Next, there will be explained a calculation of the charge amount distribution $C(x,y)$ which is performed in the step S109 shown in FIGS. 22 and 23.

In the above step S109, first, it is assumed that there is a function $C(E,F)$ for obtaining a charge amount distribution $C(x,y)$ from the irradiation amount distribution $E(x,y)$ and the fogging electron amount distribution $F(x,y,\sigma)$. This assumed function $C(E,F)$ is separated into a variable $C_E(E)$ to which an irradiation electron contributes, and a variable $C_F(F)$ to which a fogging electron contributes, as expressed in the following equation (2-4).

$$C(E,F)=C_E(E)+C_F(F) \quad (2\text{-}4)$$

is, the larger the position displacement amount is, and that position displacement amounts are various when the types of resists are different even when the pattern density is the same.

Figure 41:
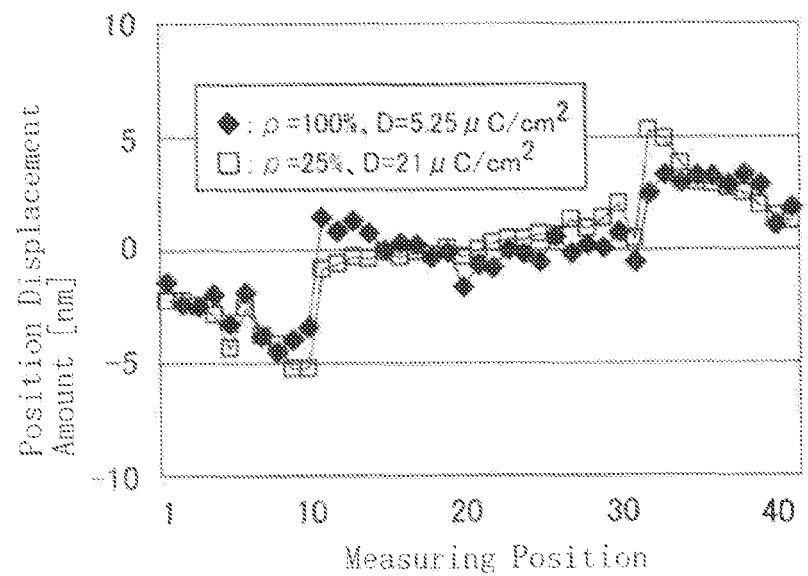
FIG. 41 shows, with respect to the resist A, a position displacement amount in the case of the pattern density $\rho$ being 25% and the dose D being 21 $\mu C/cm^2$, and a position displacement amount in the case of the pattern density $\rho$ being 100% and the dose D being 5.25 $\mu C/cm^2$.

FIG. 41 shows, with respect to the resist A, both an X direction position displacement amount in the case of the pattern density ρ being 25% and the dose D being fixed to 21 μC/cm², and an X direction position displacement amount in the case of the pattern density ρ being 100% and the dose D being 5.25 μC/cm². Since the irradiation amount E can be obtained by multiplying the pattern density ρ and the dose D as mentioned above, the irradiation amounts E in the above two cases are equivalent. Therefore, it can be thought that the position displacement amounts in the two cases may be equivalent, but however, both the position displacement amounts are different from each other as shown in FIG. 41. The reason for this can be considered that such a difference in position displacement comes from the difference between the case of the dose D being fixed to 21 μC/cm² without reference to the pattern density ρ and the case of changing the dose (5.25 μC/cm²) in accordance with the pattern density ρ. Therefore, in order to highly precisely calculate a position displacement amount distribution, it is necessary to increase the precision of calculation of the irradiation amount distribution. Accordingly, it is preferable to calculate the dose distribution $D(x,y)$ according to the pattern density ρ as performed in the step S102 of FIG. 22.

Next, in order to calculate a position displacement amount distribution using which the above-mentioned measurement result can be explained, the method of calculating a fogging electron amount distribution $F(x,y,\sigma)$ performed in the step S106 shown in FIGS. 22 and 23 will now be described.

Figure 42A:
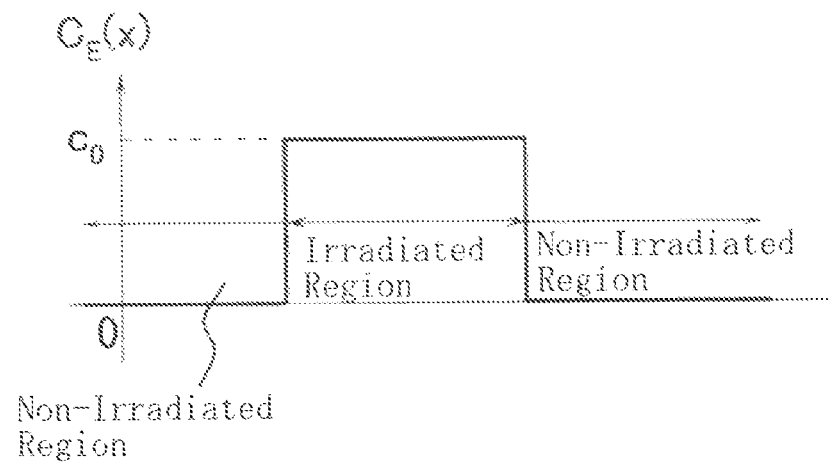
FIG. 42A shows a function of a charge amount distribution of an irradiated region.
Figure 42B:
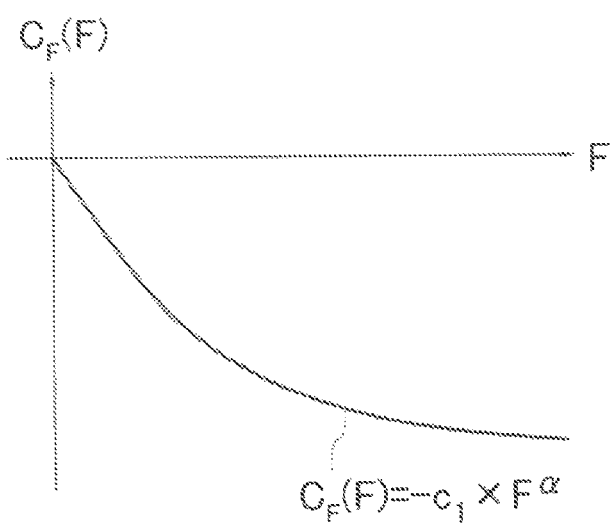
FIG. 42B shows a function of a charge amount distribution of a non-irradiated region.

In the step S106, first, it is assumed that there is a function $g(x,y)$ which describes a spread distribution of fogging electrons, with respect to the irradiation amount distribution $E(x,y)$. Similarly to the above-mentioned comparative example, this function $g(x,y)$ is a model of the Gaussian distribution as Furthermore, the function for the irradiated region has been assumed to be a variable $C_F(F)=0$, namely $C(E,F)=C_E(E)$. On the other hand, the function for the non-irradiated region has been assumed to be a variable $C_E(E)=0$, namely $C(E,F)=C_F(F)$. As shown in FIG. 42A, the area within the irradiated region has been assumed to be uniformly charged, namely $C_E(E)=c_o$. This $c_o$ is a constant, for example, 1. In the non-irradiated region as shown in FIG. 42B, the larger the fogging electron amount intensity F becomes, the more saturated the charge $C_F(F)$ becomes. Then, the variable $C_F(F)$ of the non-irradiated region is expressed by the following equation (2-5).

$$C_F(F)=-c_1\times F^\alpha \quad (2\text{-}5)$$

α in the equation (2-5) satisfies the condition of 0<α<1. According to the experiment performed by the present inventor, it has turned out that it is preferable when α is greater than or equal to 0.3 and less than or equal to 0.4 because it becomes closest to the experimental result. This suitable range of α is changeable depending upon the electron beam pattern writing apparatus to be used.

Here, the reason for specifying the function $C_F(F)$ as expressed in the equation (2-5) will be explained.

As shown in FIGS. 35A to 35B and 40A to 40B, the measurement results of position displacements can be obtained with respect to four pattern densities (100%, 75%, 50%, and 25%). If defining the fogging electron amount intensity F in the case of the pattern density 100% to be $F_{100}$, the fogging electron amount intensity at each pattern density becomes $F_{100}$, $0.75\times F_{100}$, $0.5\times F_{100}$, and $0.25\times F_{100}$, respectively, in proportion to the pattern density. However, $C_F(F)$ is an unknown function. Therefore, there is a possibility that $C_F(F_{100})$, $C_F(0.75\times F_{100})$, $C_F(0.5\times F_{100})$, and $C_F(0.25\times F_{100})$ are not strongly proportional and have different distribution shapes according to the pattern density. Thus, when the distribution shapes are different according to each pattern density, $C_F(F)$ needs to be specified for each pattern density, so that it becomes inconvenient in performing analysis.

Then, the function $C_F(F)$ is determined for an arbitrary F such that a distribution of a similar shape is obtained even if the pattern density is changed. That is, the function $C_F(F)$ is specified to satisfy the relation of the following equation (2-6). a in the equation (2-6) indicates a pattern density, and A indicates a constant.

$$C_F(aF)/C_F(F)=A \quad (2\text{-}6)$$

As long as it is a similarity function, the shape of distribution does not change even if the strength of the whole of $C_F(F)$ is not in proportion. The strength can be adjusted by a combination of the parameters $c_0$ and $c_1$. Therefore, since what is necessary is not to specify $C_F(F)$ for each pattern density but just to specify one $C_F(F)$ for one σ, thereby simplifying the analysis.

Figure 43:
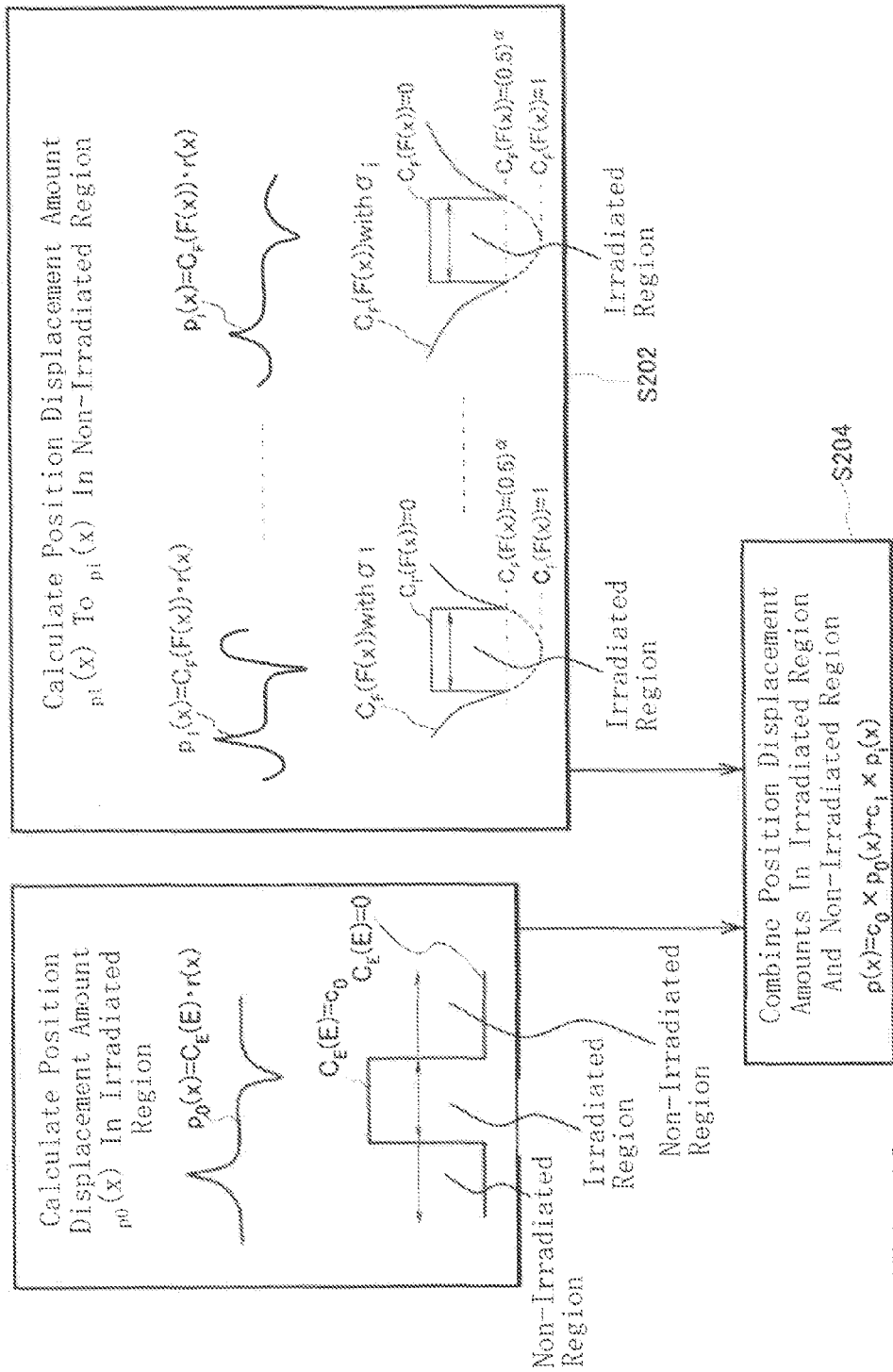
FIG. 43 is a figure for explaining a method of obtaining an optimal combination of parameters $c_0$, $c_1$, and $\sigma_f$.

Next, with reference to FIG. 43, the optimal combination of the parameters $c_0$, $c_1$, and $\sigma_i$ is determined. Assuming, with respect to an irradiated region, there exists a charge amount distribution $C_E(E)$ of the size of $c_o$ and the shape of a step, a position displacement amount $p_0(x)$ is calculated by performing convolution of the charge amount distribution $C_E(E)$ with a response function r(x) which has been calculated in advance, as shown in FIG. 43 (Step S200).

With respect to a non-irradiated region, $C_F(F)$ is calculated assuming that there exists a certain α and a fogging electron spread radius (hereinafter called a fogging radius) σ (Step S202). The $C_F(F)$ is calculated for a plurality of fogging radii σ. For example, the fogging radius σ is assumed to be from 1 mm to 24 mm at intervals of 1 mm. Then, position displacement amounts $p_1(x)$ to $p_i(x)$ are calculated by using charge amount distributions $C_F(F)$ and response functions r with respect to fogging radii $\sigma_1$ to $\sigma_i$.

When combining the position displacement amounts p(x) in the irradiated region and the non-irradiated region, it is expressed by the following equation (2-7) (Step S204).

$$p(x)=c_0 \times p_0(x)+c_1 \times p_i(x) \qquad (2\text{-}7)$$

Figure 44A:
FIG. 44A shows a fitting result in the case of the pattern density being 25% of the resist A.
Figure 44B:
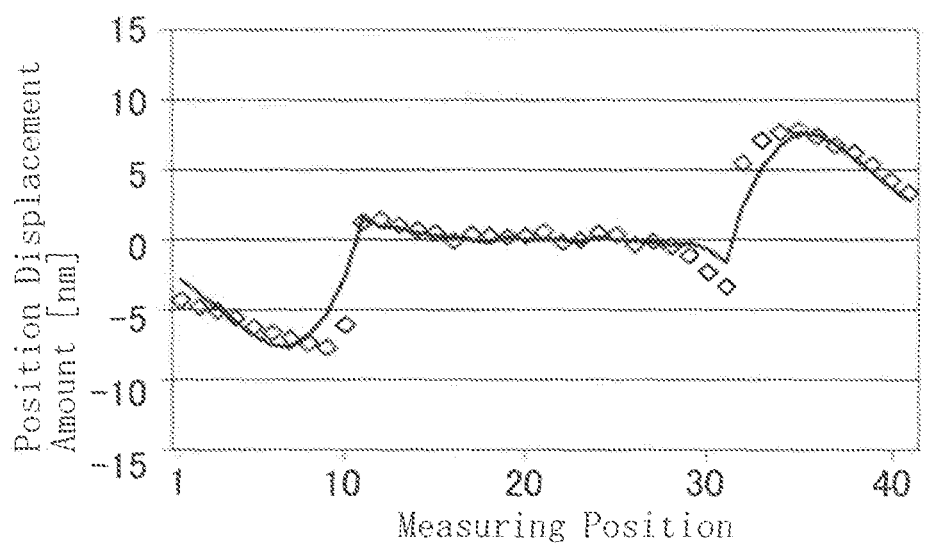
FIG. 44B shows a fitting result in the case of the pattern density being 50% of the resist A.
Figure 45A:
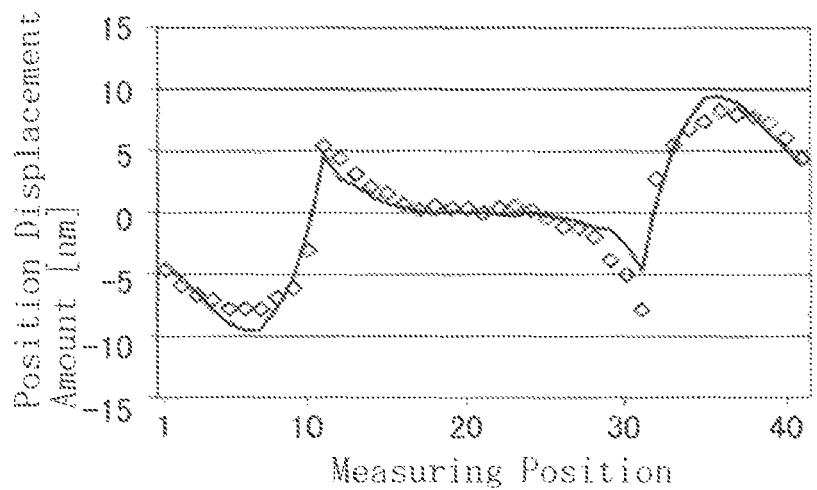
FIG. 45A shows a fitting result in the case of the pattern density being 75% of the resist A.
Figure 45B:
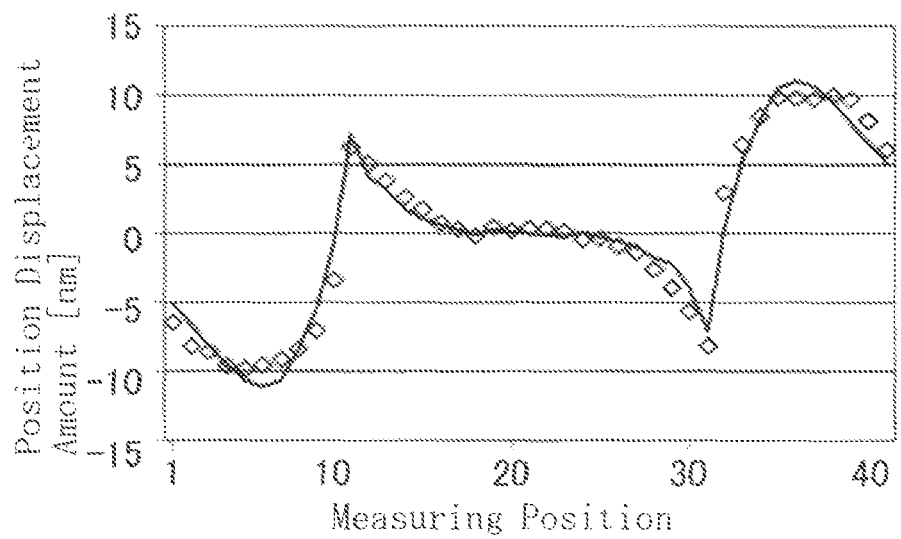
FIG. 45B shows a fitting result in the case of the pattern density being 100% of the resist A.
Figure 46A:
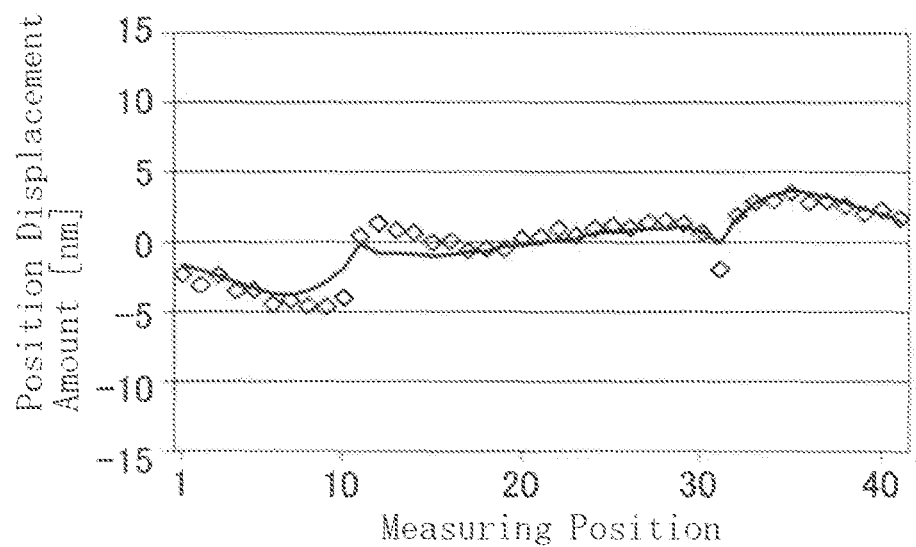
FIG. 46A shows a fitting result in the case of the pattern density being 25% of the resist B.
Figure 46B:
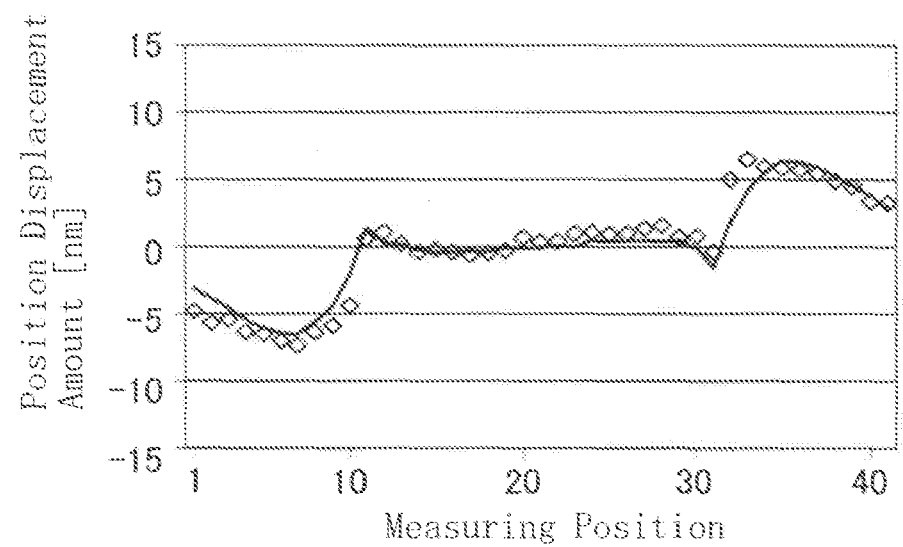
FIG. 46B shows a fitting result in the case of the pattern density being 50% of the resist B.
Figure 47A:
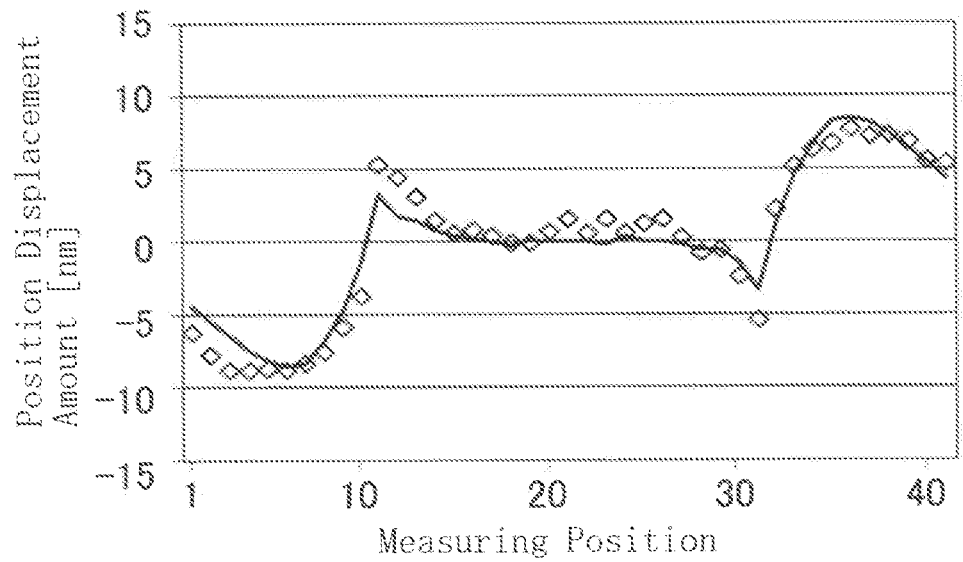
FIG. 47A shows a fitting result in the case of the pattern density being 75% of the resist B.
Figure 47B:
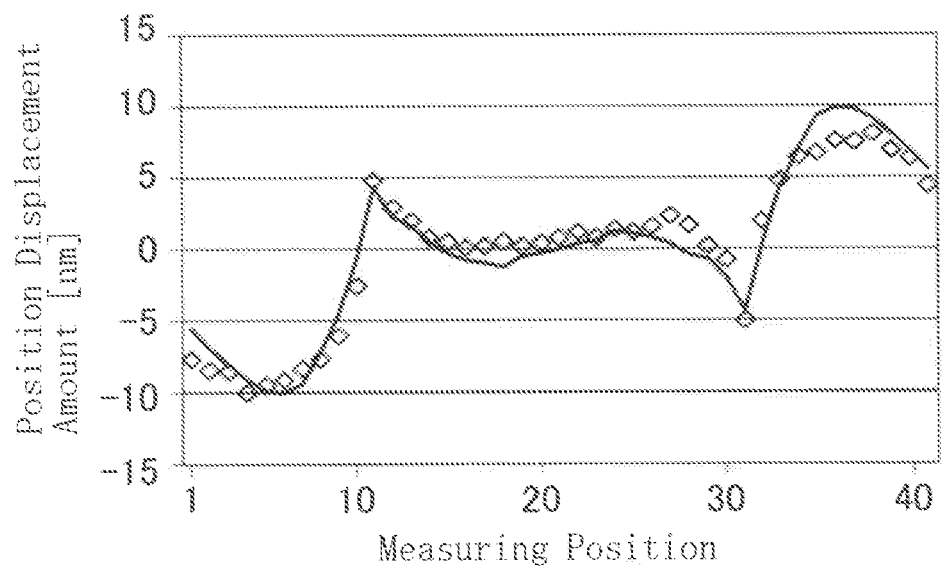
FIG. 47B shows a fitting result in the case of the pattern density being 100% of the resist B.
Figure 48A:
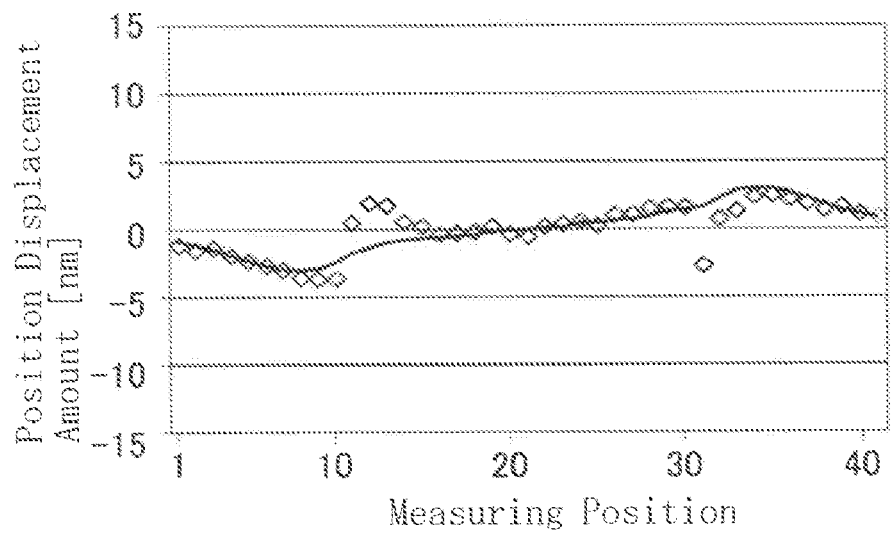
FIG. 48A shows a fitting result in the case of the pattern density being 25% of the resist C.
Figure 48B:
FIG. 48B shows a fitting result in the case of the pattern density being 50% of the resist C.
Figure 49A:
FIG. 49A shows a fitting result in the case of the pattern density being 75% of the resist C.
Figure 49B:
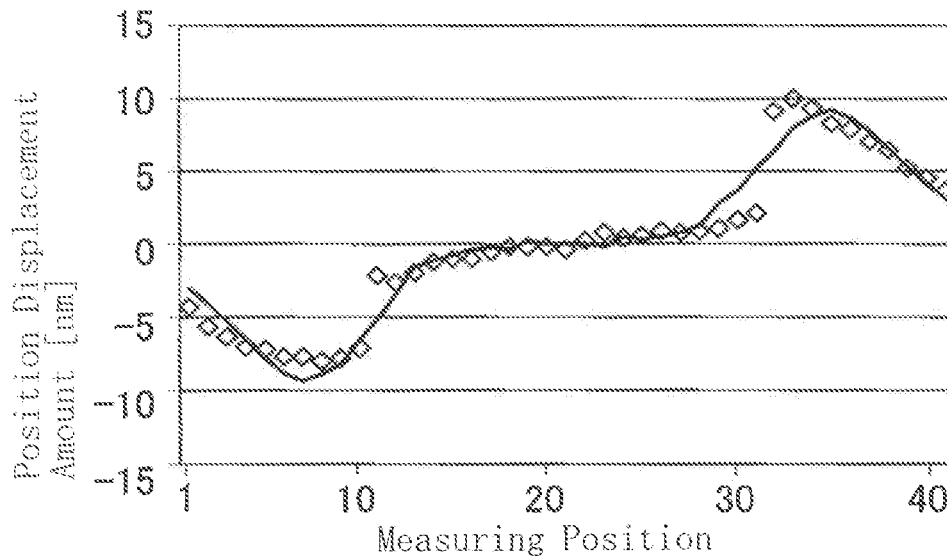
FIG. 49B shows a fitting result in the case of the pattern density being 100% of the resist C.

Then, a combination of parameters $c_0$, $c_1$, and σ which makes the equation (2-7) be the best suited (fitting) to the experimental result is calculated. FIGS. 44A to 44B, 45A to 45B, 46A to 46B, 47A to 47B, 48A to 48B, and 49A to 49B respectively show fitting results with respect to the resists A, B, and C. FIGS. 44A, 46A, and FIG. 48A respectively show fitting results in the case of the pattern density of the irradiation pad 63 being 25%. FIGS. 44B, 46B, and 48B respectively show fitting results in the case of the pattern density of the irradiation pad 63 being 50%. FIGS. 45A, 47A, and 49A respectively show fitting results in the case of the pattern density of the irradiation pad 63 being 75%. FIGS. 45B, 47B, and 49B respectively show fitting results in the case of the pattern density of the irradiation pad 63 being 100%.

By using the results shown in FIGS. 44A to 44B and 49A to 49B, position displacement amount distributions can be obtained with sufficient accuracy compared with the above comparative example.

FIGS. 50A to 50C respectively show the optimal combinations of parameters $c_0$, $c_1$, and σ calculated by fitting, with respect to the resists A, B, and C.

By the way, as shown in FIGS. 24A to 24C, it has turned out that even when resists of the same type are used, the optimal fogging radii σ are various when pattern densities are different. Physically, it is desirable for the fogging radius σ not to change depending on the pattern density. Although it succeeded in obtaining a preferable fitting result with respect to the resist A, it did not succeed in obtaining such preferable fitting results with respect to the resists B and C compared with the resist A. According to the examination performed by the present inventor, it can be considered that these results may come from assuming the charge of the irradiated region to be flatly $C_E(E)=c_0$.

Then, the present inventor corrected the model so that the influence of a fogging electron may be described even in the charge amount distribution in the irradiated region. According to such a corrected model, the charge amount distribution in the irradiated region is expressed by the following equation (2-8). However, the model before the correction is used for the charge amount distribution in the non-irradiated region.

$$C(E,F)=C_E(E)+C_{Fe}(F)=c_0-c_1 \times F^\alpha \qquad (2\text{-}8)$$

Combinations of parameters $c_0$, $c_1$, and σ calculated with respect to the corrected model are shown in FIGS. 51A and 51B. FIGS. 51A and 51B respectively show the combinations of parameters $C_0$, $C_1$, and σ with respect to the resists B and C. In the corrected model, as shown in FIGS. 51A and 51B, the fogging radius σ still has pattern density dependence. Furthermore, it has turned out that although $c_1$ calculated by fitting needs to be on the curved line of the equation (2-5), it is impossible to match $c_1$ to the curved line.

Then, the present inventor has configured a new generalized model for solving these problems.

First, the relation between the charge amount distribution $C_F(F)$ and the fogging electron amount strength F in a non-irradiated region is expressed by a polynomial function such as the following equation (2-9). In the equation (2-9) $f_1$, $f_2$, and $f_3$ indicate constants.

$$C_F(F)=f_1 \times F+f_2 \times F^2+f_3 \times F^3 \qquad (2\text{-}9)$$

Figure 52:
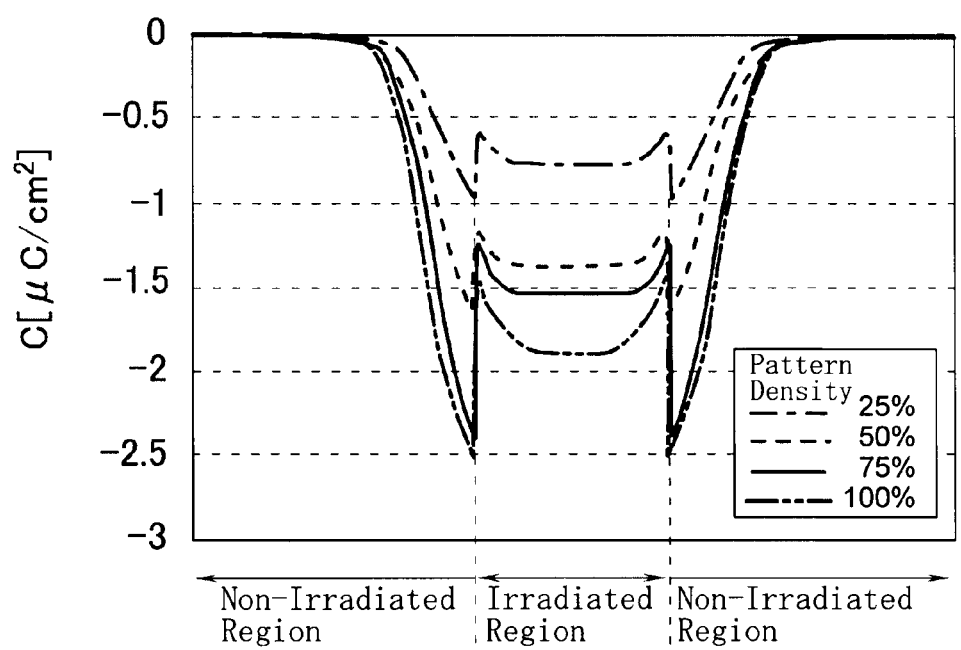
FIG. 52 shows a charge amount distribution $C(x,0)$.

Next, using each of the parameter groups shown in FIGS. 50A to 50C and 51A to 51B, a charge amount distribution C(x,0) at y=0 is calculated for each pattern density. The calculated charge amount distributions C(x,0) are shown in FIG. 52. The reason for using the parameter groups shown in FIGS. 50A to 50C, and 51A to 51B is that the distribution shape at each pattern density is correct though the optimal fogging radius a changes depending on the pattern density. In addition, the accuracy of fitting performed below can be increased by calculating a charge amount distribution C(x,y) in two dimension without limiting to y=0.

Figure 53A:
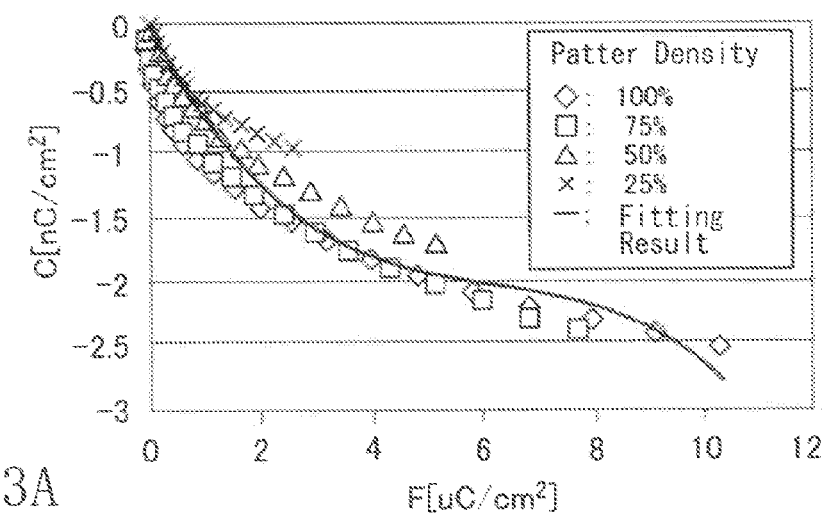
FIG. 53A shows a fitting result when a fogging radius $\sigma$ is too small.
Figure 53B:
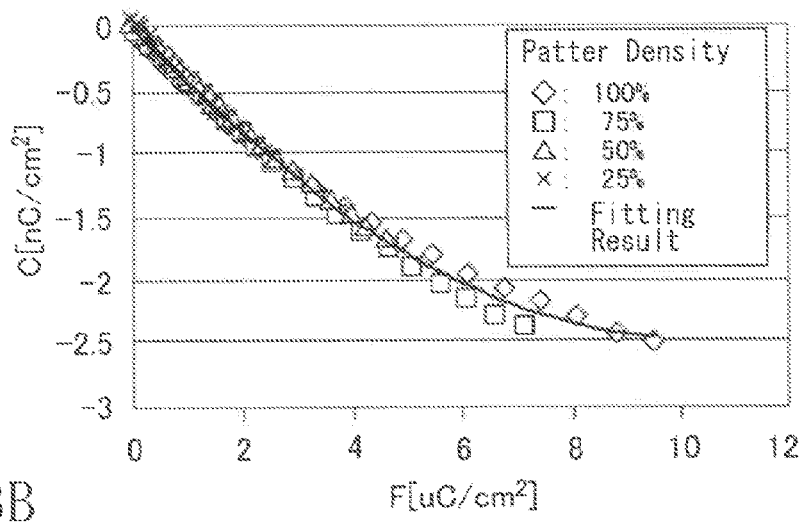
FIG. 53B shows a fitting result when a fogging radius $\sigma$ is optimal.
Figure 53C:
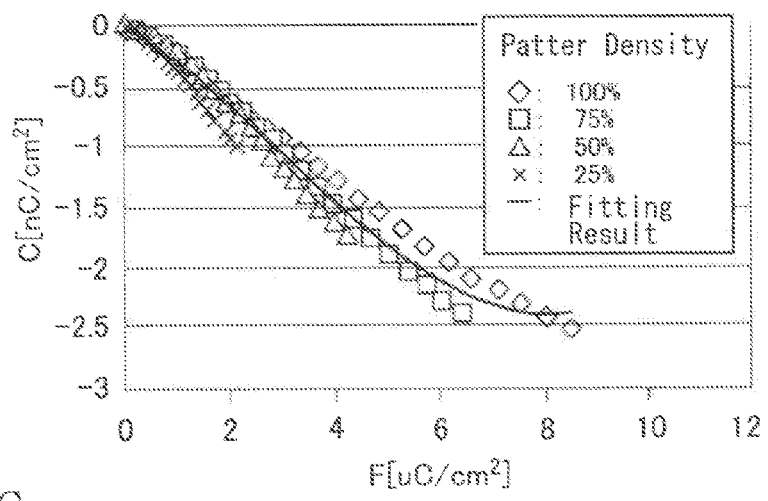
FIG. 53C shows a fitting result when a fogging radius $\sigma$ is too large.

The optimal fogging radius σ is calculated such that the charge amount distribution C(x,0) in the non-irradiated region shown in FIG. 52 and $C_F(F)$ of the equation (2-9) fit each other best. When the fogging radius σ is too small as shown in FIG. 53A or when the fogging radius σ is too large as shown in FIG. 53C, a proper fitting result cannot be obtained. That is, when the fogging radius σ is too small or too large, since data of each pattern density separates from each other, it is impossible to calculate the parameters $f_1$, $f_2$, and $f_3$. On the other hand, when the optimal fogging radius σ is obtained as shown in FIG. 53B, a proper fitting result can be obtained, so that it is possible to calculate the parameters $f_1$, $f_2$, and $f_3$.

Next, using the calculated optimal fogging radius σ, a fogging electron amount distribution F in the irradiated region is obtained. A charge amount distribution C(E,F) in the irradiated region is expressed by a polynomial function, such as the following equation (2-10) using the irradiation amount distribution E and the fogging electron amount distribution F obtained by the equation (2-9). A charge amount distribution $C_{Fe}(F)$ to which the fogging electron contributes is taken into consideration in the equation (2-10).

$$\begin{aligned} C(E, F) &= C_E(E) + C_{Fe}(F) \\ &= (d_0 + d_1 \times \rho + d_2 \times D + d_3 \times E) + \\ &\quad (e_1 \times F + e_2 \times F^2 + e_3 \times F^3) \end{aligned} \qquad (2\text{-}10)$$

Figure 54:
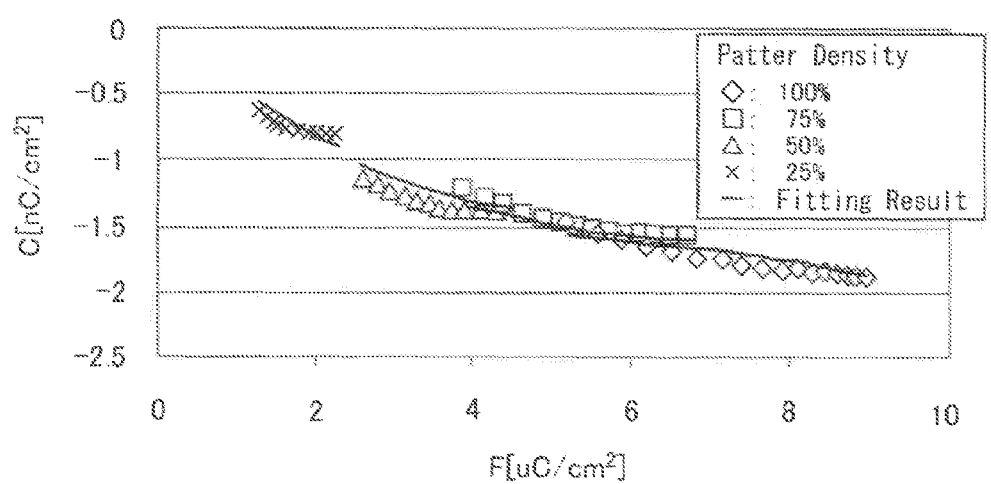
FIG. 54 shows a result of fitting of a charge amount distribution $C(x,0)$ and a charge amount distribution $C(E,F)$ in irradiated region.

The parameters $d_0$, $d_1$, $d_2$, $d_3$, $e_1$, $e_2$, and $e_3$ are calculated such that the charge amount distribution C(x,0) in the irradiated region shown in FIG. 52 and the charge amount distribution C(E,F) of the equation (2-10) fit each other best. Then, the fitting result is shown in FIG. 54.

The optimal combination of the parameters $d_0$, $d_1$, $d_2$, $d_3$, $e_1$, $e_2$, $e_3$, $f_1$, $f_2$, $f_3$, and σ, which has been obtained by fitting the charge amount distributions in the irradiated region and the non-irradiated region, is shown in FIG. 55. The optimal fogging radius σ is selected from the range of 8 mm to 16 mm according to the type of the resist as shown in FIG. 55. In this generalized model, unlike the model using the similarity function, even if the pattern density changes, the optimal fogging radius σ does not change. As shown in FIG. 55, with respect to the resists A of the same type, it has turned out that the optimal fogging radius σ(=13 mm) in the case of the dose D being fixed without reference to the pattern density ρ is different from the optimal fogging radius σ(=8 mm) in the case of the dose D being changed in accordance with the proximity effect correction equation (2-1) of the backscattered electron with reference to the pattern density ρ.

Since the optimal fogging radii σ are various depending upon the film thickness of the resists, it is also preferable to calculate, in accordance with the method described above, a respective optimal radius σ while regarding a resist having a different film thickness as a different resist.

Now, according to Embodiment 2, as to be expressed by the following equation (2-11), a charge amount distribution (second charge amount distribution) due to charge decay described in Embodiment 1 is further added to the charge amount distribution C(E,F) (first charge amount distribution) in the irradiated region shown by the equation (2-10). Thereby, the mount resulting from the charge decay can be corrected.

$$C(E, F) = C_E(E) + C_{Fe}(F) + \qquad (2\text{-}11)$$
$$\kappa(\rho) \cdot \exp\{-(t - T)/\lambda(\rho)\}$$
$$= (d_0 + d_1 \times \rho + d_2 \times D + d_3 \times E) +$$
$$(e_1 \times F + e_2 \times F^2 + e_3 \times F^3) +$$
$$\kappa(\rho) \cdot \exp\{-(t - T)/\lambda(\rho)\}$$

Then, a charge amount distribution C(x,y) is calculated by the sum of sets of $C_F(F)$ (third charge amount distribution) in the non-irradiated region of the equation (2-9) and C(E,F) in the irradiated region of the equation (2-11).

Figure 56A:
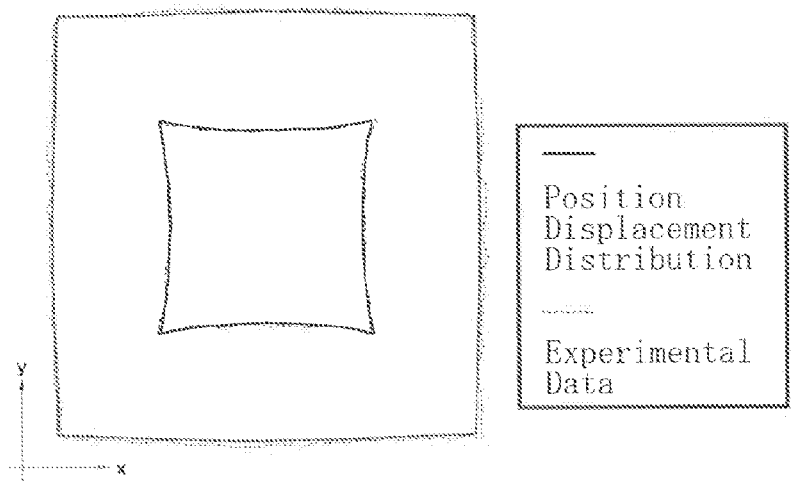
FIG. 56A shows a fitting result of a position displacement amount distribution calculated in a generalized model according to Embodiment 2 and an experimental data, with respect to the resist A.
Figure 56B:
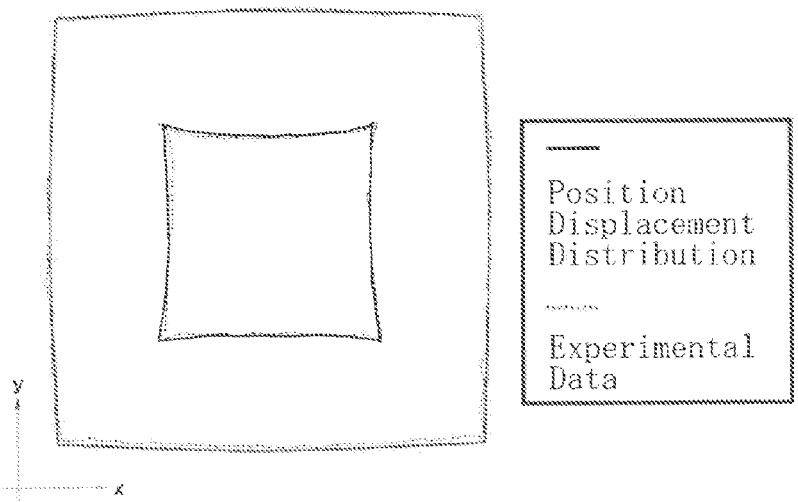
FIG. 56B shows a fitting result of a position displacement amount distribution calculated in a generalized model according to Embodiment 2 and an experimental data, with respect to the resist B.
Figure 56C:
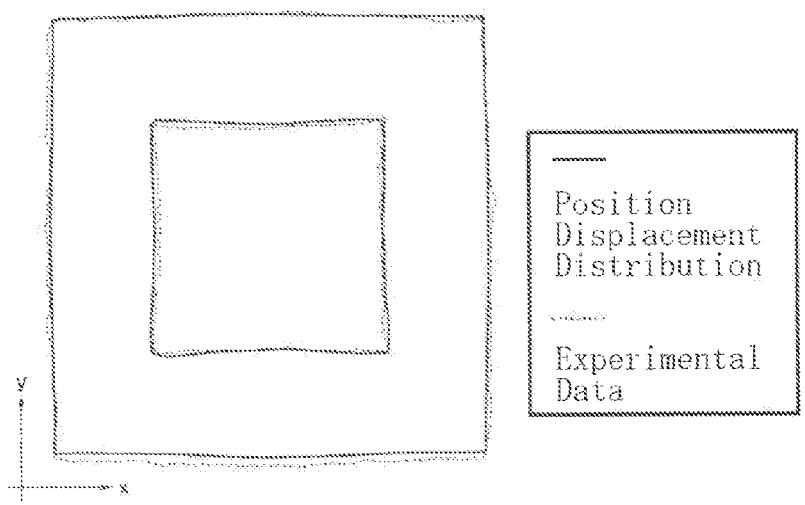
FIG. 56C shows a fitting result of a position displacement amount distribution calculated in a generalized model according to Embodiment 2 and an experimental data, with respect to the resist C.

By using the charge amount distribution C(x,y) (fourth charge amount distribution) calculated above, a position displacement amount distribution p(x,y) is calculated in the step S110 shown in FIGS. 22 and 23. That is, the position displacement amount distribution p(x,y) can be obtained by calculating a position displacement amount at a writing position, which is resulting from a charge amount of each position of the charge amount distribution C(x,y) (fourth charge amount distribution), by performing convolution of each charge amount of the charge amount distribution C(x,y) (fourth charge amount distribution) with the response function r(x,y). FIGS. 56A to 56C respectively show fitting results of the position displacement amount distribution calculated in the generalized model according to Embodiment 2 and the experimental data, with respect to the resists A, B, and C. However, the result in the case of using a model before correcting charge decay is herein shown for the purpose of measuring the model before correcting the charge decay. In the figures, the solid line shows a position displacement amount distribution calculated in the generalized model and the dashed line shows experimental data. Moreover, FIGS. 56A to 56C, similarly to FIGS. 34A to 34C, schematically show a position displacement in the vicinity of the boundary between the irradiated region and the non-irradiated region and a position displacement in the periphery of the non-irradiated region. With respect to each of the resists A, B, and C, the calculated position displacement amount distribution and the experimental data are approximately coincident. Thus, as shown in FIGS. 56A to 56C, by calculating a position displacement amount distribution by using a generalized model established by the present inventor, the position displacement amount distribution can be obtained highly accurately.

According to Embodiment 2, since the correction is performed by further adding an amount due to charge decay explained in Embodiment 1 to the generalized model established by the present inventor, the position displacement amount distribution can be obtained more highly accurately. Such an effect has been described with reference to FIGS. 16 to 18. The model used in FIG. 16 is the generalized model explained in Embodiment 2. Therefore, the result of FIG. 17 is the one in the model which has been corrected by adding an amount due to charge decay according to Embodiment 2.

Figure 57:
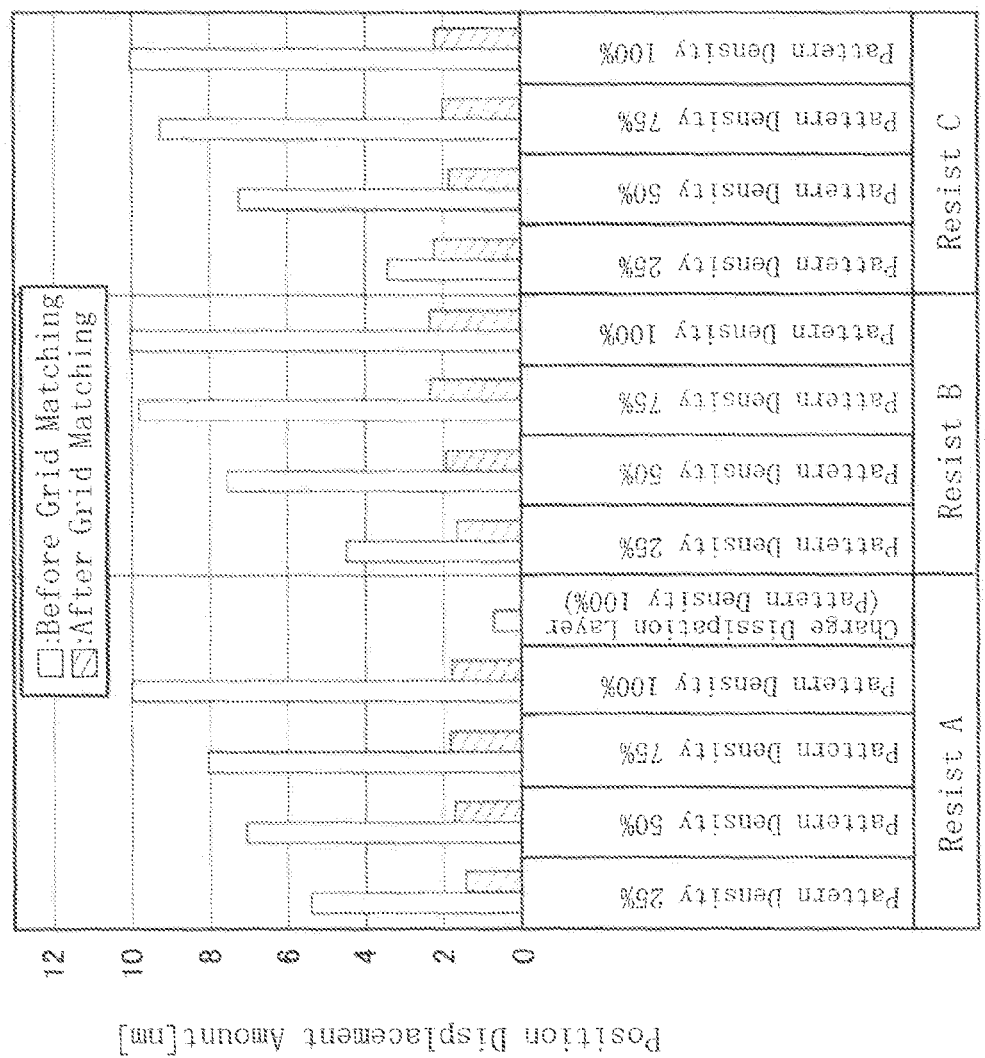
FIG. 57 shows a beam irradiation position displacement amount remaining after grid matching.
Figure 58:
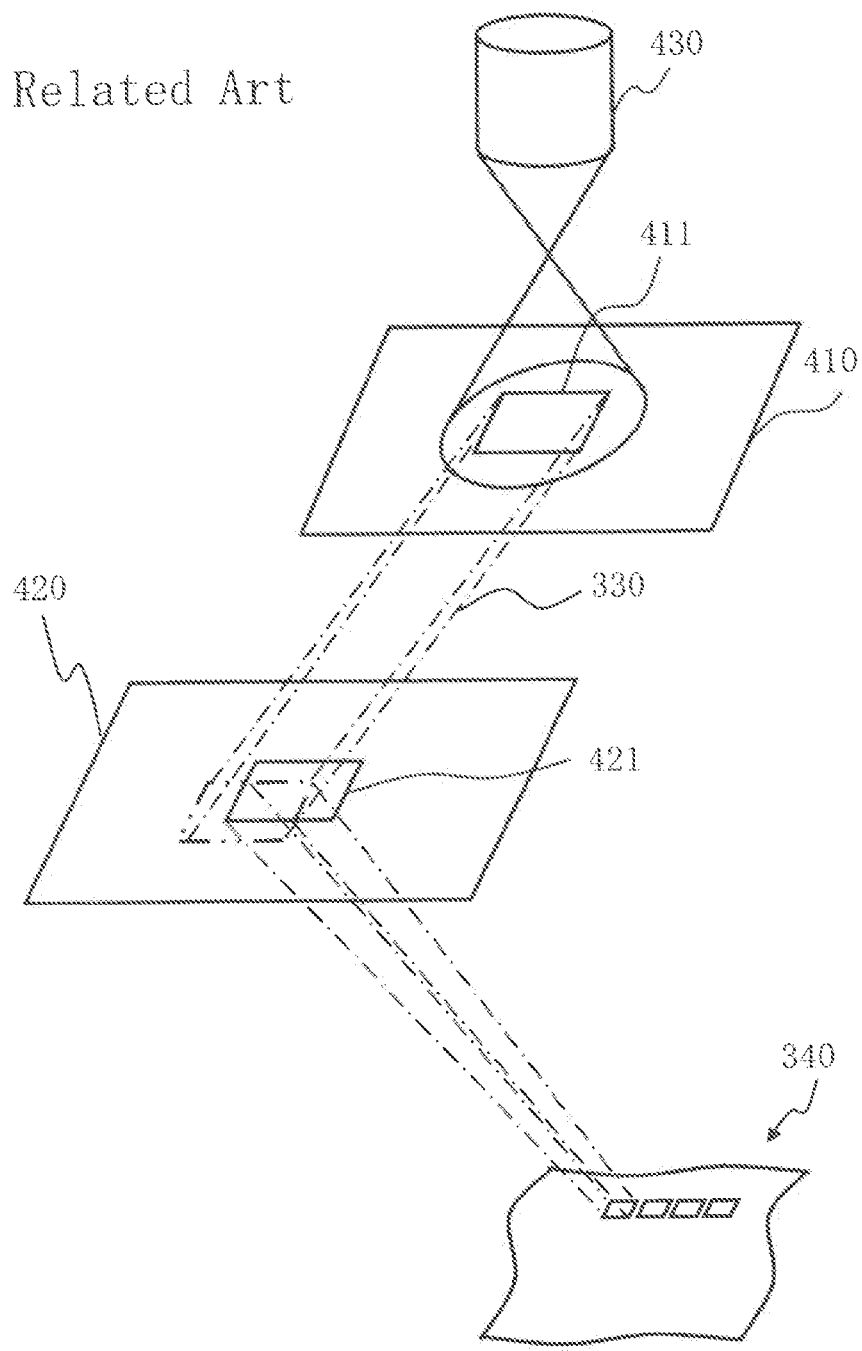
FIG. 58 is a schematic diagram for explaining operations of a conventional variable-shaped electron beam writing apparatus.

By performing grid matching using this position displacement amount distribution as shown in FIG. 25, a beam position displacement caused by a charging effect including the amount resulting from charge decay is corrected. FIG. 57 shows beam irradiation position displacement amounts before and after performing grid matching. However, the result in the case of using a model before correcting charge decay is herein shown for the purpose of measuring the model before correcting the charge decay. As shown by the slash lines in FIG. 57, the beam irradiation position displacement amount remaining after grid matching is reduced to a level equivalent to the case where a charge dissipation layer is used.

In addition, it has turned out in a resist of a certain type, such as a resist A and D, that a preferable fitting result can be obtained by making a contribution of a fogging electron in a charge amount distribution in an irradiated region be $C_{Fe}(F)=0$. This can also be understood from the parameters $e_1=e_2=e_3=0$ with respect to the resists A and D shown in FIG. 55. The generalized model configured by the present inventor can be applied even to the resists A and D of such a type.

Moreover, there is known a physical effect called an EBIC (electron beam induced conductivity) which means that a resist has conductivity only for a moment because of being irradiated by an electron beam. The above generalized model can also be applied to this EBIC. That is, since EBIC is a phenomenon that occurs only when irradiated by an electron beam, an electric charge is accumulated as a non-irradiated region until irradiated by an electron beam. Such accumulated electric charge escapes toward the underlying material when irradiated by an electron beam. For this reason, $C_{Fe}(F)$ by a fogging electron is thus reset, and begins to be accumulated from zero. Furthermore, once irradiated by an electron beam, conductivity may remain slightly. In this case, the charge amount of a fogging electron after the electron beam irradiation becomes less compared with the one before the electron beam irradiation. The generalized model can deal with such charge amount decreasing, by shifting from the parameters $f_1$, $f_2$, and $f_3$ which describe a non-irradiated region to the parameters $e_1$, $e_2$, and $e_3$ which describe an irradiated region.

In the above description, processing contents or operation contents of what is expressed by the term "unit" or "step" can be configured by a computer program. Alternatively, they may be implemented by software, or a combination of hardware and software, or further, by a combination of hardware and firmware. When configured by a program, the program is stored in a recording medium, such as a magnetic disk drive, magnetic tape drive, FD, or ROM (Read Only Memory). For example, the program is stored in the magnetic disk drive 144.

The control computers 110 and 130 of FIG. 1 may be connected, through a bus (not shown), to an RAM (Random Access Memory), an ROM, and a magnetic disk (HD) drive, serving as an example of a recording device, a keyboard (K/B) and a mouse, serving as an example of an input means, a monitor and a printer, serving as an example of an output means, or an external interface (I/F), FD, DVD, CD, etc., serving as an example of an input/output means.

Referring to specific examples, Embodiments have been described above. However, the present invention is not limited to these examples. For example, although a variable shaped electron beam writing apparatus is used in Embodiments, the present invention is applicable to other type writing apparatus. Further, although an electron beam is used in the above Embodiments, the present invention is not limited to it and also applicable to the case using other charged particle beam, such as an ion beam. Moreover, the present invention does not limit the purpose of usage of the electron beam writing apparatus. For example, in addition to the purpose of usage of directly forming a resist pattern on a mask or a wafer, the present invention can also be applied to forming a mask for an optical stepper, an x-ray mask, or the like.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a charge amount distribution calculation unit configured to calculate a charge amount distribution which is charged by irradiation of a charged particle beam onto a writing region of a target workpiece, by using a charge decay amount and a charge decay time constant both of which depend on a pattern area density;
a position displacement amount distribution calculation unit configured to calculate a position displacement amount of each writing position due to charge amounts of the charge amount distribution by performing convolution of each charge amount of the charge amount distribution with a response function; and
a writing unit configured to write a pattern on the each writing position where the position displacement amount has been corrected, using a charged particle beam.

2. The apparatus according to claim 1,
wherein the writing region of the target workpiece is virtually divided into a plurality of writing sectional unit regions,
the writing unit writes each of the plurality of writing sectional unit regions,
further comprising:
a writing elapsed time calculation unit configured to calculate an elapsed time from a writing start time to a time when actually writing each position on the target workpiece, and
an accumulated time calculation unit configured to calculate an accumulated time obtained by accumulating a writing time spent in writing a writing sectional unit region which has already been written, wherein
the charge amount distribution calculation unit calculates the charge amount distribution by using a difference between the accumulated time and the elapsed time.

3. The apparatus according to claim 2,
wherein the charge decay amount is obtained from a result of previously writing an evaluation pattern which includes a charge pattern extending over two or more writing sectional unit regions in the plurality of writing sectional unit regions, and
the charge decay amount is obtained from a function where a charge decay amount displacement generated in accordance with a position of the charge pattern has been corrected by using the charge decay time constant.

4. The apparatus according to claim 2,
wherein the charge amount distribution calculation unit calculates the charge amount distribution by using a value obtained by dividing a difference between the accumulated time and the elapsed time by the charge decay time constant.

5. The apparatus according to claim 2, further comprising a pattern area density calculation unit configured to further virtually divide the each of the plurality of writing sectional unit regions into a plurality of small regions, and calculate a pattern area density of each of the plurality of small regions.

6. The apparatus according to claim 5,
wherein the charge amount distribution calculation unit calculates the charge amount distribution with respect to a small region where the pattern area density is not 0%, and does not calculate the charge amount distribution with respect to a small region where the pattern area density is 0%, in the plurality of small regions.

7. The apparatus according to claim 1,
wherein the charge decay amount and the charge decay time constant can be respectively calculated by fitting a position displacement error of a measurement pattern, which is obtained by previously writing a plurality of evaluation patterns, each including the measurement pattern and a charge pattern, of different pattern area densities of the charge pattern.

8. The apparatus according to claim 1,
wherein the writing region of the target workpiece includes an irradiated region which is irradiated by the charged particle beam and a non-irradiated region which is not irradiated by the charged particle beam, and
the charge amount distribution calculation unit calculates the charge amount distribution with respect to the irradiated region, and does not calculate the charge amount distribution with respect to the non-irradiated region.

9. A charged particle beam writing apparatus comprising:
a fogging electron amount distribution calculation unit configured to calculate a fogging electron amount distribution generated by applying a charged particle beam onto a writing region of a target workpiece having an irradiated region which is irradiated by the charged particle beam and a non-irradiated region which is not irradiated by the charged particle beam;
a charge amount distribution calculation unit configured to calculate a sum by adding, in the irradiated region, a first charge amount distribution based on a fogging electron amount distribution, a pattern density distribution, a dose distribution, and an irradiation amount distribution, to a second charge amount distribution resulting from a charge decay, and calculate a union of sets of the sum and a third charge amount distribution based on a fogging electron amount distribution in the non-irradiated region, so as to obtain a fourth charge amount distribution;
a position displacement amount distribution calculation unit configured to calculate a position displacement amount of each writing position due to charge amounts the fourth charge amount distribution, by performing convolution of each charge amount of the fourth charge amount distribution with a response function; and a writing unit configured to write a pattern on the each writing position where the position displacement amount has been corrected, by using the charged particle beam.

10. A charged particle beam writing method comprising:

calculating a charge amount distribution which is charged by irradiation of a charged particle beam onto a writing region of a target workpiece, by using a charge decay amount and a charge decay time constant both of which depend on a pattern area density;

calculating a position displacement amount of each writing position due to charge amounts of the charge amount distribution, by performing convolution of each charge amount of the charge amount distribution with a response function; and writing a pattern on the each writing position where the position displacement amount has been corrected, using a charged particle beam.

* * * * *